United States Patent
Xie et al.

(10) Patent No.: US 11,791,181 B2
(45) Date of Patent: Oct. 17, 2023

(54) METHODS FOR THE TREATMENT OF WORKPIECES

(71) Applicants: Mattson Technology, Inc., Fremont, CA (US); Beijing E-Town Semiconductor Technology, Co., LTD, Beijing (CN)

(72) Inventors: Ting Xie, Fremont, CA (US); Hua Chung, Saratoga, CA (US); Haochen Li, Fremont, CA (US); Xinliang Lu, Fremont, CA (US); Shawming Ma, Sunnyvale, CA (US); Haichun Yang, San Jose, CA (US); Michael X. Yang, Palo Alto, CA (US)

(73) Assignees: BEIJING E-TOWN SEMICONDUCTOR TECHNOLOGY CO., LTD, Beijing (CN); MATTSON TECHNOLOGY, INC., Fremont, CA (US)

( * ) Notice: Subject to any disclaimer, the term of this patent is extended or adjusted under 35 U.S.C. 154(b) by 164 days.

(21) Appl. No.: 17/024,851

(22) Filed: Sep. 18, 2020

(65) Prior Publication Data

US 2021/0082724 A1 Mar. 18, 2021

Related U.S. Application Data

(60) Provisional application No. 62/938,359, filed on Nov. 21, 2019, provisional application No. 62/908,930, (Continued)

(51) Int. Cl.
*H01L 21/67* (2006.01)
*H01L 21/223* (2006.01)
(Continued)

(52) U.S. Cl.
CPC .... *H01L 21/67213* (2013.01); *H01L 21/2236* (2013.01); *H01L 21/3003* (2013.01); *H01L 21/321* (2013.01)

(58) Field of Classification Search
None
See application file for complete search history.

(56) References Cited

U.S. PATENT DOCUMENTS

| 5,567,483 A | 10/1996 | Foster et al. |
| 6,030,666 A | 2/2000 | Lam et al. |

(Continued)

FOREIGN PATENT DOCUMENTS

| KR | 10-1508994 | 4/2015 |
| KR | 1697479 | 1/2017 |

OTHER PUBLICATIONS

Brunatto, et al., "Plasma assisted heat treatment: annealing", Journal of Physics D: Applied Physics, vol. 42, 2009, 5 pages.
(Continued)

*Primary Examiner* — Michelle Mandala
*Assistant Examiner* — Jordan M Klein
(74) *Attorney, Agent, or Firm* — Dority & Manning, P.A.

(57) ABSTRACT

Systems and methods for thermal treatment of a workpiece are provided. In one example, a method for conducting a treatment process on a workpiece, such as a thermal treatment process, an annealing treatment process, an oxidizing treatment process, or a reducing treatment process in a processing apparatus is provided. The processing apparatus includes a plasma chamber and a processing chamber. The plasma chamber and the processing chamber are separated by a plurality of separation grids or grid plates. The separation grids or grid plates operable to filter ions generated in the plasma chamber. The processing chamber has a workpiece support operable to support a workpiece.

16 Claims, 26 Drawing Sheets

Related U.S. Application Data filed on Oct. 1, 2019, provisional application No. 62/907,991, filed on Sep. 30, 2019, provisional application No. 62/901,916, filed on Sep. 18, 2019.

(51) Int. Cl.
*H01L 21/321* (2006.01)
*H01L 21/30* (2006.01)

(56) References Cited

U.S. PATENT DOCUMENTS

| | | |
|---|---|---|
| 6,534,401 B2 | 3/2003 | Joo et al. |
| 7,220,665 B2 | 5/2007 | Farrar |
| 7,713,874 B2 | 5/2010 | Milligan |
| 8,236,706 B2 | 8/2012 | Peuse et al. |
| 2007/0123012 A1 | 5/2007 | Walther et al. |
| 2015/0311089 A1* | 10/2015 | Kim .................. H01L 21/32135 438/722 |
| 2016/0079395 A1* | 3/2016 | Sim .................... H01L 29/7848 438/283 |

OTHER PUBLICATIONS

Siegal, et al., "Effects of rapid thermal processing on the formation of uniform tetragonal tungsten disilicide films on Si (100) substrates", Journal of Applied Physics, vol. 63, 1988, 525-529.
International Search Report and Written Opinion for Application No. PCT/US2020/051415, dated Dec. 30, 2020, 12 pages.

\* cited by examiner

METHODS FOR THE TREATMENT OF WORKPIECES

PRIORITY

The present application claims the benefit of priority of U.S. Provisional Application Ser. No. 62/908,930, titled "METHODS FOR THE THERMAL TREATMENT OF WORKPIECES," filed Oct. 1, 2019, which is incorporated herein by reference for all purposes. The present application claims the benefit of priority of U.S. Provisional Application Ser. No. 62/907,991, titled "METAL LAYER TREATMENT USING REMOTE PLASMA," filed Sep. 30, 2019, which is incorporated herein by reference for all purposes. The present application claims the benefit of priority of U.S. Provisional Application Ser. No. 62/938,359, titled "RADICAL-BASED TREATMENT FOR WORKPIECE PROCESSING," filed Nov. 21, 2019, which is incorporated herein by reference for all purposes. The present application claims the benefit of priority of U.S. Provisional Application Ser. No. 62/901,916, titled "SELECTIVE OXIDATION OF WORKPIECES," filed Sep. 18, 2019, which is incorporated herein by reference for all purposes.

FIELD

The present disclosure relates generally to apparatus, systems, and methods for processing a workpiece using a plasma source.

BACKGROUND

Plasma processing is widely used in the semiconductor industry for deposition, etching, resist removal, and related processing of semiconductor wafers and other substrates. Plasma sources (e.g., microwave, ECR, inductive coupling, etc.) are often used for plasma processing to produce high density plasma and reactive species for processing workpieces. Plasma processing tools can include a plasma chamber where plasma is generated and a separate processing chamber where the substrate is processed. The processing chamber can be "downstream" of the plasma chamber such that there is no direct exposure of the substrate to the plasma. A separation grid can be used to separate the processing chamber from the plasma chamber. The separation grid can be transparent to neutral particles but not transparent to charged particles from the plasma. The separation grid can include one or more sheets or plates of material with holes.

SUMMARY

Aspects and advantages of embodiments of the present disclosure will be set forth in part in the following description, or may be learned from the description, or may be learned through practice of the embodiments.

One example aspect of the present disclosure is directed to a method for conducting a thermal treatment process on a workpiece in a processing apparatus. The processing apparatus includes a plasma chamber and a processing chamber. The plasma chamber and the processing chamber are separated by a plurality of separation grids or grid plates. The separation grids or grid plates operable to filter ions generated in the plasma chamber. The processing chamber has a workpiece support operable to support a workpiece. The method includes placing the workpiece on the workpiece support in the processing chamber; heating a layer on the workpiece at a temperature of about 500° C. or less; and exposing the workpiece to radicals in the processing chamber, and the radicals being generated in the plasma chamber.

One example aspect of the present disclosure is directed to a method for processing a semiconductor workpiece in a plasma processing apparatus, the plasma processing apparatus comprising a plasma chamber having an interior operable to receive a process gas and a processing chamber having a workpiece support operable to support a workpiece, the method comprising: placing the workpiece on the workpiece support in the processing chamber; generating one or more species by inducing a plasma in a process gas in the plasma chamber, wherein the process gas comprises a hydrogen containing gas and an oxygen containing gas; exposing the workpiece to the species to treat at least one layer on the workpiece, wherein the species comprise one or more oxygen radicals, hydrogen radicals, and hydroxyl radicals.

Another example aspect of the present disclosure is directed to a method for processing a workpiece in a plasma processing apparatus, the plasma processing apparatus comprising a plasma chamber having an interior operable to receive a process gas and a processing chamber having a workpiece support operable to support a workpiece, wherein the workpiece comprises at least one layer of silicon and at least one metal layer, the method comprising placing the workpiece on the workpiece support in the processing chamber; generating one or more species from a process gas in the plasma chamber, the process gas comprising a hydrogen gas, an oxygen gas, and a hydrocarbon gas; filtering the one or more species to create a filtered mixture; exposing the workpiece to the filtered mixture to form an oxide layer on the at least one layer of silicon at a rate that is greater than a rate of formation of an oxide layer on the at least one metal layer.

Other example aspects of the present disclosure are directed to a method for processing a workpiece having a metal layer thereon in a processing apparatus, the processing apparatus comprising a plasma chamber and a processing chamber, the processing chamber having a workpiece support operable to support a workpiece The method includes placing the workpiece on the workpiece support in the processing chamber; and conducting an annealing treatment process on the workpiece including exposing the workpiece to radicals in the processing chamber to heat the metal layer on the workpiece to an annealing temperature of 400° C. or more, the radicals generated at least in part using a plasma induced in a process gas by a plasma source.

Other example aspects are directed to systems and methods for processing a workpiece. Variations and modifications can be made to example aspects of the present disclosure.

These and other features, aspects, and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
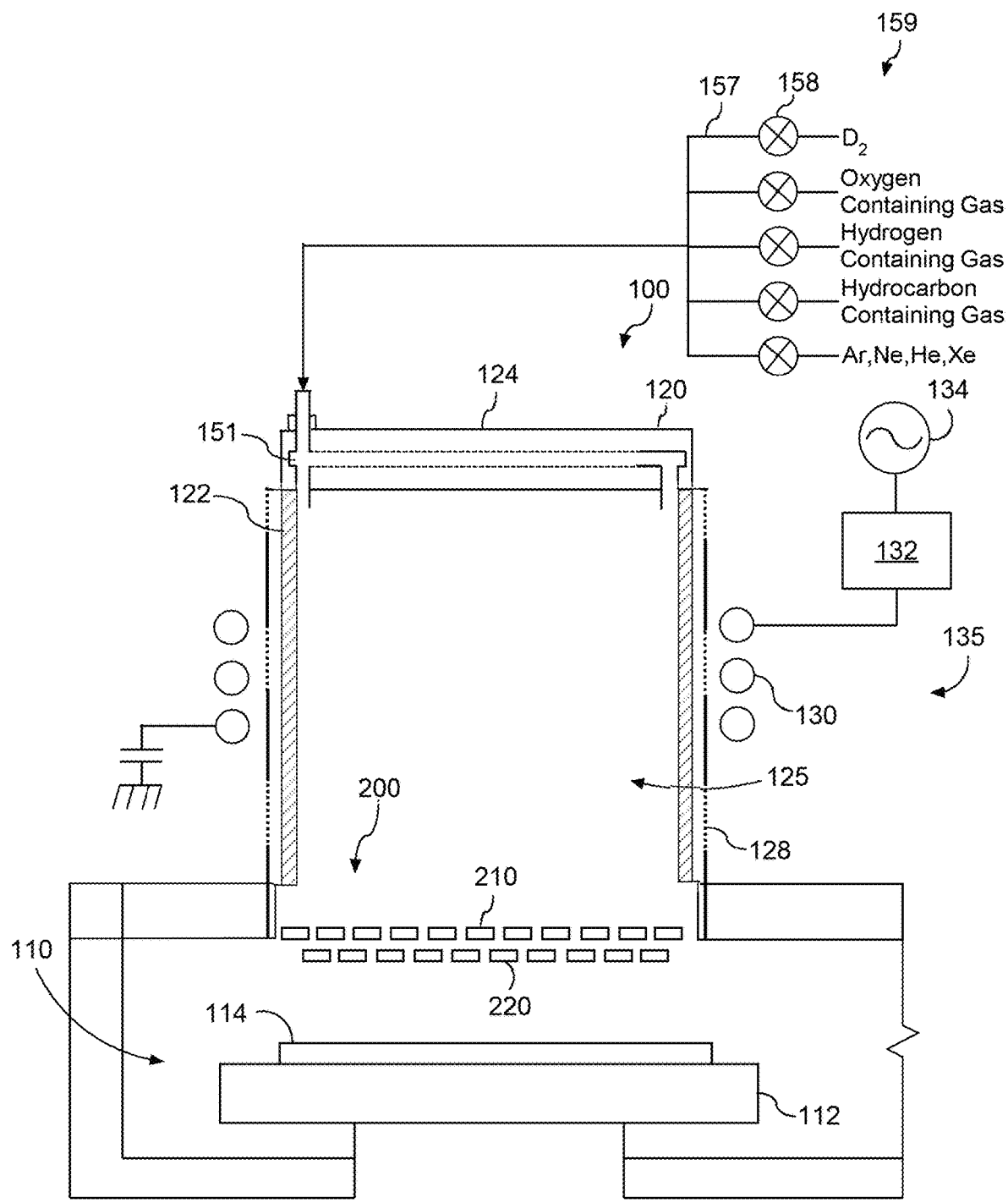
FIG. 1 depicts an example plasma processing apparatus according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Semiconductor device fabrication processes can require including both a deposition step where a material is deposited on a substrate and an etch step where material is removed from the substrate. Semiconductor device fabrication processes can require surface treatments after an etch step or a deposition step to improve properties of metal layers on the workpiece, and thereby semiconductor device performance. For example, certain improvements may include repairing surface damage on the device, passivating the surface of the device to prevent against further degradation, cleaning of the device surface, promoting crystallization of certain features on the device surface, and so forth.

For example, the native oxidation on metal layers on a semiconductor device may need to be removed before subsequent process steps can be completed. Removal of the native oxide layer on certain metal layers, such as copper, can be required to ensure good conductance for the electrical connection of the device. Surface cleaning may also be required for films containing cobalt, germanium, or silicon in order to reduce undesired surface oxidation or nitridation of these metal films or layers. Thermal treatment in a molecule gas environment may be used as a means to improve certain film properties, however, these methods often lack flexibility in the thermal budget as treatments usually require high process temperatures in order to activate the chemical reaction between the molecule gas and the subjected film.

Example aspects of the present disclosure are directed to methods for conducting a thermal treatment process on a workpiece. The methods can include conducting a thermal treatment process on a workpiece in a plasma processing apparatus. The plasma processing apparatus includes a plasma chamber and a processing chamber that are separated by at least one separation grid or a plurality of separation grids (e.g., grid plates in a separation grid assembly). The separations grid(s) are operable to filter ions generated in the plasma chamber. The processing chamber includes a workpiece support operable to support a workpiece. The thermal treatment process can include placing the workpiece on the workpiece support in the processing chamber and conducting a thermal treatment process on the workpiece to thermally treat a layer on the workpiece. The thermal treatment process may be implemented at a workpiece temperature of about 500° C. or less. The thermal treatment process includes exposing the workpiece to one or more radicals (e.g. hydrogen radicals or deuterium radicals) in the processing chamber, the radicals being generated in the plasma chamber. The methods provided herein may allow for a reduction in the process temperature and process pressure as compared to other thermal treatments involving exposure to molecule based process gases without radicals.

In some embodiments, the methods herein provide for exposure of a workpiece to one or more radicals, such as via exposure to a filtered species having one or more radicals, for the treatment of metal films, such as copper, cobalt, ruthenium, silicon, and germanium, present on the workpiece. Such metal film treatment may include reduction in resistance capacity (Rc), impurity removal, metal grain reflow, grain growth, and surface smoothing of the workpiece. The treatment of the workpiece can include reduction of certain oxide or nitride layers that may be present. Methods disclosed herein may be used in some embodiments to improve transistor property improvements, such as thermal voltage (Vt) improvement, silicon to silicon dioxide dangling bond passivation, and passivation of high-k materials present on the workpiece. In certain embodiments, the methods disclosed herein may be used for surface cleaning on one or more metal layers on the workpiece. In certain embodiments, the methods disclosed herein may be used to diffuse hydrogen radicals or deuterium radicals into certain layers present on the workpiece, for example silicon or silicon germanium layers.

Example aspects of the present disclosure can provide a number of technical effects and benefits. For instance, the methods provided herein can modify surface properties of the workpiece at reduced temperatures and pressures. The methods herein also provide additional safety measures as compared to other thermal treatment processes, because the methods disclosed herein are able to operate at lower pressures. The methods provided herein also provide for a higher surface concentration of hydrogen or deuterium radicals for diffusion into the metal layer or workpiece structure as compared to other thermal treatments. Furthermore, the methods provided herein may be operated at lower temperatures thus reducing the overall energy usage and thermal budget for the process. The methods provided herein may also require a lower total chemical usage as compared to other thermal processes.

Aspects of the present disclosure are discussed with reference to a "workpiece," "substrate," or "wafer" (e.g., semiconductor wafer) for purposes of illustration and discussion. Those of ordinary skill in the art, using the disclosures provided herein, will understand that the example aspects of the present disclosure can be used in association with any semiconductor substrate or other suitable substrate. In addition, the use of the term "about" in conjunction with a numerical value is intended to refer to within twenty percent (20%) of the stated numerical value. A "pedestal" refers to any structure that can be used to support a workpiece.

As used herein, a "remote plasma" refers to a plasma generated remotely from a workpiece, such as in a plasma chamber separated from a workpiece by a separation grid. As used herein, a "direct plasma" refers to a plasma that is directly exposed to a workpiece, such as a plasma generated in a processing chamber having a workpiece support operable to support the workpiece.

FIG. 1 depicts an example plasma processing apparatus 100 that can be used to perform processes according to example embodiments of the present disclosure. As illustrated, plasma processing apparatus 100 includes a processing chamber 110 and a plasma chamber 120 that is separated from the processing chamber 110. Processing chamber 110 includes a workpiece support or pedestal 112 operable to hold a workpiece 114 to be processed, such as a semiconductor wafer. In this example illustration, a plasma is generated in plasma chamber 120 (i.e., plasma generation region) by an inductively coupled plasma source 135 and desired species are channeled from the plasma chamber 120 to the surface of workpiece 114 through a separation grid assembly 200.

Aspects of the present disclosure are discussed with reference to an inductively coupled plasma source for purposes of illustration and discussion. Those of ordinary skill in the art, using the disclosures provided herein, will understand that any plasma source (e.g., inductively coupled plasma source, capacitively coupled plasma source, etc.) can be used without deviating from the scope of the present disclosure.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. Dielectric side wall 122 can be formed from a ceramic material. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gases, for example a fluorine-containing gas or a hydrogen-containing gas, can be provided to the chamber interior from gas supply 150 and annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma.

As shown in FIG. 1, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber 110.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded. In some embodiments, the grid assembly can include a single grid with one grid plate.

As shown in FIG. 1, according to example aspects of the present disclosure, the apparatus 100 can include a gas delivery system 150 configured to deliver process gas to the plasma chamber 120, for instance, via gas distribution channel 151 or other distribution system (e.g., showerhead). The gas delivery system can include a plurality of feed gas lines 159. The feed gas lines 159 can be controlled using valves 158 and/or mass flow controllers to deliver a desired amount of gases into the plasma chamber as process gas. As shown in FIG. 1, the gas delivery system 150 can include feed gas line(s) for delivery of an oxygen-containing gas (e.g. $O_2$, $O_3$, $N_2O$, $H_2O$), and feed gas line(s) for delivery of a hydrogen-containing gas (e.g., $H_2$, $CH_4$, $NH_3$), feed gas lines for a hydrocarbon-containing gas (e.g., $CH_4$), and feed gas lines for deuterium-containing gas (e.g., $D_2$). Other feed gas lines containing other gases can be added as needed. In some embodiments, the process gas can be mixed with an inert gas that can be called a "carrier" gas, such as He, Ar, Ne, Xe, or $N_2$. A control valve 158 can be used to control a flow rate of each feed gas line to flow a process gas into the plasma chamber 120. The plasma processing apparatus 150 of FIG. 1 can implement the activation process and the etch process using remote plasma.

Figure 2:
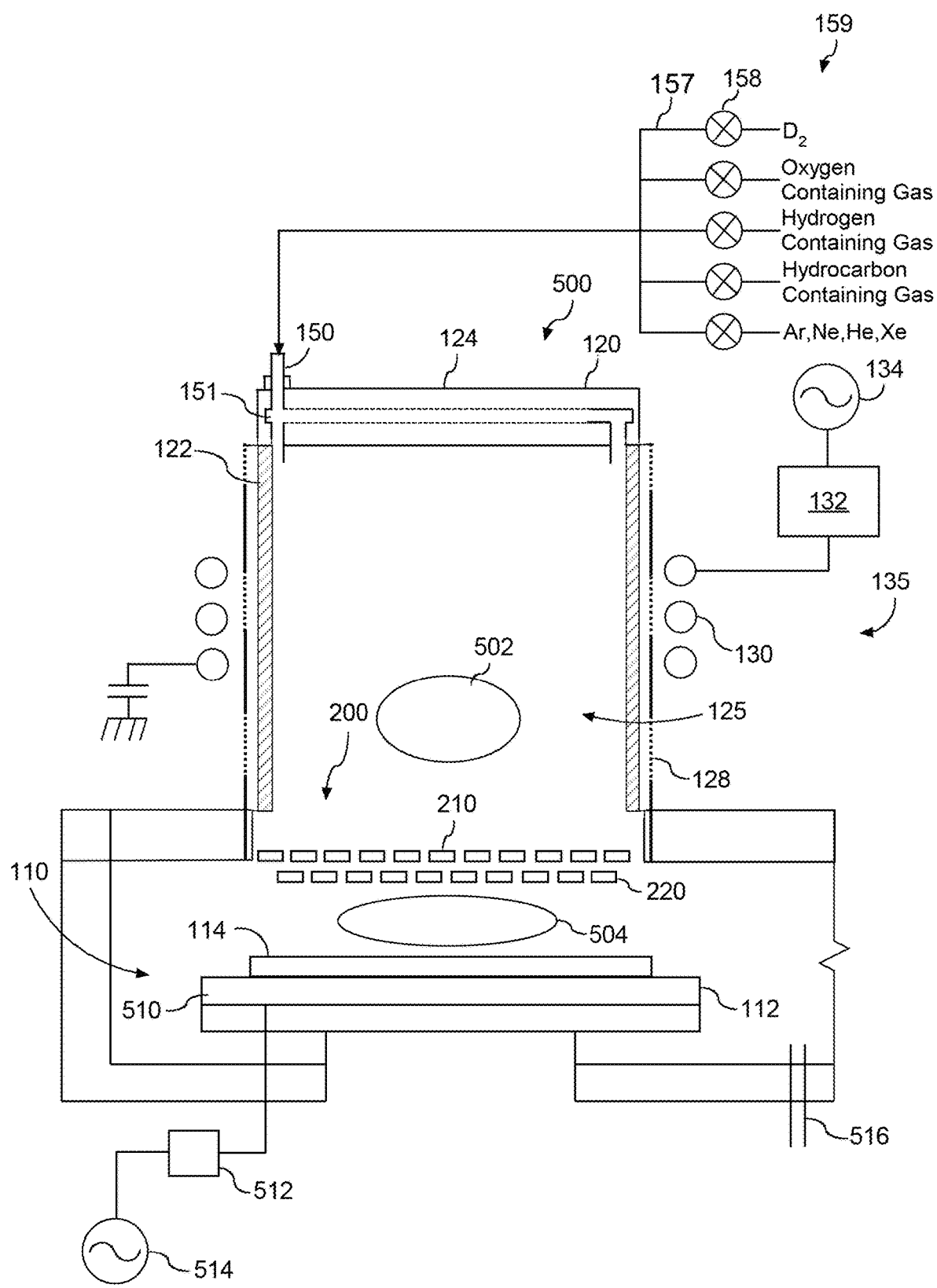
FIG. 2 depicts an example plasma processing apparatus according to example embodiments of the present disclosure.

FIG. 2 depicts an example plasma processing apparatus 500 that can be used to implement processes according to example embodiments of the present disclosure. The plasma processing apparatus 500 is similar to the plasma processing apparatus 100 of FIG. 1.

More particularly, plasma processing apparatus 500 includes a processing chamber 110 and a plasma chamber 120 that is separated from the processing chamber 110. Processing chamber 110 includes a workpiece holder or pedestal 112 operable to hold a workpiece 114 to be processed, such as a semiconductor wafer. In this example illustration, a plasma is generated in plasma chamber 120 (i.e., plasma generation region) by an inductively coupled plasma source 135 and desired species are channeled from the plasma chamber 120 to the surface of workpiece 114 through a separation grid assembly 200.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. Dielectric side wall 122 can be formed from a ceramic material. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gases (e.g., an inert gas) can be provided to the chamber interior from gas supply 150 and annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma.

As shown in FIG. 2, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded.

The example plasma processing apparatus 500 of FIG. 2 is operable to generate a first plasma 502 (e.g., a remote plasma) in the plasma chamber 120 and a second plasma 504 (e.g., a direct plasma) in the processing chamber 110.

More particularly, the plasma processing apparatus 500 of FIG. 2 includes a bias source having a bias electrode 510 in the pedestal 112. The bias electrode 510 can be coupled to an RF power generator 514 via a suitable matching network 512. When the bias electrode 510 is energized with RF energy, a second plasma 504 can be generated from a mixture in the processing chamber 110 for direct exposure to the workpiece 114. The processing chamber 110 can include a gas exhaust port 516 for evacuating a gas from the processing chamber 110. The radicals or species used in the breakthrough process or etch process according to example aspects of the present disclosure can be generated using the first plasma 502 and/or the second plasma 504.

Figure 3:
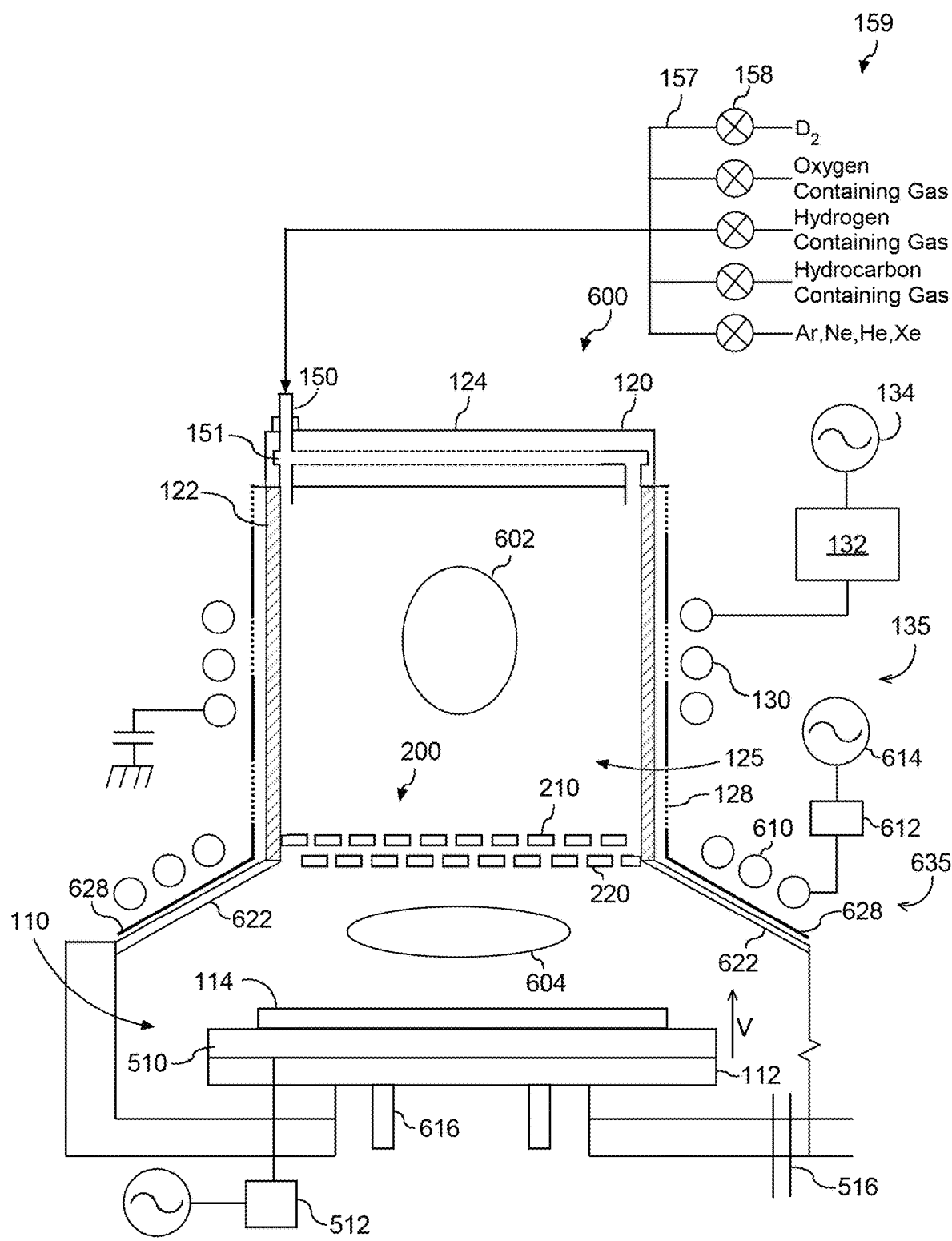
FIG. 3 depicts an example plasma processing apparatus according to example embodiments of the present disclosure.

FIG. 3 depicts a processing chamber 600 similar to that of FIG. 1 and FIG. 2. More particularly, plasma processing apparatus 600 includes a processing chamber 110 and a plasma chamber 120 that is separated from the processing chamber 110. Processing chamber 110 includes a workpiece holder or pedestal 112 operable to hold a workpiece 114 to be processed, such as a semiconductor wafer. In this example illustration, a plasma is generated in plasma chamber 120 (i.e., plasma generation region) by an inductively coupled plasma source 135 and desired species are channeled from the plasma chamber 120 to the surface of workpiece 114 through a separation grid assembly 200.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. Dielectric side wall 122 can be formed from a ceramic material. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gas (e.g., an inert gas) can be provided to the chamber interior from gas supply 150 and annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma.

As shown in FIG. 3, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded.

The example plasma processing apparatus 600 of FIG. 3 is operable to generate a first plasma 602 (e.g., a remote plasma) in the plasma chamber 120 and a second plasma 604 (e.g., a direct plasma) in the processing chamber 110. As shown, the plasma processing apparatus 600 can include an angled dielectric sidewall 622 that extends from the vertical sidewall 122 associated with the remote plasma chamber 120. The angled dielectric sidewall 622 can form a part of the processing chamber 110.

A second inductive plasma source 635 can be located proximate the dielectric sidewall 622. The second inductive plasma source 635 can include an induction coil 610 coupled to an RF generator 614 via a suitable matching network 612. The induction coil 610, when energized with RF energy, can induce a direct plasma 604 from a mixture in the processing chamber 110. A Faraday shield 628 can be disposed between the induction coil 610 and the sidewall 622.

The pedestal 112 can be movable in a vertical direction V. For instance, the pedestal 112 can include a vertical lift 616 that can be configured to adjust a distance between the pedestal 112 and the separation grid assembly 200. As one example, the pedestal 112 can be located in a first vertical position for processing using the remote plasma 602. The pedestal 112 can be in a second vertical position for processing using the direct plasma 604. The first vertical position can be closer to the separation grid assembly 200 relative to the second vertical position.

The plasma processing apparatus 600 of FIG. 3 includes a bias source having bias electrode 510 in the pedestal 112. The bias electrode 510 can be coupled to an RF power generator 514 via a suitable matching network 512. The processing chamber 110 can include a gas exhaust port 516 for evacuating a gas from the processing chamber 110. The hydrogen radicals used in the photoresist etch processes according to example aspects of the present disclosure can be generated using the first plasma 602 and/or the second plasma 604.

Figure 4:
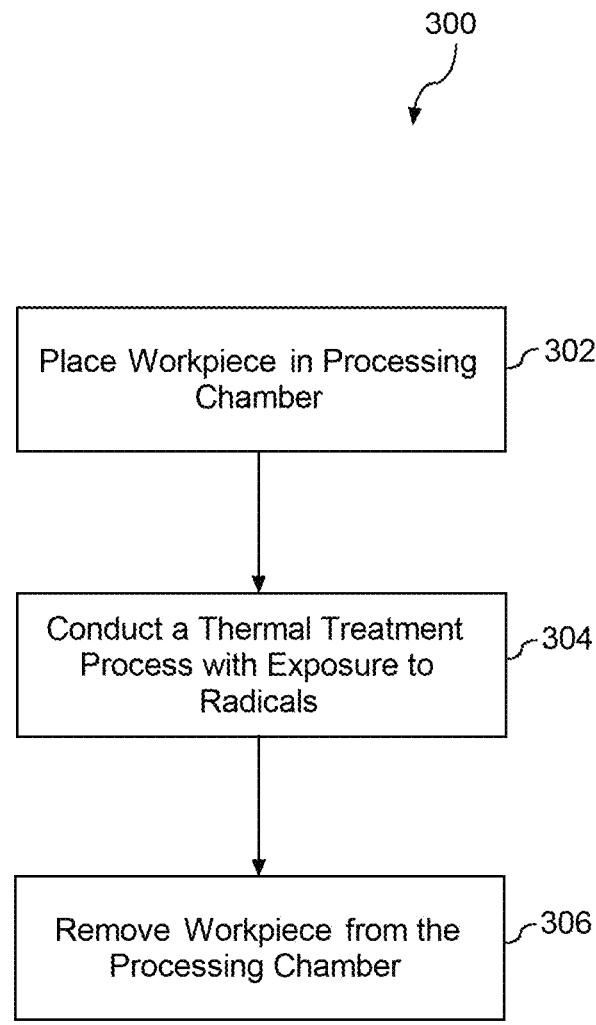
FIG. 4 depicts a flow diagram of an example method according to example embodiments of the present disclosure.

FIG. 4 depicts a flow diagram of one example method (300) according to example aspects of the present disclosure. The method (300) will be discussed with reference to the plasma processing apparatus 100 of FIG. 1 by way of example. The method (300) can be implemented in any suitable plasma processing apparatus. FIG. 4 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

At (302), the method can include placing a workpiece 114 in a processing chamber 110 of a plasma processing apparatus 100. The processing chamber 110 can be separated from a plasma chamber 120 (e.g., separated by a separation grid assembly). For instance, the method can include placing a workpiece 114 onto workpiece support 112 in the processing chamber 110 of FIG. 1. The workpiece 114 may include at least one layer of metal. In certain embodiments, the at least one layer of metal includes cobalt, copper, germanium, silicon, ruthenium, or combinations thereof.

At (304), the method includes conducting a thermal treatment process on the workpiece 114 (e.g., on the metal layer). The thermal treatment process can include generating one or more species from a process gas. The process gas may include a hydrogen containing gas, such as hydrogen ($H_2$). The process gas may include a deuterium containing gas, such as deuterium ($D_2$). In some embodiments, the process gas may also include an oxygen containing gas, such as oxygen ($O_2$). The process gas may also include one or more carrier or diluent gases. The carrier or diluent gases may include an inert gas, for example, helium, xenon, argon, neon, or combinations thereof.

For example, in certain embodiments, the gas delivery system 150 may be configured to deliver process gas to the plasma chamber 120, for instance, via gas distribution channel 151 or other distribution system (e.g., showerhead). The gas delivery system can include a plurality of feed gas lines 159. The feed gas lines 159 can be controlled using valves and/or mass flow controllers to deliver a desired amount of gases into the plasma chamber as process gas. As shown in FIG. 1, the gas delivery system 150 can include feed gas line(s) for delivery of a hydrogen-containing gas (e.g., $H_2$). The gas delivery system 150 can include feed gas line(s) for delivery of a deuterium-containing gas (e.g., $D_2$). The gas delivery system 150 can include feed gas line(s) for delivery of an oxygen-containing gas (e.g., $O_2$). The gas delivery system 150 can include feed gas line(s) for delivery of a dilution gas (e.g., Ar, He, Ne, Xe or other inert gas).

In some embodiments, the process gas may contain from about 10% to up to about 100% by volume of hydrogen ($H_2$). In some embodiments, the process gas may contain at least about 10% by volume of hydrogen ($H_2$), such as at least 20% by volume, such as at least 30% by volume, such as at least 40% by volume, such as at least 50% by volume, such as at least 60% by volume, such as at least 70% by volume, such as at least 80% by volume, such as at least 90% by volume.

In some embodiments, the process gas may contain from about 10% to up to about 100% by volume of deuterium ($D_2$). In some embodiments, the process gas may contain at least about 10% by volume of deuterium ($D_2$), such as at least 20% by volume, such as at least 30% by volume, such as at least 40% by volume, such as at least 50% by volume, such as at least 60% by volume, such as at least 70% by volume, such as at least 80% by volume, such as at least 90% by volume.

In some embodiments, the process gas may contain from about 1% to up to about 10% by volume of oxygen ($O_2$). In some embodiments, the process gas may contain at least about 1% by volume of oxygen ($O_2$), such as at least 2% by volume, such as at least 3% by volume, such as at least 4% by volume, such as at least 5% by volume, such as at least 6% by volume, such as at least 7% by volume, such as at least 8% by volume, such as at least 9% by volume. In some embodiments, the process gas may contain from about 10% to about 100% by volume of oxygen. For example, in certain embodiments, the process gas may contain at least about 10% by volume of oxygen, such as at least 20% by volume, such as at least 30% by volume, such as at least 40% by volume, such as at least 50% by volume, such as at least 60% by volume, such as at least 70% by volume, such as at least 80% by volume, such as at least 90% by volume.

In some embodiments, the process gas may contain from about 20% to up to about 80% by volume of helium (He). In some embodiments, the process gas may contain at least about 20% by volume of helium, such as at least 30% by volume, such as at least 40% by volume, such as at least 50% by volume, such as at least 60% by volume, such as at least 70% by volume.

In certain embodiments, to generate one or more radicals, the induction coil 130 can be energized with RF power from the RF power generator 134, to generate a plasma from the process gas in the plasma chamber. The plasma generated can include one or more species including hydrogen radicals, deuterium radicals, oxygen radicals, and combinations thereof. In some embodiments, the plasma generated in the plasma chamber is a remote plasma containing one or more radicals, such as hydrogen radicals, deuterium radicals, oxygen radicals, and combinations thereof.

In some embodiments, the thermal treatment process can include filtering the one or more species generated from the process gas. To create a filtered mixture containing hydrogen radicals, deuterium radicals, oxygen radicals, and combinations thereof. In some embodiments, the one or more species can be filtered via a separation grid 200 that separates the plasma chamber 120 from the processing chamber to generate the desired radicals. The separation grid 200 can be used to perform ion filtering from a mixture generated by plasma in the plasma chamber 120 to generate a filtered mixture. The filtered mixture may contain one or more radicals, such as hydrogen radicals, deuterium radicals, and/or oxygen radicals.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the separation grid 200 can be configured to filter ions with an efficiency greater than or equal to about 90%, such as greater than or equal to about 95%. A percentage efficiency for ion filtering refers to the amount of ions removed from the mixture relative to the total number of ions in the mixture. For instance, an efficiency of about 90% indicates that about 90% of the ions are removed during filtering. An efficiency of about 95% indicates that about 95% of the ions are removed during filtering.

In some embodiments, the separation grid can be a multi-plate separation grid. The multi-plate separation grid can have multiple separation grid plates in parallel. The arrangement and alignment of holes in the grid plate can be selected to provide a desired efficiency for ion filtering, such as greater than or equal to about 95%.

In certain embodiments, the thermal process includes exposing the workpiece to one or more radicals. For example, in certain embodiments, the radicals have been generated in the plasma chamber, filtered via the separation grid, and are exposed to the workpiece in the processing chamber. In some embodiments, the radicals include hydrogen radicals, deuterium radicals, oxygen radicals, and/or combinations thereof.

In certain embodiments, exposing the workpiece to one or more radicals can include exposing the workpiece in the processing chamber to a filtered mixture. The filtered mixture may contain one or more radicals, such as hydrogen, deuterium, and/or oxygen radicals. The filtered mixture can be exposed to the workpiece 114 in the processing chamber. Exposure of the workpiece 114 to one or more radicals can provide numerous effects to the workpiece.

Exposure of the workpiece 114 to the thermal treatment process described herein can provide numerous effects to the workpiece. In some embodiments, exposure of the workpiece 114 to the thermal treatment process reduces the resistance capacity of at least one metal layer present on the workpiece 114. In some embodiments, exposure of the workpiece 114 to the thermal treatment process can remove one or more impurities from the at least one metal layer. In certain embodiments, exposure of the workpiece 114 to the thermal treatment process can promote reflow and promote grain growth on at least one metal layer present on the workpiece 114. In some embodiments, exposure of the workpiece 114 to one or more radicals can modify grain structure on at least one metal layer on the workpiece 114. In some embodiments, exposure of the workpiece 114 to the thermal treatment process improves the transistor properties of at least one metal layer on the workpiece 114. Improved transistor properties can include threshold voltage (Vt) improvement, improvement in silicon to silicon dioxide dangling bond passivation, and the passivation of certain high-k materials present on the workpiece.

In some embodiments, exposure of the workpiece to the thermal treatment process may clean the surface of the at least one metal layer. For example, in certain embodiments the surface of the workpiece 114 may be cleaned by removal of at least a portion of an oxide layer that is present on the at least one metal layer. Thus, in certain embodiments, exposure of the workpiece to one or more radicals, such as hydrogen radicals, removes oxidation layers from the surface of the workpiece. In some embodiments where the workpiece contains at least one metal layer thereon, exposure of the workpiece 114 to one or more radicals can reduce at least a portion of an oxygen concentration on the surface of the at least one metal layer. For example, certain processing conditions may require exposure of the workpiece 114 to oxygen containing gases or oxygen species. Exposure of the metal layers of a workpiece 114 to oxygen may often result in the oxidation of the surface of the metal layer on the workpiece 114. Accordingly, the thermal treatment process as provided herein, may reduce at least a portion of an oxygen concentration on the surface of at least one metal layer on the workpiece 114.

Similarly, certain processing conditions may require exposure of the workpiece 114 to certain nitrogen containing gases or species. Such nitrogen-rich conditions may result in nitrogen being deposited on certain layers present on the workpiece 114, such as one or more metal layers. Thus, in certain embodiments provided herein, the thermal treatment process may reduce at least a portion of a nitrogen concentration on the surface of at least one metal layer on the workpiece 114.

In certain embodiments, the workpiece 114 may include at least one metal layer having a fluorine concentration thereon. For example, certain pre-processing conditions or steps, may deposit fluorine or a fluorine layer on certain metals layers present on the workpiece 114. Accordingly, exposure of a workpiece 114 having a metal layer with a fluorine concentration thereon to the thermal treatment process provided herein, can reduce at least a portion of the fluorine concentration on the surface of the at least one metal layer.

In certain embodiments, the workpiece 114 may include at least one metal layer having carbon or carbon species thereon. For instance, certain pre-processing conditions or steps may deposit carbon or a carbon layer on certain metal layers present on the workpiece 114. Accordingly, exposure of the workpiece 114 having a metal layer with a carbon concentration thereon to the thermal treatment process provided herein, can reduce at least a portion of the carbon concentration on the surface of the at least one metal layer.

In certain embodiments, the workpiece 114 may include at least one metal layer, wherein the metal layer is deposited on a patterned structure on the workpiece 114. In certain embodiments, exposure of the workpiece to the thermal treatment process described herein may modify a morphology of the at least one metal layer.

In some embodiments, the workpiece 114 may include at least one layer of silicon or silicon germanium. In such embodiments, exposure of the workpiece to the thermal treatment process, including exposure of the workpiece to one or more hydrogen radicals, may allow the hydrogen radicals to diffuse through at least one layer of silicon or silicon germanium present on the workpiece. In such embodiments, exposure of the workpiece to the thermal treatment process, including exposure of the workpiece to one or more deuterium radicals, may allow the deuterium radicals to diffuse through at least one layer of silicon or silicon germanium present on the workpiece.

In certain embodiments, the thermal treatment process can include heating the workpiece 114. For instance, the workpiece 114 can be heated in the processing chamber 110 to a certain process temperature. The workpiece, 114 can be heated, for instance, using one or more heating systems associated with the pedestal 112. The workpiece 114 can be heated to a desired process temperature prior to, during, or after exposure of the workpiece to the one or more radicals.

In certain embodiments, the workpiece is at a certain workpiece temperature or process temperature when exposed to the filtered mixture containing one or more radicals. In some embodiments, the process temperature is less than about 500° C., such as less than about 475° C., such as less than about 450° C., such as less than about 400° C., such as less than about 350° C., such as less than about 300° C., such as less than about 250° C., such as less than about 200° C., such as less than about 150° C.

In certain embodiments, the workpiece is at a process pressure when exposed to the one or more radicals. In some embodiments, the process pressure is from about 100 mT to about 20 T. In certain embodiments, the process pressure is less than about 100 T, such as less than about 50 T, such as less than about 10 T, such as less than about 1T. In certain embodiments, the process pressure is less than the $H_2$ safety limit according to industry standards.

At (306) the method can include removing the workpiece from the processing chamber. For instance, the workpiece 114 can be removed from workpiece support 112 in the processing chamber 110. The plasma processing apparatus can then be conditioned for future processing of additional workpieces.

Figure 5:
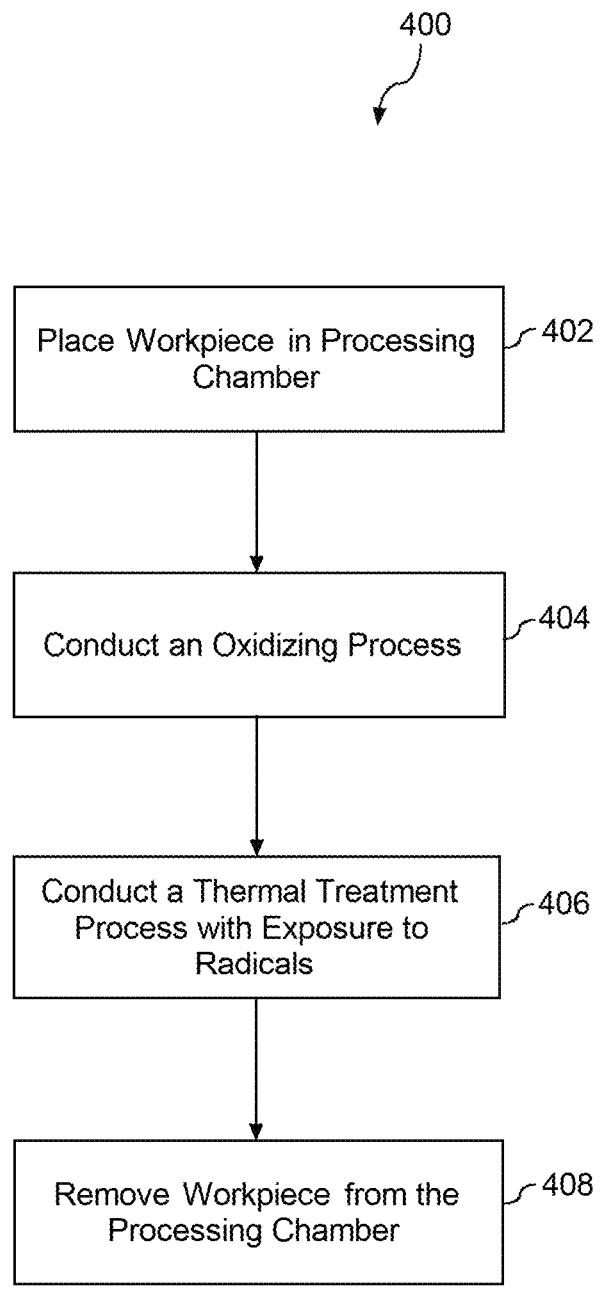
FIG. 5 depicts a flow diagram of an example method according to example embodiments of the present disclosure.

FIG. 5 depicts a flow diagram of one example method (400) according to example aspects of the present disclosure. The method (400) will be discussed with reference to the plasma processing apparatus 100 of FIG. 1 by way of example. The method (400) can be implemented in any suitable plasma processing apparatus. FIG. 1 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

At (402), the method can include placing a workpiece in a processing chamber of a plasma processing apparatus 100. The processing chamber 110 can be separated from a plasma chamber 120 (e.g., separated by a separation grid assembly). For instance, the method can include placing a workpiece 114 onto workpiece support 112 in the processing chamber 110 of FIG. 1. The workpiece may include at least one layer of metal. In certain embodiments, the at least one layer of metal includes cobalt, copper, germanium, silicon, ruthenium, or combinations thereof.

At (404), the method includes conducting an oxidizing process on the workpiece 114. The oxidizing process can include generating one or more species, such as oxygen radicals, from an oxidizing process gas. The oxidizing process gas used may include an oxygen containing gas, such as oxygen ($O_2$) and/or ozone ($O_3$). The oxidizing process gas may also include one or more carrier or diluent gases. The carrier or diluent gases may be comprised of an inert gas, for example, helium, xenon, argon, neon, or combinations thereof. For example, in certain embodiments, the gas delivery system 150 may be configured to deliver the oxidizing process gas to the plasma chamber 120, for instance, via gas distribution channel 151 or other distribution system (e.g., showerhead). The gas delivery system can include a plurality of feed gas lines 159. The feed gas lines 159 can be controlled using valves and/or mass flow controllers to deliver a desired amount of gases into the plasma chamber as the oxidizing process gas. As shown in FIG. 1, the gas delivery system 150 can include feed gas line(s) for delivery of an oxygen containing gas (e.g., $O_2$). The gas delivery system 150 can include feed gas line(s) for delivery of a dilution gas (e.g., Ar, He, Ne, Xe or other inert gas).

In some embodiments, the oxidizing process gas may contain from about 10% to about 100% by volume of oxygen. For example, in certain embodiments, the oxidizing process gas may contain at least about 10% by volume of oxygen, such as at least 20% by volume, such as at least 30% by volume, such as at least 40% by volume, such as at least 50% by volume, such as at least 60% by volume, such as at least 70% by volume, such as at least 80% by volume, such as at least 90% by volume.

In some embodiments, the oxidizing process gas may contain from about 20% to up to about 80% by volume of helium (He). In some embodiments, the process gas may contain at least about 20% by volume of helium, such as at least 30% by volume, such as at least 40% by volume, such as at least 50% by volume, such as at least 60% by volume, such as at least 70% by volume.

In certain embodiments, to generate the one or more species, the induction coil 130 can be energized with RF power from the RF power generator 134, to generate a plasma from the process gas in the plasma chamber. The plasma generated can include one or more species including oxygen radicals.

In some embodiments, the oxidizing process can include filtering the one or more species generated from the oxidizing process gas in order to create a filtered mixture containing oxygen radicals. In some embodiments, the one or more species can be filtered via a separation grid 200 that separates the plasma chamber 120 from the processing chamber to generate the desired oxygen radicals. The separation grid 200 can be used to perform ion filtering from a mixture generated by plasma in the plasma chamber 120 to generate a filtered mixture.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the separation grid 200 can be configured to filter ions with an efficiency greater than or equal to about 90%, such as greater than or equal to about 95%. A percentage efficiency for ion filtering refers to the amount of ions removed from the mixture relative to the total number of ions in the mixture. For instance, an efficiency of about 90% indicates that about 90% of the ions are removed during filtering. An efficiency of about 95% indicates that about 95% of the ions are removed during filtering.

In some embodiments, the separation grid can be a multi-plate separation grid. The multi-plate separation grid can have multiple separation grid plates in parallel. The arrangement and alignment of holes in the grid plate can be selected to provide a desired efficiency for ion filtering, such as greater than or equal to about 95%.

In certain embodiments, the oxidizing process includes exposing the workpiece to oxygen radicals. For example, in certain embodiments, the oxygen radicals have been generated in the plasma chamber, filtered via the separation grid, and are exposed to the workpiece in the processing chamber.

In certain embodiments, exposing the workpiece to oxygen radicals can include exposing the workpiece in the processing chamber to a filtered mixture containing oxygen radicals. The filtered mixture can be exposed to the workpiece 114 in the processing chamber.

Exposure of the workpiece 114 to one or more oxygen radicals can provide numerous effects to the workpiece. For example, in some embodiments, exposure of the workpiece 114 to one or more oxygen radicals can oxidize certain layers that are present on the workpiece, such as one or more metal layers. Accordingly, in certain embodiments, the oxidizing process deposits one or more oxygen layers or oxide layers on the workpiece 114.

At (406), the method includes conducting a thermal treatment process on the workpiece 114. The thermal treatment process can include generating one or more species from a process gas. The process gas used may include a hydrogen containing gas, such as hydrogen ($H_2$). The process gas used may include a deuterium containing gas, such as deuterium ($D_2$). In some embodiments, the process gas may include an oxygen containing gas, such as oxygen ($O_2$). The process gas may also include one or more carrier or diluent gases. The carrier or diluent gases may be comprised of an inert gas, for example, helium, xenon, argon, neon, or combinations thereof. For example, in certain embodiments, the gas delivery system 150 may be configured to deliver process gas to the plasma chamber 120, for instance, via gas distribution channel 151 or other distribution system (e.g., showerhead). The gas delivery system can include a plurality of feed gas lines 159. The feed gas lines 159 can be controlled using valves and/or mass flow controllers 158 to deliver a desired amount of gases into the plasma chamber as process gas. As shown in FIG. 1, the gas delivery system 150 can include feed gas line(s) for delivery of a hydrogen containing gas (e.g., $H_2$). The gas delivery system 150 can include feed gas line(s) for delivery of a deuterium containing gas (e.g., D). The gas delivery system 150 can include feed gas line(s) for delivery of an oxygen containing gas (e.g., $O_2$). The gas delivery system 150 can include feed gas line(s) for delivery of a dilution gas (e.g., Ar, He, Ne, Xe or other inert gas).

In some embodiments, the process gas may contain from about 10% to up to about 100% by volume of hydrogen ($H_2$). In some embodiments, the process gas may contain at least about 10% by volume of hydrogen ($H_2$), such as at least 20% by volume, such as at least 30% by volume, such as at least 40% by volume, such as at least 50% by volume, such as at least 60% by volume, such as at least 70% by volume, such as at least 80% by volume, such as at least 90% by volume.

In some embodiments, the process gas may contain from about 10% to up to about 100% by volume of deuterium ($D_2$). In some embodiments, the process gas may contain at least about 10% by volume of deuterium ($D_2$), such as at least 20% by volume, such as at least 30% by volume, such as at least 40% by volume, such as at least 50% by volume, such as at least 60% by volume, such as at least 70% by volume, such as at least 80% by volume, such as at least 90% by volume.

In some embodiments, the process gas may contain from about 1% to up to about 10% by volume of oxygen ($O_2$). In some embodiments, the process gas may contain at least about 1% by volume of oxygen ($O_2$), such as at least 2% by volume, such as at least 3% by volume, such as at least 4% by volume, such as at least 5% by volume, such as at least 6% by volume, such as at least 7% by volume, such as at least 8% by volume, such as at least 9% by volume. In some embodiments, the process gas may contain from about 10% to about 100% by volume of oxygen. For example, in certain embodiments, the process gas may contain at least about 10% by volume of oxygen, such as at least 20% by volume, such as at least 30% by volume, such as at least 40% by volume, such as at least 50% by volume, such as at least 60% by volume, such as at least 70% by volume, such as at least 80% by volume, such as at least 90% by volume.

In certain embodiments, to generate the one or more species, the induction coil 130 can be energized with RF power from the RF power generator 134, to generate a plasma from the process gas in the plasma chamber. The plasma generated can include one or more species including hydrogen radicals, deuterium radicals, oxygen radicals, and combinations thereof. The plasma generated may be a remote plasma.

In some embodiments, the thermal treatment process can include filtering the one or more species generated from the process gas to create a filtered mixture containing hydrogen radicals, deuterium radicals, oxygen radicals, and combinations thereof. In some embodiments, the one or more species can be filtered via a separation grid 200 that separates the plasma chamber 120 from the processing chamber to generate the desired radicals. The separation grid 200 can be used to perform ion filtering from a mixture generated by plasma in the plasma chamber 120 to generate a filtered mixture.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the separation grid 200 can be configured to filter ions with an efficiency greater than or equal to about 90%, such as greater than or equal to about 95%. A percentage efficiency for ion filtering refers to the amount of ions removed from the mixture relative to the total number of ions in the mixture. For instance, an efficiency of about 90% indicates that about 90% of the ions are removed during filtering. An efficiency of about 95% indicates that about 95% of the ions are removed during filtering.

In some embodiments, the separation grid can be a multi-plate separation grid. The multi-plate separation grid can have multiple separation grid plates in parallel. The arrangement and alignment of holes in the grid plate can be selected to provide a desired efficiency for ion filtering, such as greater than or equal to about 95%.

In certain embodiments, the thermal process includes exposing the workpiece to one or more radicals. For example, in certain embodiments, the one or more radicals have been generated in the plasma chamber, filtered via the separation grid, and exposed to the workpiece 114 in the processing chamber. In some embodiments, the radicals include hydrogen radicals, deuterium radicals, oxygen radicals, or combinations thereof.

In certain embodiments, exposing the workpiece to radicals can include exposing the workpiece in the processing chamber to a filtered mixture. The filtered mixture may contain one or more radicals, such as hydrogen, deuterium, and/or oxygen radicals. The filtered mixture can be exposed to the workpiece 114 in the processing chamber. Exposure of the workpiece 114 to one or more radicals can provide numerous effects to the workpiece.

Exposure of the workpiece 114 to the thermal treatment process including one or more radicals can provide numerous effects to the workpiece. For example, in some embodiments, exposure of the workpiece 114 to the thermal treatment process reduces the resistance capacity of at least one metal layer present on the workpiece 114. In some embodiments, exposure of the workpiece 114 to the thermal treatment process can remove one or more impurities from the at least one metal layer. In certain embodiments, exposure of the workpiece 114 to the thermal treatment process can promote reflow and promote grain growth on at least one metal layer present on the workpiece 114. In some embodiments, exposure of the workpiece 114 to one or more radicals can modify grain structure on at least one metal layer on the workpiece 114. In some embodiments, exposure of the workpiece 114 to the thermal treatment process improves the transistor properties of at least one metal layer on the workpiece 114. Improved transistor properties can include threshold voltage (Vt) improvement, improvement in silicon to silicon dioxide dangling bond passivation, and the passivation of certain high-k materials present on the workpiece.

In some embodiments, exposure of the workpiece to the thermal treatment process may clean the surface of the at least one metal layer. For example, in certain embodiments the surface of the workpiece 114 may be cleaned by removal at least a portion of an oxide layer that is present on the at least one metal layer. Thus, in certain embodiments, exposure of the workpiece to the filtered mixture containing one or more radicals, removes oxidation layers from the surface of the workpiece. In some embodiments where the workpiece contains at least one metal layer thereon, exposure of the workpiece 114 to one or more radicals can reduce at least a portion of an oxygen concentration on the surface of the at least one metal layer. For example, certain processing conditions may require exposure of the workpiece 114 to oxygen containing gases or oxygen species. Exposure of the metal layers of a workpiece 114 to oxygen can often result in the oxidation of the surface of the metal layer on the workpiece 114. Accordingly, the thermal treatment process as provided herein, may reduce at least a portion of an oxygen concentration on the surface of at least one metal layer on the workpiece 114.

Similarly, certain processing conditions may require exposure of the workpiece 114 to nitrogen containing gases or species. Such nitrogen-rich conditions may result in nitrogen being deposited on layers present on the workpiece 114, such as the one or more metal layers. Thus, in embodiments provided herein, the thermal treatment process may reduce at least a portion of a nitrogen concentration on the surface of at least one metal layer on the workpiece 114.

In certain embodiments, the workpiece 114 may include at least one metal layer having a fluorine concentration thereon. For example, certain pre-processing conditions or steps, may deposit fluorine or a fluorine layer on metal layers present on the workpiece 114. Accordingly, exposure of a workpiece 114 having a metal layer having a fluorine concentration thereon to the thermal treatment process provided herein, can reduce at least a portion of the fluorine concentration on the surface of the at least one metal layer.

In certain embodiments, the workpiece 114 may include at least one metal layer, wherein the metal layer is deposited on a patterned structure on the workpiece 114. In certain embodiments, exposure of the workpiece to the thermal treatment process described herein may modify a morphology of the at least one metal layer.

In some embodiments, the workpiece 114 may include at least one layer of silicon or silicon germanium. In such embodiments, exposure of the workpiece to the thermal treatment process, including exposure of the workpiece to one or more hydrogen radicals, may allow the hydrogen radicals to diffuse through at least one layer of silicon or silicon germanium present on the workpiece. In such embodiments, exposure of the workpiece to the thermal treatment process, including exposure of the workpiece to one or more deuterium radicals, may allow the deuterium radicals to diffuse through at least one layer of silicon or silicon germanium present on the workpiece.

In certain embodiments, the thermal treatment process can include heating the workpiece 114. For instance, the workpiece 114 can be heated in the processing chamber 110 to a certain process temperature. The workpiece, 114 can be heated, for instance, using one or more heating systems associated with the pedestal 112. The workpiece 114 can be heated to a desired process temperature prior to, during, or after exposure of the workpiece to the one or more radicals.

In certain embodiments, the workpiece is at a workpiece temperature or process temperature when exposed to one or more radicals. In some embodiments, the process temperature is less than about 500° C., such as less than about 475° C., such as less than about 450° C., such as less than about 400° C., such as less than about 350° C., such as less than about 300° C., such as less than about 250° C., such as less than about 200° C., such as less than about 150° C.

In certain embodiments, the workpiece is at a process pressure when exposed to the one or more radicals. In some embodiments, the process pressure is from about 100 mT to about 20 T. In certain embodiments, the process pressure is less than about 100 T, such as less than about 50 T, such as less than about 10 T, such as less than about 1 T. In certain embodiments, the process pressure is less than the $H_2$ safety limit according to industry standards.

At (408) the method can include removing the workpiece from the processing chamber. For instance, the workpiece 114 can be removed from workpiece support 112 in the processing chamber 110. The plasma processing apparatus can then be conditioned for future processing of additional workpieces.

Example process parameters for the thermal treatment process with exposure to radicals will now be set forth:

Example 1

Figure 6A:
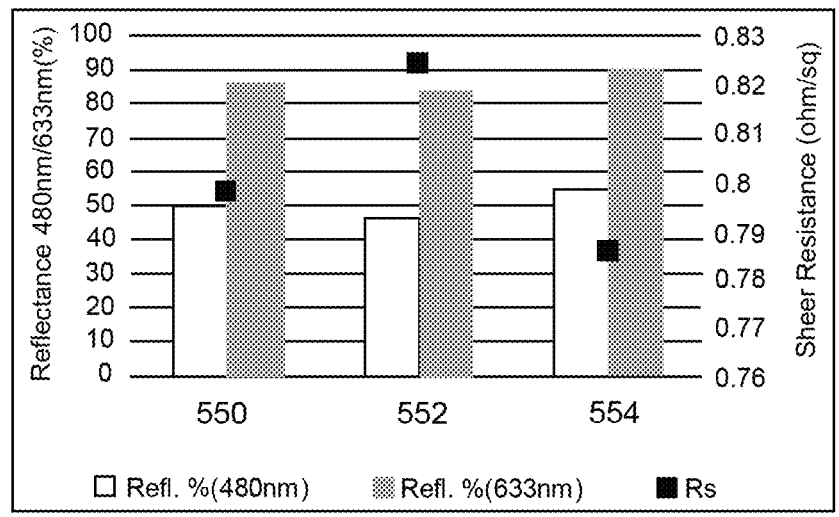
FIG. 6A depicts the reflectance restoration of copper according to example embodiments of the present disclosure.

Process Gas: $H_2$ based and $H_2$/He, $H_2$/Ar mixtures with $H_2$ ratio from 10% to 100%
Process Pressure: 100 mT to 20 T
Inductively Coupled Plasma Source Power: 2000 W to 10000 W
Workpiece Temperature: room temperature to 500 C
Gas Flow Rates for Process Gas: 100 sccm to 10 slm FIG. 6A depicts the oxide reduction on a copper layer and reflectance restoration of the copper layer according to a thermal treatment process conducted at a temperature of about 90° C. The vertical axis shows reflectance of various wavelengths (e.g., 480 nm and 633 nm). FIG. 6A depicts results for reflectance and resistance Rs of the copper layer at various different stages. At 550, FIG. 6A shows reflectance of 480 nm and 633 nm wavelengths as well as resistance Rs pre-oxidation and pre-thermal treatment of a copper layer (e.g. 5000 Angstrom copper layer deposited using physical vapor deposition). At 552, FIG. 6A shows reflectance of 480 nm and 633 nm wavelengths as well as resistance Rs post-oxidation and pre-thermal treatment of the copper layer. At 554, FIG. 6A shows reflectance of 480 nm and 633 nm wavelengths as well as resistance Rs post thermal treatment of the copper layer using exposure to radicals according to example aspects of the present disclosure. As shown, the reflectance of the copper layer was restored after the thermal treatment process and the increased resistance Rs resulting from oxidation has been reduced.

Figure 6B:
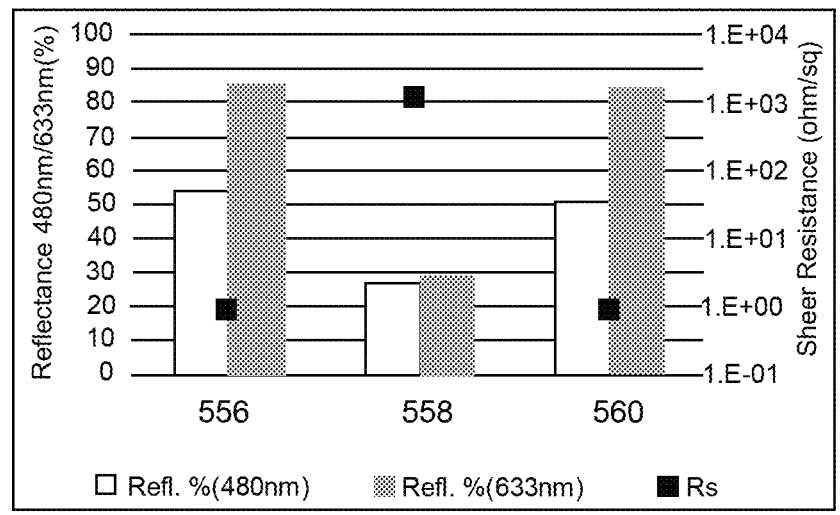
FIG. 6B depicts the reflectance restoration of copper according to example embodiments of the present disclosure.

FIG. 6B depicts the oxide reduction on a copper layer and reflectance restoration of the copper layer according to a thermal treatment process conducted. The vertical axis shows reflectance of various wavelengths (e.g., 480 nm and 633 nm). FIG. 6B depicts results for reflectance and resistance Rs of the copper layer at various different stages. At 556, FIG. 6B shows reflectance of 480 nm and 633 nm wavelengths as well as resistance Rs pre-oxidation and pre-thermal treatment of a copper layer (e.g. 5000 Angstrom copper layer deposited using physical vapor deposition). At 558, FIG. 6B shows reflectance of 480 nm and 633 nm wavelengths as well as resistance Rs post-oxidation (at 300° C.) and pre-thermal treatment of the copper layer. At 560, FIG. 6B shows reflectance of 480 nm and 633 nm wavelengths as well as resistance Rs post thermal treatment of the copper layer using exposure to radicals according to example aspects of the present disclosure. As shown, the reflectance of the copper layer was restored after the thermal treatment process and the increased resistance Rs resulting from oxidation has been reduced.

Figure 7A:
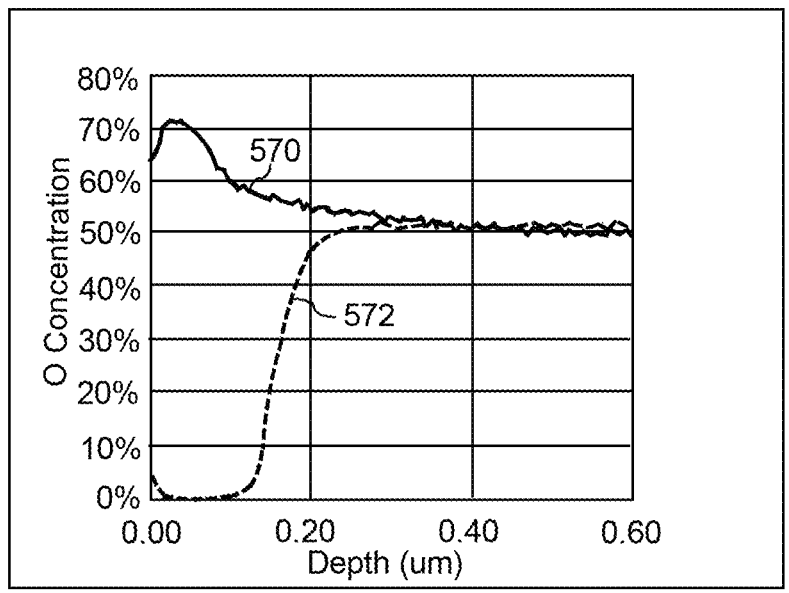
FIG. 7A depicts the reduction of oxide from oxidized copper according to example embodiments of the present disclosure.

FIG. 7A illustrates the oxygen concentration and depth on a copper layer exposed to a plasma oxidation process at 300° C. followed by a thermal treatment process including exposure to radicals according to example embodiments of the present disclosure. The vertical axis provides the oxygen concentration in the copper layer and the horizontal layer provides the depth in (μm) which the oxygen is found in the copper layer. Curve 570 is associated with oxygen concentration after the plasma oxidation process. Curve 572 depicts oxygen concentration after exposure to the thermal treatment processing include exposure to radicals according to example embodiments of the present disclosure.

Figure 7B:
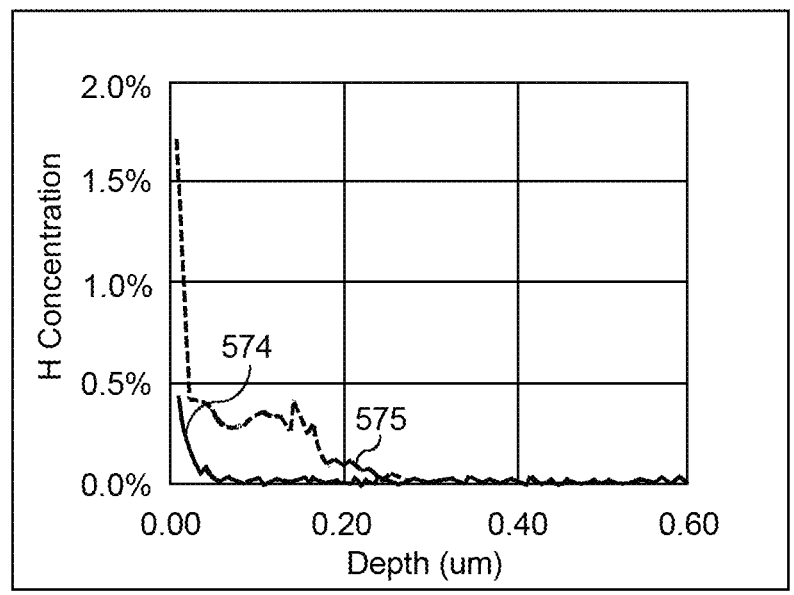
FIG. 7B depicts the hydrogen radical concentration and depth of penetration of hydrogen radicals on a copper layer according to example embodiments of the present disclosure.

FIG. 7B illustrates the hydrogen concentration and depth on a copper layer exposed to a plasma oxidation process at 300° C. followed by a thermal treatment process including exposure to radicals according to example embodiments of the present disclosure. The vertical axis provides the hydrogen concentration in the copper layer and the horizontal layer provides the depth in (μm) which the oxygen is found in the copper layer. Curve 574 is associated with hydrogen concentration after the plasma oxidation process. Curve 575 depicts hydrogen concentration after exposure to the thermal treatment processing include exposure to radicals according to example embodiments of the present disclosure. As shown in FIGS. 7A and 7B, exposure of the copper layer to the thermal treatment process, including exposure to hydrogen radicals during the thermal treatment process according to example aspects of the present disclosure can reduce the oxygen concentration from the copper layer and the hydrogen radicals can penetrate more than 2000 Å into the copper oxide layer.

Figure 8:
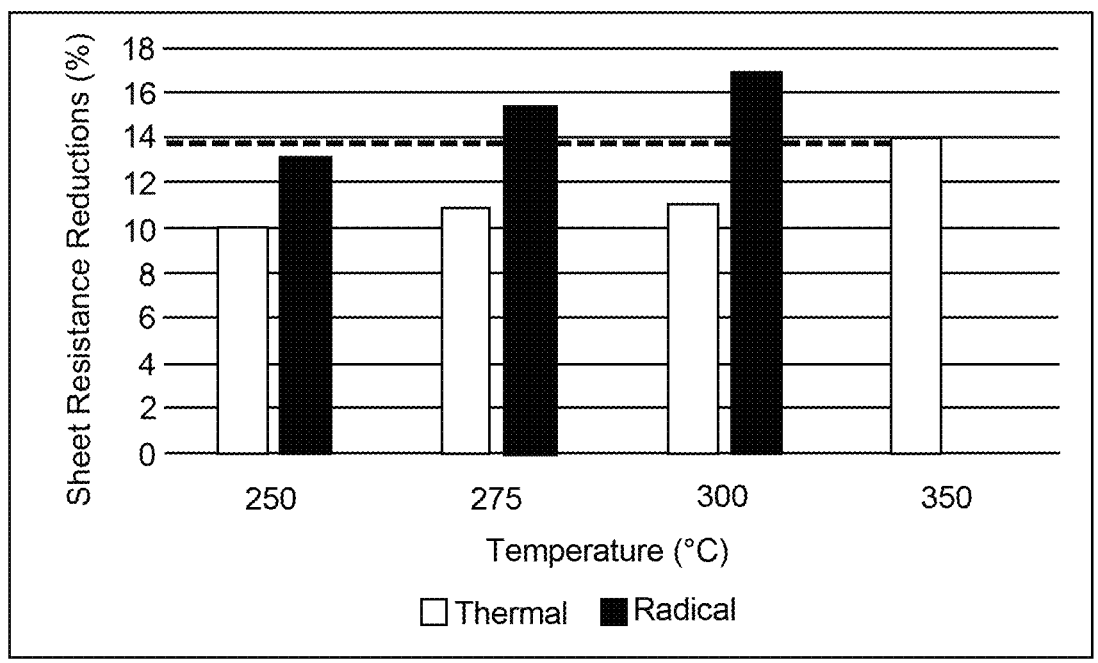
FIG. 8 depicts the resistance capacity reduction of copper according to example embodiments of the present disclosure.

FIG. 8 depicts the oxide reduction on cobalt by a thermal treatment process at various process temperatures. The vertical axis shows the percentage of sheet resistance reduction and the horizontal axis shows the temperature for both a thermal process (without radicals) and a thermal process including exposure to radicals according to example aspects of the present disclosure. As shown, the thermal treatment process including exposure to radicals shows an advantage in resistance reduction (e.g., oxide removal) at lower temperatures.

Figure 9:
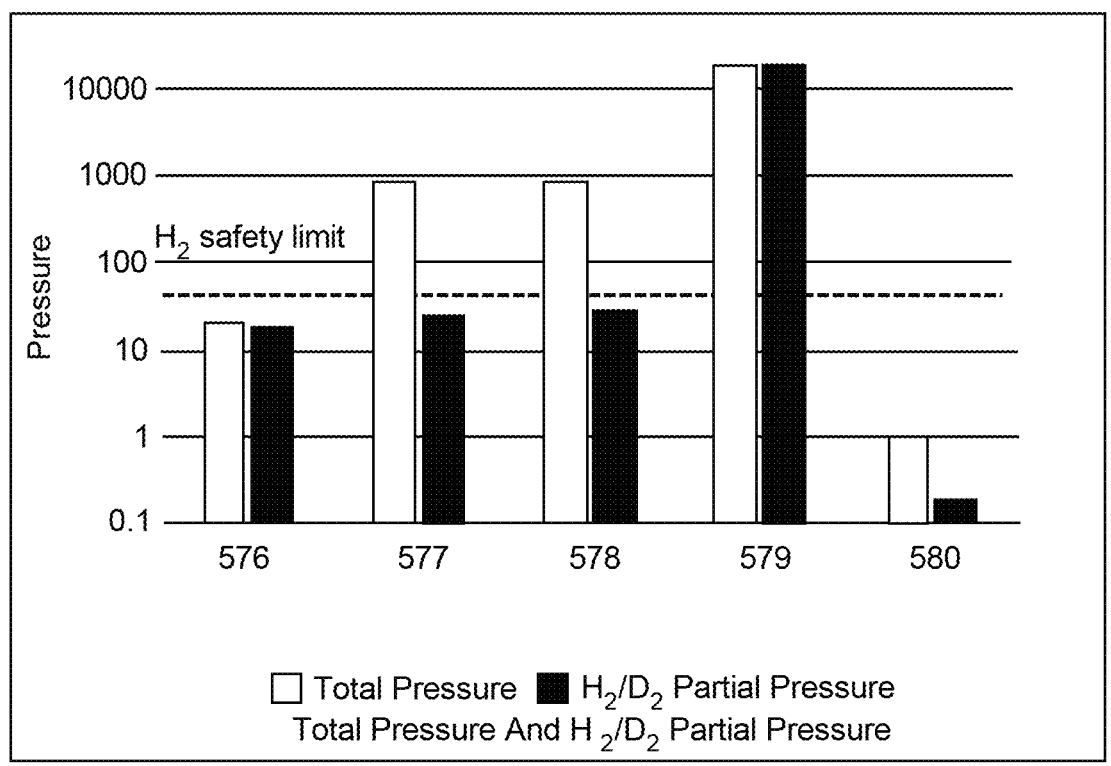
FIG. 9 depicts certain process pressures for other methods as compared to example embodiments of the present disclosure.

FIG. 9 depicts the process pressure for certain processes, including a vacuum anneal 576, single wafer atmospheric anneal 577, batch furnace atmospheric anneal 578, high pressure batch furnace atmospheric anneal 579 and a thermal treatment process including exposure to radicals 580 according to example aspects of the present disclosure. The vertical axis provides the pressure in torr and the horizontal axis corresponds to the particular process. As shown, the thermal treatment process including exposure to radicals 580 according to example embodiments of the present disclosure can be implemented at lower process pressure and below the safety limit for $H_2$ gases.

Figure 10:
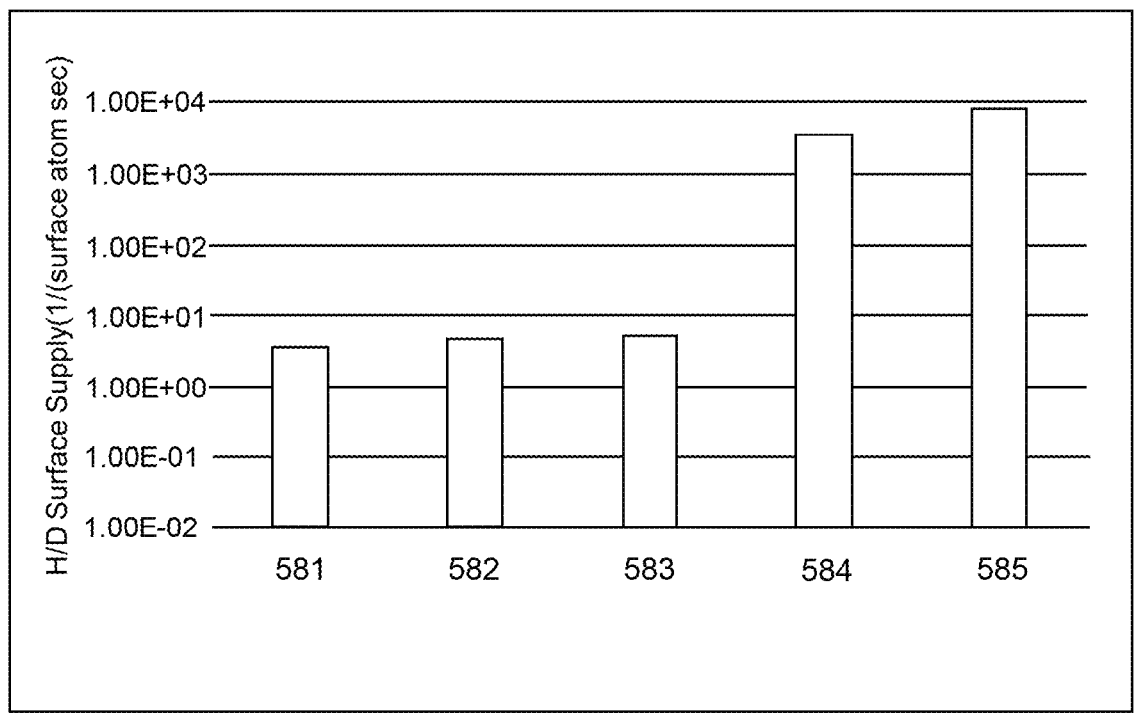
FIG. 10 depicts the supply of hydrogen or deuterium radicals to the surface of the workpiece according to other methods in comparison to example embodiments of the present disclosure.

FIG. 10 depicts the hydrogen radical or deuterium radical supply to the surface of certain wafers according to different processes with exposure to hydrogen and/or deuterium, including a vacuum anneal 581, single wafer atmospheric anneal 582 (with exposure to process gas of 3% $H_2$ or $D_2$), batch furnace atmospheric anneal 583 (e.g., with exposure to process gas of 3% $H_2$ or $D_2$), high pressure batch furnace atmospheric anneal 584 (e.g., at 20 ATM with exposure to process gas of 100% $H_2$ or $D_2$) and a thermal treatment process including exposure to radicals 585 according to example aspects of the present disclosure. The vertical axis provides the hydrogen or deuterium radical surface supply and the horizontal axis corresponds to the particular process. As shown, the thermal treatment process including exposure to radicals 585 allows for a higher exposure of hydrogen and/or deuterium as compared to the other processes.

Example aspects of the present disclosure are also directed to systems and methods for processing a workpiece, such as a semiconductor wafer. The methods provided herein include exposing a workpiece to one or more radicals, such as hydrogen radicals, oxygen radicals, and/or hydroxyl radicals. Exposure of certain workpieces, such as semiconductor wafers, to the radical process disclosed herein may offer certain technical advantages and benefits.

Semiconductor device fabrication processes can include both deposition steps where a material is deposited on a substrate and an etch step where material is removed from the substrate. Semiconductor device fabrication processes can require surface treatments after an etch step or a deposition step to improve properties of metal layers on the workpiece, and thereby improve semiconductor device performance. For instance, the surface treatments can be implemented to modify properties that include but are not limited to the repairment of the surface damage, passivation of the surface from further degradation, surface cleaning, crystallization, and so forth.

Surface cleaning can require the removal of undesired compounds such as oxidation or nitridation on materials, especially for metals. Such oxide/nitride layers on metal surfaces can restrict the flow of electrons through the device and thereby deteriorate the operational speed of a semiconductor device (e.g., integrated circuit). In addition, the oxidation/nitridation of the deposited metal may lead to agglomeration and/or irregular growth of the metal layer. Therefore, it can be desired to reduce the oxidation/nitridation of metal when processing the workpiece.

As one example, the nitridation on a tungsten layer may need to be removed before a subsequent process step to ensure a good conductance for the electrical connection of the semiconductor device. A surface cleaning process can also be desired for films including Cu, Ge, Co, Ru, Ta, TaN, TiN, TiAlC, and Ti to reduce the undesired surface oxidation and/or nitridation due to the exposure to ambient or other chemically active environments in prior process steps. In some practices, thermal treatment in a molecule gas (containing, for instance, $H_2$ molecules) environment is used as a method to clean the aforementioned film. However, this method often lacks the flexibility in the thermal budget as the treatment usually requires a high process temperature to activate the chemical reaction between the molecule gas and the subjected film. Moreover, such thermal processes may not work for some stable metal compounds such as tungsten nitride.

According to example aspects of the present disclosure, radicals generated by a remote plasma and/or a direct plasma from a process gas including a hydrogen containing gas and an oxygen containing gas can be used for surface treatment of a metal layer (e.g., to implement a metal surface cleaning process). The inventors have discovered that the addition of an oxygen containing gas to the process gas having a hydrogen containing gas can significantly enhance the metal oxide and/or metal nitride reduction efficiency by a remote plasma. This enhancement can be due, for instance, to improved lifetime of H radicals from the remote plasma as well as the dynamic oxidation/reduction mechanism.

In some embodiments, a plasma processing apparatus can include a plasma chamber separated from a processing chamber by a separation grid. A process gas, including a hydrogen containing gas and an oxygen containing gas can be introduced into the plasma chamber. The process gas can include a carrier gas (such as an inert gas (He, Ar, Ne, $N_2$, etc.)). An inductively coupled plasma source can be energized with RF energy to induce a plasma in the process gas. Species generated in the plasma can be filtered and/or re-distributed by the separation grid such that primarily neutral radicals pass through the separation grid. The neutral radicals can be exposed to a workpiece supported on a workpiece support (e.g., a temperature controlled heat block) in the processing chamber. The neutral radicals can include, for instance, hydrogen (H) radicals, oxygen (O) radicals, and/or hydroxyl (OH) radicals. In some embodiments, the radicals can be generated directly in the processing chamber via a direct plasma.

The hydrogen containing gas and oxygen containing gas based plasma treatment process according to example aspects of the present disclosure can be used to treat metal layers, such as W, Cu, Ge, Co, Ta, Ru, TaN, TiN, TiAlC, and/or Ti layers on the workpiece. The treatment process can lead to resistance ($R_C$) reduction, impurity removal (e.g., carbon, fluorine, nitrogen, oxygen, etc.), reflow, grain regrowth, etc. The treatment process can include the reduction of oxidation and/or nitridation layers on the metal layers. The treatment process can also include surface smoothing of the metal layers or other layers on the work piece (e.g., dielectric layers, semiconductor layers. The treatment process can be used to at least partially remove an etch residue layer (e.g., carbon, fluorine, nitrogen, oxygen, etc.).

For example, in some embodiments, methods are directed to processing a workpiece to adjust properties of metal film layers (e.g., W, Cu, Ge, Co, Ru, TaN, TiN, TiAlC, Ti, etc.) on the workpiece. In some embodiments, the systems and methods are operable to process workpieces to adjust properties of metal film layers using a $H_2/O_2$ remote plasma or direct plasma to generate one or more radicals. Exposing the metal film layers to the one or more radicals according to example aspects of the present disclosure can provide for surface cleaning (e.g., oxide and/or nitride reduction), resistance ($R_s$) reduction, and more. Including oxygen in the process gas mixture in the plasma source was found to significantly enhance treatment efficiency by prolonging the lifetime of H radicals generated using the plasma source. Introducing oxygen into the process gas mixture can offer a dynamic oxidation/reduction mechanism. The treatment process can be used to promote intermixing of at least one metal layer with a layer underneath the metal layer. The treatment process can be used to clean a metal nitride layer by removing oxygen from the metal nitride layer.

The hydrogen and oxygen based plasma treatment according to example aspects of the present disclosure can be used for selective photoresist strip over metal layers. Radicals generated using a remote hydrogen and oxygen based plasma show a good photoresist strip rate while modifying properties of the metal layer at the same time. As such the hydrogen and oxygen based plasma treatment process treatment process according to example aspects of the present disclosure can be suitable for photoresist strip over metal layers. Furthermore, the methods disclosed herein may be suitable for selective photoresist strip over metal layers without causing damage to the metal layers.

In some embodiments, the hydrogen and oxygen based plasma treatment process according to example aspects of the present disclosure can be used for selective oxidation of silicon relative to silicon germanium. The oxidation mechanism of silicon germanium can involve the oxidation of germanium as a catalytic step. The hydrogen and oxygen based plasma treatment process according to example aspects of the present disclosure can reduce or suppress the oxidation of germanium and thus reduce the oxidation of silicon germanium. In this regard, the hydrogen and oxygen based plasma treatment process according to example aspects of the present disclosure can be capable of selective oxidation of silicon relative to silicon germanium. The concentration of the hydrogen gas can be adjusted to tune the process to make oxidation of silicon germanium selective relative to silicon.

In some embodiments, the hydrogen and oxygen based plasma treatment process according to example aspects of the present disclosure can be used for selective oxidation of a silicon or silicon nitride layer relative to a metal layer. For instance, treating the workpiece according to example aspects of the present disclosure can lead to oxidation of the silicon or silicon nitride layer at a first rate and oxidation of the metal layer at a second rate. The first rate can be different from the second rate.

Example aspects of the present disclosure can provide a number of technical effects and benefits. For instance, the methods provided herein can improve surface properties of the workpiece including improving conductance of the workpiece. The methods provided herein also can improve the properties of metal layers on the workpiece such as resistance reduction, impurity removal, reflow, grain regrowth, etc. The methods provided herein can also enhance metal oxide and/or metal nitride reduction efficiency. Further, the methods provided may selectively strip photoresist over metal layers. The methods provided herein can also be used to exclusively oxidize silicon relative to silicon germanium. The method provided herein can also be used to selectively oxidize silicon or silicon nitride relative to metal or metal nitride. Furthermore, the methods provided herein can be used to smooth the surface of metal layers located on a workpiece.

Aspects of the present disclosure are discussed with reference to an inductively coupled plasma source for purposes of illustration and discussion. Those of ordinary skill in the art, using the disclosures provided herein, will understand that any plasma source (e.g., inductively coupled plasma source, capacitively coupled plasma source, etc.) can be used without deviating from the scope of the present disclosure. For example, the apparatus shown and described in FIG. 1 can be used for the purposes disclosed herein.

Figure 11:
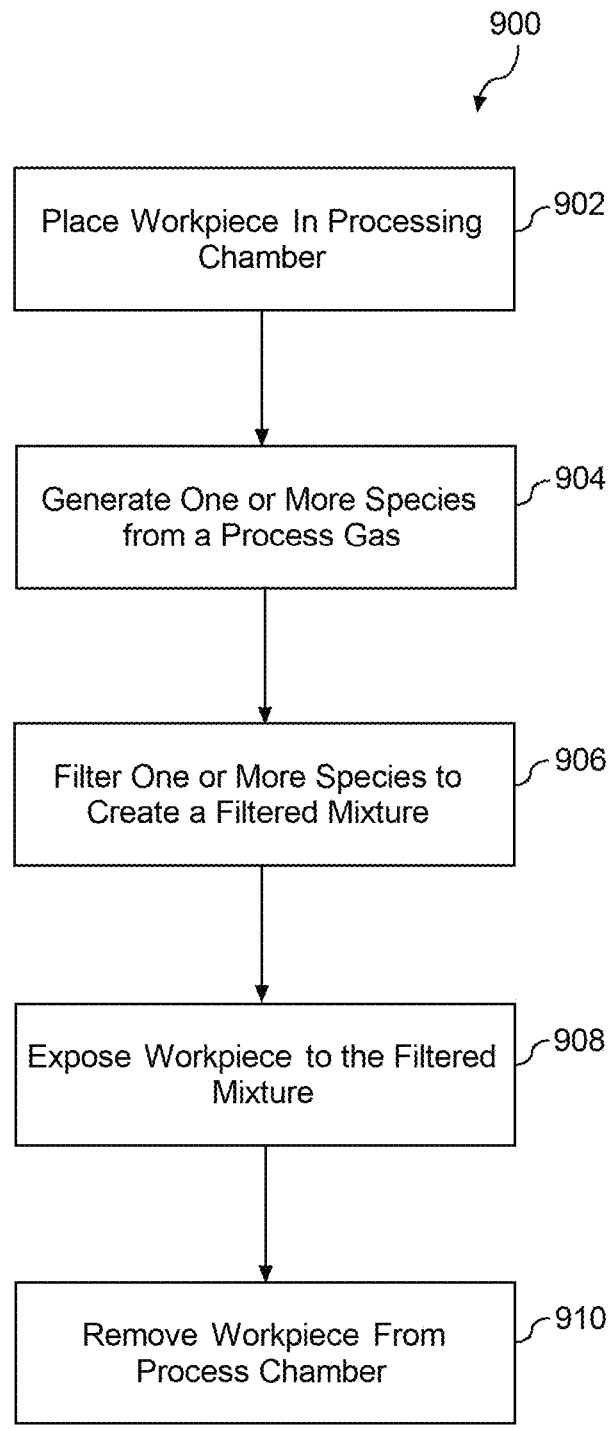
FIG. 11 depicts a flow diagram of an example method according to example embodiments of the present disclosure.

FIG. 11 depicts one example method (900) according to example aspects of the present disclosure. The method (900) will be discussed with reference to the plasma processing apparatus 100 of FIG. 1 by way of example. The method (900) can be implemented in any suitable plasma processing apparatus. FIG. 11 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

At (902), the method can include placing a workpiece in a processing chamber of a plasma processing apparatus 100. The processing chamber 110 can be separated from a plasma chamber 120 (e.g., separated by a separation grid assembly). For instance, the method can include placing a workpiece 114 onto workpiece support 112 in the processing chamber 110 of FIG. 1. The workpiece may include at least one layer of metal. In certain embodiments, the at least one layer of metal includes cobalt, copper, germanium, silicon, ruthenium, tantalum, tungsten, titanium, aluminum-doped titanium carbide, and/or aluminum-doped titanium or combinations thereof. In some embodiments, the workpiece includes at least one dielectric layer. In some embodiments, the workpiece can include at least one semiconductor layer, such as a silicon layer and/or a silicon germanium layer.

At (904), the method can include generating one or more species from a process gas. The process gas used may include a hydrogen containing gas, such as hydrogen ($H_2$). The process gas used may include an oxygen containing gas, such as oxygen ($O_2$). The process gas may also include one or more carrier or diluent gases. The carrier or diluent gases may be comprised of an inert gas, for example, helium, xenon, argon, neon, or combinations thereof. For example, in certain embodiments, the gas delivery system 150 may be configured to deliver process gas to the plasma chamber 120, for instance, via gas distribution channel 151 or other distribution system (e.g., showerhead). The gas delivery system can include a plurality of feed gas lines 159. The feed gas lines 159 can be controlled using valves and/or mass flow controllers to deliver a desired amount of gases into the plasma chamber as process gas. As shown in FIG. 1, the gas delivery system 150 can include feed gas line(s) for delivery of a hydrogen-containing gas (e.g., $H_2$). The gas delivery system 150 can include feed gas line(s) for delivery of an oxygen-containing gas (e.g., $O_2$). The gas delivery system 150 can include feed gas line(s) for delivery of a dilution gas or diluent gas (e.g., Ar, He, Ne, Xe, $N_2$ or other inert gas).

In some embodiments, the process gas may contain from about 5% to up to about 99.9% of total gas flow rate of hydrogen gas ($H_2$). In some embodiments, the process gas may contain at least about 10% of total gas flow rate of hydrogen ($H_2$), such as at least 20% of total gas flow rate, such as at least 30% of total gas flow rate, such as at least 40% of total gas flow rate, such as at least 50% of total gas flow rate, such as at least 60% of total gas flow rate, such as at least 70% of total gas flow rate, such as at least 80% of total gas flow rate, such as at least 90% of total gas flow rate.

In some embodiments, the process gas may contain from about 0.1% to up to about 95% of total gas flow rate of oxygen gas ($O_2$). In some embodiments, the process gas may contain at least about 10% of total gas flow rate of oxygen gas ($O_2$), such as at least 20% of total gas flow rate, such as at least 30% of total gas flow rate, such as at least 40% of total gas flow rate, such as at least 50% of total gas flow rate, such as at least 60% of total gas flow rate, such as at least 70% of total gas flow rate, such as at least 80% of total gas flow rate, such as at least 90% of total gas flow rate.

In certain embodiments, to generate the one or more species, the induction coil 130 can be energized with RF power from the RF power generator 134, to generate a plasma from the process gas in the plasma chamber. The plasma generated can include one or more species including hydrogen radicals, oxygen radicals, hydroxyl radicals, and combinations thereof.

At (906), the method can include filtering the one or more species generated from the process gas. To create a filtered mixture, in some embodiments, the one or more species can be filtered via a separation grid 200 that separates the plasma chamber 120 from the processing chamber. The separation grid 200 can be used to perform ion filtering from a mixture generated by plasma in the plasma chamber 120 to generate a filtered mixture.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the separation grid 200 can be configured to filter ions with an efficiency greater than or equal to about 90%, such as greater than or equal to about 95%. A percentage efficiency for ion filtering refers to the number of ions removed from the mixture relative to the total number of ions in the mixture. For instance, an efficiency of about 90% a indicates that about 90% of the ions are removed during filtering. An efficiency of about 95% indicates that about 95% of the ions are removed during filtering.

At (908), the method can include exposing the workpiece in the processing chamber to the filtered mixture. The filtered mixture can be exposed to the workpiece 114 in the processing chamber. Exposure of the workpiece 114 to the filtered mixture can provide numerous effects to the workpiece. For example, in some embodiments, exposure of the workpiece 114 to the filtered mixture reduces the resistance capacity of at least one metal layer present on the workpiece 114. In some embodiments, exposure of the workpiece 114 to the filtered mixture cleans the surface of at least one metal layer present on the workpiece. In some embodiments, exposing the workpiece to the filtered mixture cleans the surface of at least one metal layer on the workpiece by removing at least a portion of an oxide layer that is present on the surface of at least one metal layer.

Figures 12A, 12B, 12C:
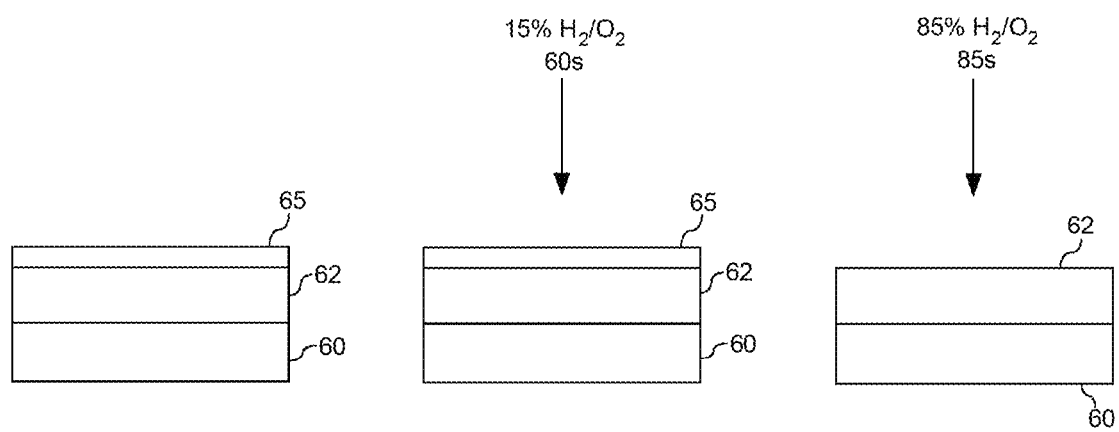
FIG. 12A depicts an example tungsten layer having an oxidation layer thereon.
FIG. 12B depicts an example tungsten layer after exposure to methods according to example embodiments of the present disclosure.
FIG. 12C depicts an example tungsten layer after exposure to methods according example embodiments of the present disclosure.

For example, FIG. 12(a) depicts an example tungsten layer 62 disposed on a substrate layer 60 (e.g., Si layer) on a workpiece. As shown, there is an oxidation layer 65 on the tungsten layer 62 that can be a result of native oxidation of the tungsten layer 62 due to, for instance, exposure to atmosphere, oxygen, or other process gases. FIG. 12(b) depicts the tungsten layer 62 after exposure to radicals generated by an inductively coupled plasma source using a process gas with 15% $H_2/O_2$ in the process gas for a process period of about 60 seconds. As shown, a significant oxidation layer 65 is still present on the tungsten layer 62. FIG. 12(c) depicts the tungsten layer 62 after exposure to radicals generated by an inductively coupled plasma source using a process gas with 85% $H_2/O_2$ in the process gas for a process period of about 85 seconds. As shown, the oxidation layer 65 has been substantially removed.

In some embodiments, exposing the workpiece to the filtered mixture cleans the surface of at least one metal layer on the workpiece by removing at least a portion of a nitride layer that is present on the surface of at least one metal layer. In certain embodiments, exposing the workpiece to the filtered mixture promotes grain growth on at least one metal layer on the workpiece. In some embodiments, the workpiece may include a metal layer and at least one photoresist layer or hardmask layer. In certain embodiments, the photoresist layer or hardmask layer may be present on the surface of at least one metal layer. In other embodiments, the photoresist layer or hardmask layer may be present on the workpiece but does not cover the at least one metal layer on the workpiece. In certain embodiments, exposing the workpiece to the filtered mixture removes at least a portion of the photoresist layer or hardmask layer on the workpiece while leaving the at least one metal layer undamaged. In addition, the metal layer may be treated according to example aspects of the present disclosure. For instance, In some embodiments, the process can clean or recondition the surface of the metal layers after exposure to a photoresist removal process. In some embodiments, exposing the workpiece to the filtered mixture can promote reflow and/or grain growth on at least one metal layer present on the workpiece. In some embodiments, exposing the workpiece to the filtered mixture can smooth the surface of at least one metal layer on the workpiece.

In certain embodiments, exposure of the workpiece to the filtered mixture selectively oxidizes at least one layer of silicon as compared to silicon germanium. For example, exposure of the workpiece to the filtered mixture can facilitate the formation of an oxide layer on at least one metal layer, such as silicon or silicon germanium. In certain embodiments, exposure of the workpiece to the filtered mixture forms an oxide layer on silicon at a first rate of formation and forms an oxide layer on silicon germanium at a second rate of formation. In certain embodiments, the first rate of formation is faster than the second rate of formation. Accordingly, in certain embodiments, the methods disclosed herein can be used to selectively oxidize silicon layers as compared to silicon germanium layers present on a workpiece.

In certain embodiments, the workpiece is at a process pressure when exposed to the filtered mixture. In some embodiments, the process pressure is from about 50 mT to about 5000 mT.

In certain embodiments, the workpiece may be exposed to the filtered mixture for a certain process time. In some embodiments, the process time may be from about 30 seconds to about 900 seconds. In some embodiments, the process time may be from about 30 seconds to about 600 seconds. For example, in some embodiments the process time may be at least about 30 seconds, such as at least about 40 seconds, such as at least about 50 seconds, such as at least about 60 seconds, such as at least about 70 seconds, such as at least about 80 seconds, such as at least about 90 seconds, such as at least about 100 seconds, etc.

At (910) the method can include removing the workpiece from the processing chamber. For instance, the workpiece 114 can be removed from workpiece support 112 in the processing chamber 110. The plasma processing apparatus can then be conditioned for future processing of additional workpieces.

Figure 13:
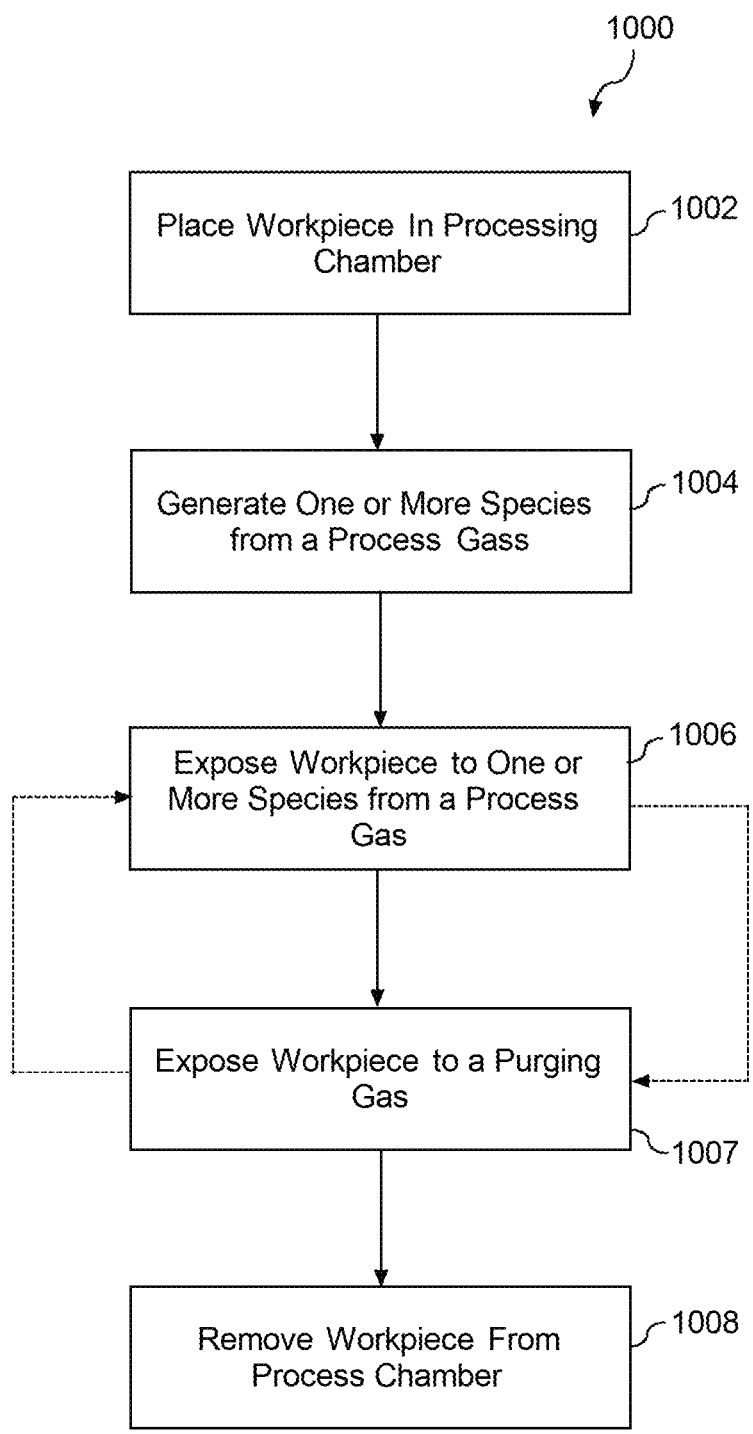
FIG. 13 depicts a flow diagram of an example method according to example embodiments of the present disclosure.

FIG. 13 depicts one example method (1000) according to example aspects of the present disclosure. The method (1000) will be discussed with reference to the will be discussed with reference to the plasma processing apparatus 500 of FIG. 2 by way of example. The method (1000) can be implemented in any suitable plasma processing apparatus. FIG. 13 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

At (1002), the method can include placing a workpiece in a processing chamber of a plasma processing apparatus 100. The processing chamber 110 can be separated from a plasma chamber 120 (e.g., separated by a separation grid assembly). For instance, the method can include placing a workpiece 114 onto workpiece support 112 in the processing chamber 110 of FIG. 2. The workpiece may include at least one layer of metal. In certain embodiments, the at least one layer of metal includes cobalt, copper, germanium, silicon, ruthenium, tantalum, tungsten, titanium, or combinations thereof. In some embodiments, the workpiece may include at least one layer of silicon and at least one layer of silicon germanium. In some embodiments, the workpiece may include at least one layer of dielectric material.

At (1004), the method can include generating one or more species from a process gas. The process gas used may include a hydrogen containing gas, such as hydrogen ($H_2$). The process gas used may include an oxygen containing gas, such as oxygen ($O_2$). The process gas may also include one or more carrier or diluent gases. The carrier or diluent gases may be comprised of an inert gas, for example, helium, xenon, argon, neon, or combinations thereof. For example, in certain embodiments, the gas delivery system 150 may be configured to deliver process gas to the plasma chamber 120, for instance, via gas distribution channel 151 or other distribution system (e.g., showerhead). The gas delivery system can include a plurality of feed gas lines 159. The feed gas lines 159 can be controlled using valves and/or mass flow controllers to deliver a desired amount of gases into the plasma chamber as process gas. As shown in FIG. 2, the gas delivery system 150 can include feed gas line(s) for delivery of a hydrogen-containing gas (e.g., $H_2$). The gas delivery system 150 can include feed gas line(s) for delivery of an oxygen-containing gas (e.g., $O_2$). The gas delivery system 150 can include feed gas line(s) for delivery of a dilution gas or diluent gas (e.g., Ar, He, Ne, Xe, $N_2$ or other inert gas).

In some embodiments, the process gas may contain from about 5% to up to about 99.9% of total gas flow rate of hydrogen gas ($H_2$). In some embodiments, the process gas may contain at least about 10% of total gas flow rate of hydrogen ($H_2$), such as at least 20% of total gas flow rate, such as at least 30% of total gas flow rate, such as at least 40% of total gas flow rate, such as at least 50% of total gas flow rate, such as at least 60% of total gas flow rate, such as at least 70% of total gas flow rate, such as at least 80% of total gas flow rate, such as at least 90% of total gas flow rate.

In some embodiments, the process gas may contain from about 0.1% to up to about 95% of total gas flow rate of oxygen gas ($O_2$). In some embodiments, the process gas may contain at least about 10% of total gas flow rate of oxygen gas ($O_2$), such as at least 20% of total gas flow rate, such as at least 30% of total gas flow rate, such as at least 40% of total gas flow rate, such as at least 50% of total gas flow rate, such as at least 60% of total gas flow rate, such as at least 70% of total gas flow rate, such as at least 80% of total gas flow rate, such as at least 90% of total gas flow rate.

In certain embodiments, to generate the one or more species, the induction coil 130 can be energized with RF power from the RF power generator 134, to generate a plasma from the process gas in the plasma chamber. The plasma generated can include one or more species including hydrogen radicals, oxygen radicals, hydroxyl radicals, and combinations thereof.

In certain embodiments, the one or more species may be generated via a direct plasma generated in the processing chamber. In certain embodiments, the species may be generated from both an inductively coupled plasma generated in the plasma chamber and/or a direct plasma generated in the processing chamber. For example, in some embodiments a process gas can be provided to the processing chamber. A direct plasma can be induced from the process gas by providing RF power to the bias electrode. In certain embodiments, the direct plasma may be generated from the filtered mixture that passes through a separation grid as provided herein.

At (1006), the method can include exposing the workpiece in the processing chamber to one or more species generated from the process gas. The one or more species can include one or more radicals, such as hydrogen radicals, oxygen radicals, and/or hydroxyl radicals. The one or more radicals may be provided by a filtered mixture or can be provided by a direct plasma generated in the processing chamber. The one or more radicals can be exposed to the workpiece 114 in the processing chamber. Exposure of the workpiece 114 to the one or more radicals can provide numerous effects to the workpiece. For example, in some embodiments, exposure of the workpiece 114 to the one or more radicals reduces the resistance capacity of at least one metal layer present on the workpiece 114. In some embodiments, exposure of the workpiece 114 to the one or more radicals cleans the surface of at least one metal layer present on the workpiece. In some embodiments, exposing the workpiece to the one or more radicals cleans the surface of at least one metal layer on the workpiece by removing at least a portion of an oxide layer that is present on the surface of at least one metal layer. In some embodiments, exposing the workpiece to the one or more radicals cleans the surface of at least one metal layer on the workpiece by removing at least a portion of a nitride layer that is present on the surface of at least one metal layer. In certain embodiments, exposing the workpiece to the one or more radicals promotes grain growth on at least one metal layer on the workpiece.

In some embodiments, the workpiece may include a metal layer and at least one photoresist layer. In certain embodiments, the photoresist layer may be present on the surface of at least one metal layer. In other embodiments, the photoresist layer may be present on the workpiece but does not cover the at least one metal layer on the workpiece. In certain embodiments, exposing the workpiece to the one or more radicals removes at least a portion of the photoresist layer on the workpiece while leaving the at least one metal layer undamaged. In some embodiments, exposing the workpiece to the one or more radicals can promote reflow and/or grain growth on at least one metal layer present on the workpiece. In some embodiments, exposing the workpiece to the one or more radicals can smooth the surface of at least one metal layer on the workpiece.

In certain embodiments, exposure of the workpiece to the one or more radicals selectively oxidizes at least one layer of silicon as compared to silicon germanium. For example, exposure of the workpiece to the one or more radicals can facilitate the formation of an oxide layer on at least one metal layer, such as silicon or silicon germanium. In certain embodiments, exposure of the workpiece to the one or more radicals forms an oxide layer on silicon at a first rate of formation and forms an oxide layer on silicon germanium at a second rate of formation. In certain embodiments, the first rate of formation is faster than the second rate of formation. Accordingly, in certain embodiments, the methods disclosed herein can be used to selectively oxidize silicon layers as compared to silicon germanium layers present on a workpiece.

In certain embodiments, the workpiece is at a process pressure when exposed to the one or more radicals. In some embodiments, the process pressure is from about 50 mT to about 5000 mT.

In certain embodiments, the workpiece may be exposed to the one or more radicals for a certain process time. In some embodiments, the process time may be from about 30 seconds to about 900 seconds. In some embodiments, the process time may be from about 30 seconds to about 600 seconds. For example, in some embodiments the process time may be at least about 30 seconds, such as at least about 40 seconds, such as at least about 50 seconds, such as at least about 60 seconds, such as at least about 70 seconds, such as at least about 80 seconds, such as at least about 90 seconds, such as at least about 100 seconds, etc.

At (1007) the method may optionally include exposing the workpiece to a purging gas. For example, after the workpiece 114 is exposed to one or more radicals for a certain process time, it may be desirable to expose the workpiece and processing chamber to a purging gas in order to remove certain species, including radicals, from the processing chamber. In some embodiments, the purging gas may be any suitable inert gas including, but not limited to, helium, argon, neon, xenon, or nitrogen. Once the processing chamber has been purged, the workpiece can then be exposed again to one or more species generated from a process gas according to (1006) as provided herein. In certain embodiments, (1006) and (1007) may be alternated cyclically until desired results on the workpiece have been obtained. Thus, in certain embodiments, the methods disclosed herein may use certain pulse and purge cycles in order to control exposure of the workpiece to the one or more radicals generated herein.

At (1008) the method can include removing the workpiece from the processing chamber. For instance, the workpiece 114 can be removed from workpiece support 112 in the processing chamber 110. The plasma processing apparatus can then be conditioned for future processing of additional workpieces.

Example hardware parameters for the plasma processing apparatus are provided below:
ICP high density source
Radical only process by dual conductive grid filtering
No RF bias
Bare Al chamber with native surface oxidation
Dielectric sidewall materials: $SiO_2$, SiC, $Al_2O_3$, AlN
Separation Grid materials: conductive Al, SiC, Si, graphite, Ni, Mo, Zn, Metal composite
ICP Source Power: 2000-10000 W
Frequency: 13.56 MHz, 2-60 MHz Example process parameters for an $H_2$ and $O_2$ remote plasma based surface treatment process are provided below:

Example 2

Figure 14:
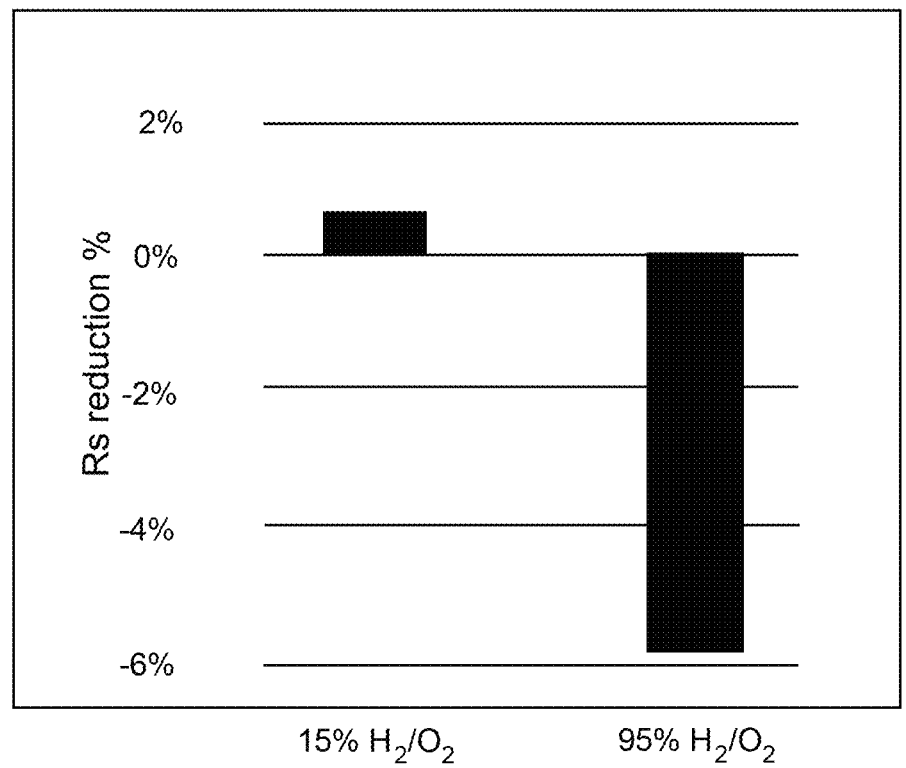
FIG. 14 depicts the resistance capacity reduction of tungsten according to example embodiments of the present disclosure.

Process Gas: $O_2$, $H_2$
Carrier Gas: He, Ar or no carrier gas
Process Pressure: 50 mT to 5000 mT
Inductively Coupled Plasma Source Power: 500 W to 5000 W
Process Period: 30 s to 900 s
Gas Flow Rates for Process Gas: 0.5 slm to 15 slm
Concentration of $O_2$: 0.1% to 90% of total gas flow rate
Concentration of $H_2$: 99.9% to 10% of total gas flow rate FIG. 14 depicts the resistance ($R_s$) reduction of an example tungsten layer ater exposure to radicals generated by an inductively coupled plasma source using a process gas with 15% $H_2/O_2$ in the process gas for a process period of about 60 seconds and after exposure to radicals generated by an inductively coupled plasma source using a process gas with 95% $H_2/O_2$ in the process gas for a process period of about 85 seconds. As shown, the tungsten layer exposed to radicals generated from the process gas containing 95% $H_2/O_2$ showed significant resistance ($R_s$) reduction as compared to the tungsten layer exposed to radicals generated from the process gas containing 15% $H_2/O_2$.

Figure 15:
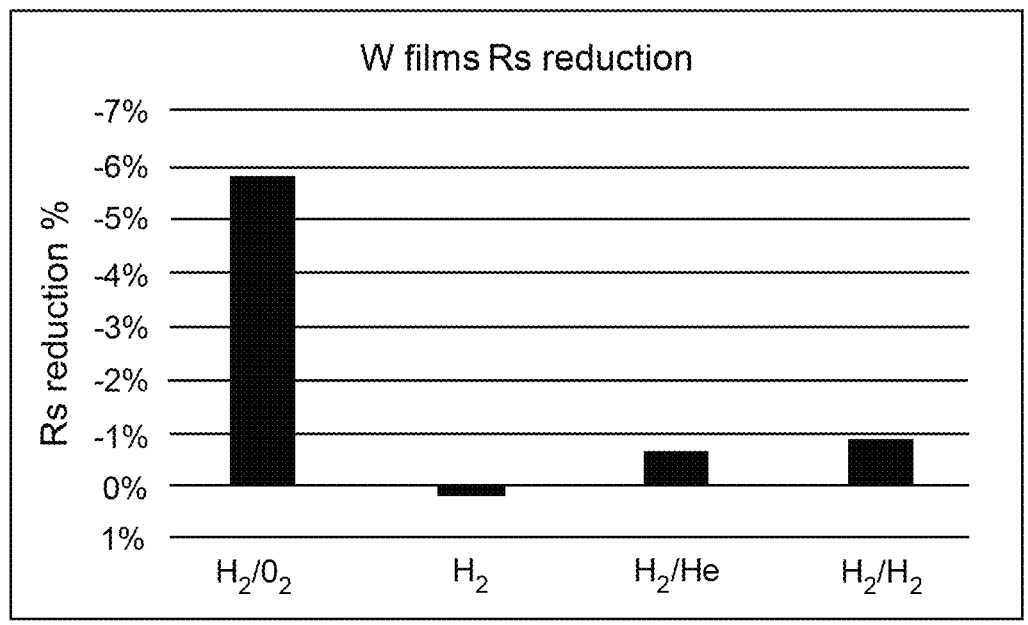
FIG. 15 depicts the resistance capacity reduction of tungsten according to example embodiments of the present disclosure.

FIG. 15 depicts a comparison of resistance ($R_s$) reduction of an example tungsten layer having native oxidation thereon with different remote plasma chemistries. For example, the process gases compared include: $H_2$, $H_2/O_2$, $H_2/He$, and $H_2/N_2$. As shown, the $H_2/O_2$ based remote plasma shows the best performance in resistance ($R_s$) reduction, which indicates an enhanced metal treatment efficiency by using an $H_2/O_2$ based remote plasma treatment process.

Figure 16:
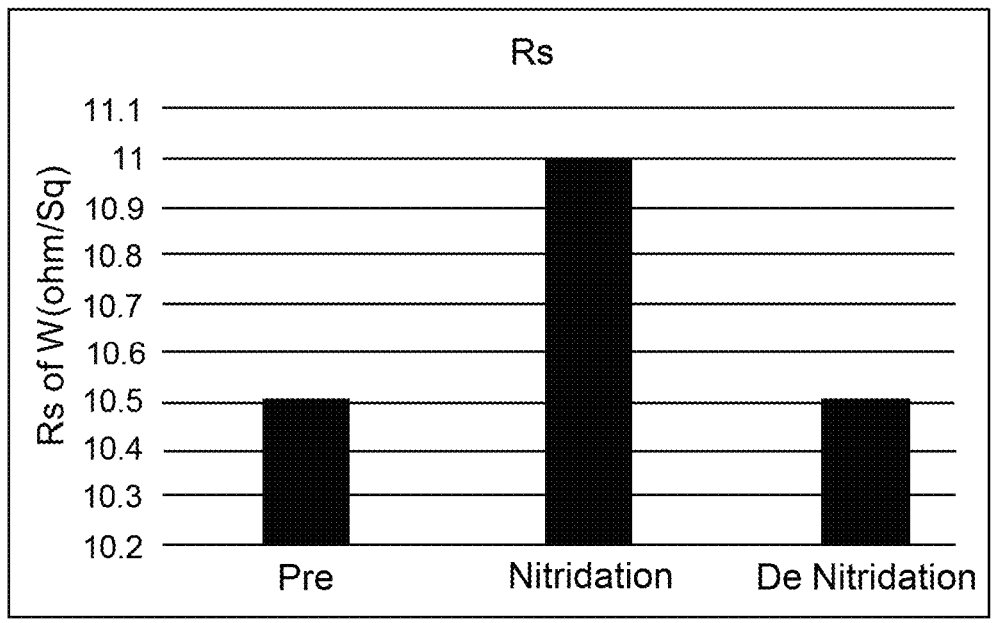
FIG. 16 depicts the resistance of tungsten according to example embodiments of the present disclosure.

FIG. 16 depicts the effectiveness of using an $H_2/O_2$ based remote plasma treatment process for reduction of tungsten nitride to tungsten, evident from the resistance ($R_s$) of the tungsten film. The Rs of W increases due to the nitridation of W. This increase in Rs can be fully reduced by the de-nitridation process by the $H_2/O_2$ remote plasma treatment process.

Figure 17:
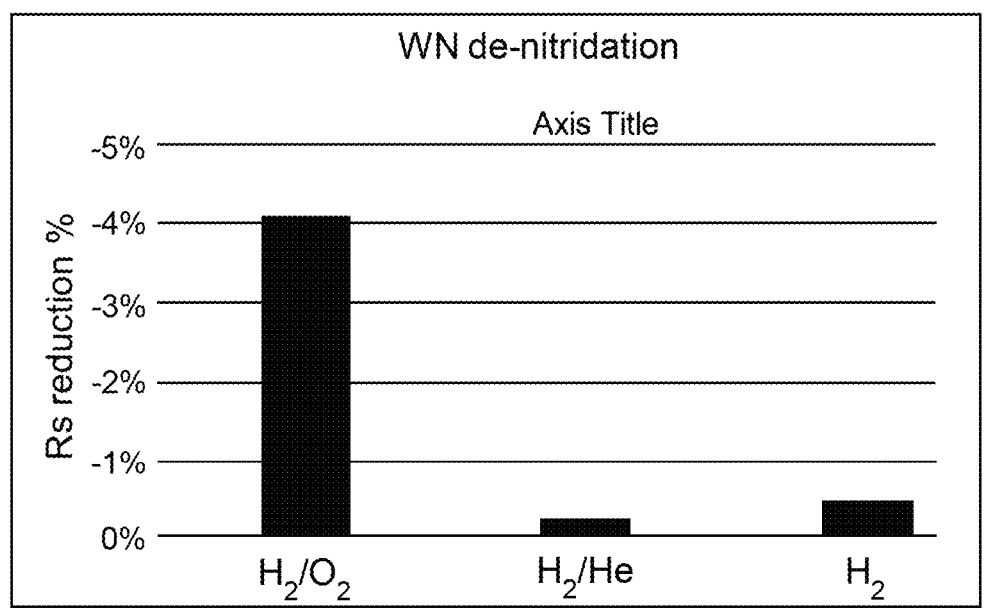
FIG. 17 depicts the resistance capacity reduction and de-nitridation of tungsten according to example embodiments of the present disclosure.

FIG. 17 depicts a comparison of the Rs reduction of a tungsten nitride film with different remote plasma chemistry between $H_2$, $H_2/O_2$, and $H_2/He$. The $H_2/O_2$ show the best performance in the Rs reduction of tungsten nitride, which indicates a significantly enhanced metal treatment efficiency by using an $H_2/O_2$ based remote plasma treatment process.

Figure 18:
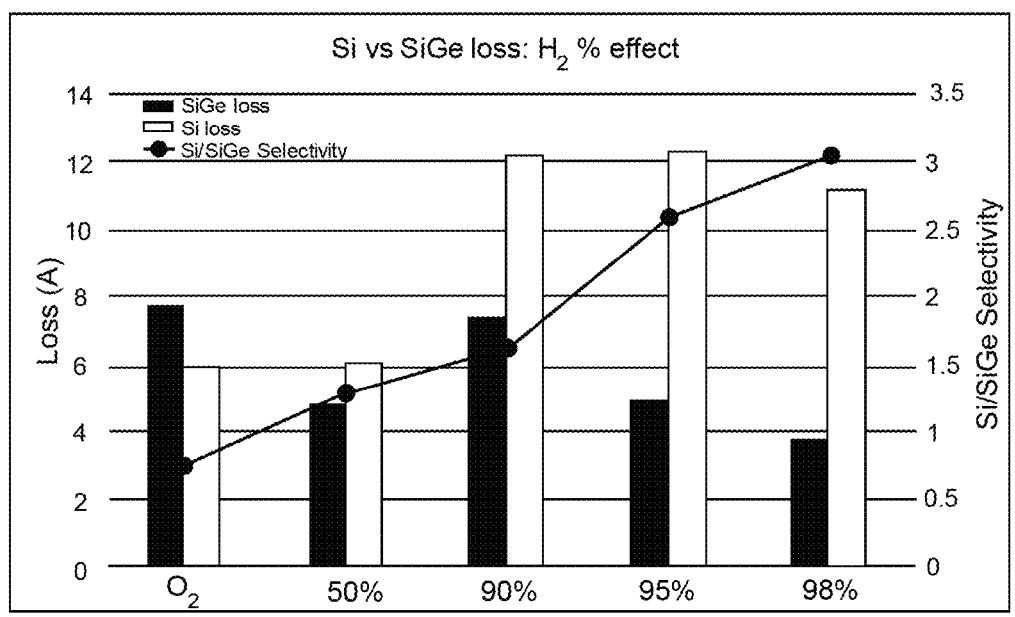
FIG. 18 depicts the selectivity of silicon to silicon germanium according to example embodiments of the present disclosure.

FIG. 18 depicts the effectiveness of an $H_2/O_2$ remote plasma based treatment process in providing selective oxidation/loss of Si over SiGe. The loss is caused by the DHF removal of the $H_2/O_2$ oxidized Si and SiGe. The data shows a higher $H_2$% in the $H_2/O_2$ is favored for a higher Si to SiGe selectivity in the oxidation/loss.

Figure 19:
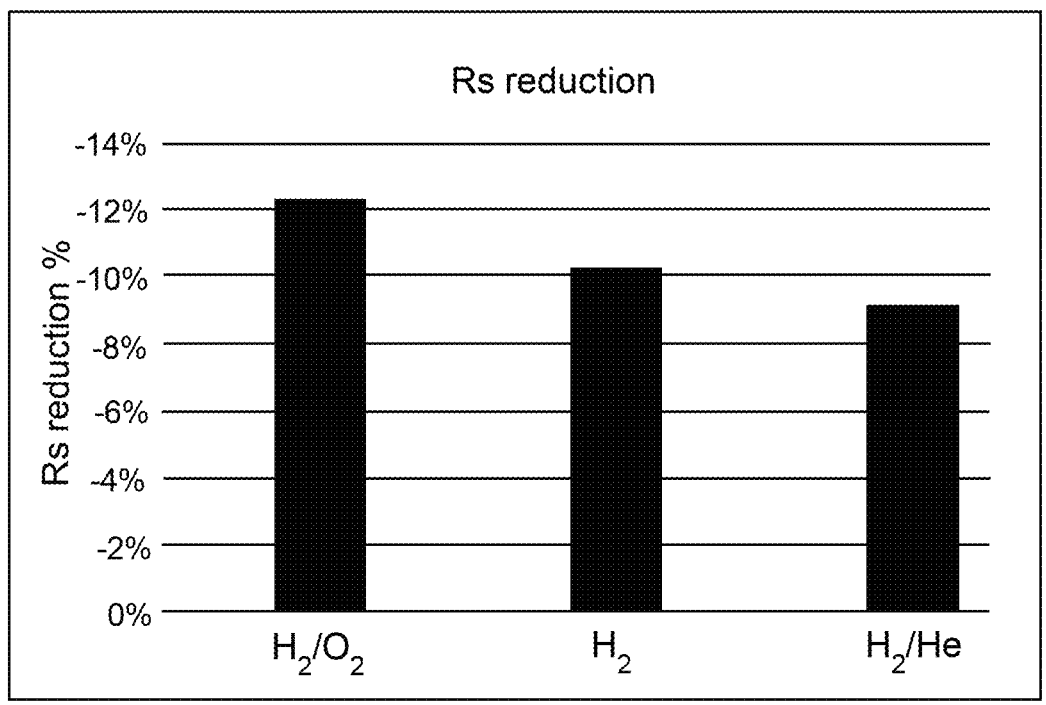
FIG. 19 depicts the resistance capacity reduction according to example embodiments of the present disclosure.

FIG. 19 depicts the enhanced Rs reduction on Cu film for an $H_2/O_2$ based remote plasma treatment process when compared to $H_2$ or $H_2/He$ chemistry. The results indicate that the oxygen doping into the $H_2$ flow can improve the treatment performance on metal.

In certain processes, selective oxidation of polysilicon and metals have been performed using high temperature annealing processes. Some of these approaches use high percentages of hydrogen gas mixed with oxygen gas in an attempt to selectively oxidize silicon with respect to metals. These approaches, however, usually require higher treatment temperatures (i.e. 600° C. to 1000° C.), which may not be desirable for certain integrated circuit manufacturing processes. For instance, high temperature processes may be undesirable as they can increase the possibility of diffusion of the metal to the adjacent layers on the workpiece and can degrade insulator layers that contain low-k materials. Furthermore, certain processes using high percentages of hydrogen gas and oxygen gas may not provide selective oxidation of silicon layers with respect to metal layers, such as cobalt. This is likely because cobalt may be easily oxidized by these processes.

Example aspects of the present disclosure are directed to processes for selective oxidation of certain silicon or silicon nitride layers over metal layers on a workpiece. Fabrication of semiconductor devices or integrated circuits can require many complex steps. As device dimensions continue to shrink, semiconductor devices may require reduced dimensions in the nanometer region and may require multi-level metallization. For instance, during fabrication of integrated circuits, a layer of metal, often cobalt, is deposited onto silicon typically to pattern the substrate surface and is then subjected to a thermal annealing process. During such integrated circuit processing, the surface metal is likely to be oxidized, which can increase the resistivity of the metal surface. Such oxidation on the metal surface can be undesirable as this can restrict the flow of electrons through the device and thereby deteriorate the operational speed of the integrated circuit. In addition, the oxidation on the metal layer, may lead to agglomeration and thus contribute to irregular growth of the metal layer. Such agglomeration and/or irregular growth of the metal layer can result in malformation of the device including mismatch of the metallic area for the source and drain electrodes.

Furthermore, certain insulators, (e.g., oxide or nitride layers), are also often needed in integrated circuits to electrically separate metal layers. Such device architecture can have a need for an oxidation approach that is selective for silicon or silicon nitride as compared to metal layers.

Accordingly, example aspects of the present disclosure are directed to methods and systems for processing workpieces that allow for selective oxidation of certain silicon or silicon nitride layers with respect to other metal layers on the structure. For example, certain embodiments provide for oxidation of silicon layers at a rate that is greater than oxidation formation on a metal layer. Furthermore, in certain embodiments, provided are methods for processing a workpiece that provide oxidation to silicon or silicon nitride layers while reducing any native oxide layer or other oxide layer present on metal layers, such as cobalt.

In some embodiments, the present disclosure is directed to a method for selectively oxidizing silicon layers that includes generating one or more species from a process gas that contains a hydrocarbon containing gas (i.e. methane CH4), and oxygen containing gas, and hydrogen. The one or more species can then be filtered to create a filtered mixture, and the filtered mixture can be exposed to the workpiece. Surprisingly, inclusion of the hydrocarbon containing gas in the process gas allows for the oxidation of silicon layers at a faster rate than on metal layers, such as cobalt.

In other embodiments, provided is a method for selectively oxidizing silicon layers that includes a two-step process including exposing the workpiece to an oxidizing process and then subjecting the workpiece to a reducing process. The oxidizing process can include generating one or more species from an oxidizing process gas that includes an oxygen containing gas. The one or more species can be filtered and exposed to the workpiece to provide an oxide layer on the silicon layers and metal layers present on the workpiece. The workpiece can then be subjected to a reducing process. The reducing process can include generating one or more species from a reducing process gas containing a hydrogen containing gas. The reducing process gas may also include an oxygen containing gas and/or a hydrocarbon containing gas. The one or more species can be filtered and exposed to the workpiece to remove the oxide layer from the metal layer at a faster rate of removal than the removal of the oxide layer from the silicon layers on the workpiece. The oxide layer present on the metal layer (i.e. cobalt) may be easily reduced by the reducing process, whereas the oxide layer on the silicon layers remains.

Example aspects of the present disclosure can provide a number of technical effects and benefits. For instance, the methods provided herein can selectively oxidize silicon layers with respect to metal layers, which can improve overall device performance. The methods provided herein also prevent the diffusion and interaction between silicon films and metal films on workpieces, which can cause the formation of a higher resistance metal silicide film. The selectively deposited oxide layer provided by the methods disclosed herein may act as a diffusion barrier between silicon layers and adjacent metal layers, thus preventing the formation of certain silicide films. The methods disclosed herein may also be utilized to repair damage of a silicon layer caused by etch processing. For example, certain silicon layers may also include an exposed metal layer. After an etch process, the silicon layer can be damaged. Accordingly, the methods provided herein can be used to repair the silicon layer while protecting the metal layer from further oxidation.

Aspects of the present disclosure are discussed with reference to an inductively coupled plasma source for purposes of illustration and discussion. Those of ordinary skill in the art, using the disclosures provided herein, will understand that any plasma source (e.g., inductively coupled plasma source, capacitively coupled plasma source, etc.) can be used without deviating from the scope of the present disclosure.

As shown in FIG. 1, the apparatus 100 can include a gas delivery system 150 configured to deliver process gas to the plasma chamber 120, for instance, via gas distribution channel 151 or other distribution system (e.g., showerhead). The gas delivery system can include a plurality of feed gas lines 159. The feed gas lines 159 can be controlled using valves and/or mass flow controllers to deliver a desired amount of gases into the plasma chamber as process gas. As shown in FIG. 1, the gas delivery system 150 can include feed gas line(s) for delivery of a hydrogen containing gas (e.g., $H_2$). The gas delivery system 150 can include feed gas line(s) for delivery of an oxygen containing gas (e.g., $O_2$). The gas delivery system can include feed gas line(s) for delivery of a hydrocarbon containing gas (i.e. methane ($CH_4$). The gas delivery system 150 can include feed gas line(s) for delivery of a dilution gas (e.g., $N_2$, Ar, He, or other inert gas).

Figure 20:
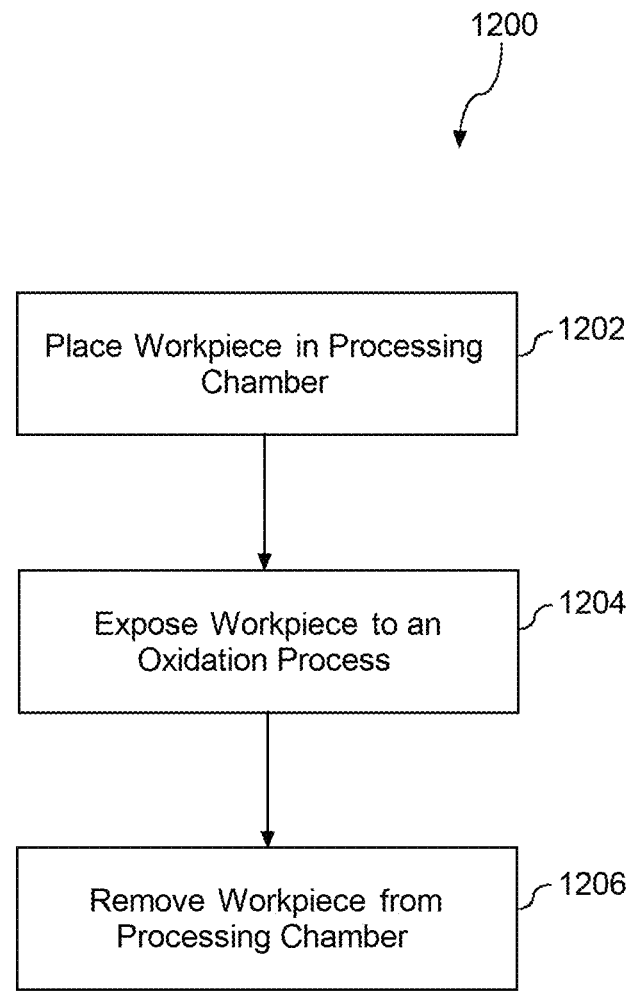
FIG. 20 depicts a flow diagram of an example method according to example embodiments of the present disclosure.

FIG. 20 depicts a flow diagram of one example method (1200) according to example aspects of the present disclosure. The method (1200) will be discussed with reference to the plasma processing apparatus 100 of FIG. 1 by way of example. The method (1200) can be implemented in any suitable plasma processing apparatus. FIG. 20 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

At (1202), the method can include placing a workpiece in a processing chamber of a plasma processing apparatus 100. The processing chamber 110 can be separated from a plasma chamber 120 (e.g., separated by a separation grid assembly). For instance, the method can include placing a workpiece 114 onto workpiece support 112 in the processing chamber 110 of FIG. 1. The workpiece may include a layer of silicon or silicon nitride and a metal layer. In certain embodiments, the workpiece includes a metal layer that comprises cobalt.

At (1204), the method can include exposing the workpiece in the processing chamber to an oxidation process. The oxidation process can include generating one or more species from a process gas in the plasma chamber, filtering the one or more species to create a filtered mixture, and exposing the workpiece to the filtered mixture. Exposure of the workpiece to the filtered mixture forms an oxide layer on the silicon layer or silicon nitride layer at a rate of formation that is greater than a rate of formation on the at least one metal layer. In certain embodiments, the metal layer may have an oxide layer thereon, thus exposing the workpiece to the filtered mixture may form an oxide layer on the already existing oxide layer on the metal layer. Still in other embodiments, exposure of the workpiece to the filtered mixture may remove a portion of the oxide layer that is present on the metal layer. In some embodiments, the metal layer may include cobalt.

The process gas used for the oxidation process may include methane ($CH_4$), hydrogen ($H_2$), oxygen ($O_2$), and mixtures thereof. For example, in certain embodiments, the gas delivery system 150 may be configured to deliver process gas to the plasma chamber 120, for instance, via gas distribution channel 151 or other distribution system (e.g., showerhead). The gas delivery system can include a plurality of feed gas lines 159. The feed gas lines 159 can be controlled using valves and/or mass flow controllers to deliver a desired amount of gases into the plasma chamber as process gas. As shown in FIG. 1, the gas delivery system 150 can include feed gas line(s) for delivery of a hydrogen-containing gas (e.g., $H_2$). The gas delivery system 150 can include feed gas line(s) for delivery of an oxygen-containing gas (e.g., $O_2$). The gas delivery system can include feed gas line(s) for delivery of a hydrocarbon containing gas (i.e. methane ($CH_4$). The gas delivery system 150 can include feed gas line(s) for delivery of a dilution gas (e.g., $N_2$, Ar, He, or other inert gas).

In some embodiments, the process gas may contain from about 0.5 to about 10 volume % of methane ($CH_4$). While not being bound by any particular theory, in certain embodiments it is believed that the inclusion of a certain amount of methane or other hydrocarbon in the process gas can selectively increase oxidation of silicon or silicon nitride surfaces at a rate that is greater than an oxidation rate of metal surfaces, such as cobalt.

In certain embodiments, the oxidation process includes generating one or more species from a process gas in the plasma chamber. To generate the one or more species, the induction coil 130 can be energized with RF power from the RF power generator 134, to generate a plasma from the process gas in the plasma chamber. The plasma generated can include one or more species including hydrogen radicals, oxygen radicals, methane radicals, and combinations thereof.

The oxidation process can include filtering the one or more species to create a filtered mixture. To create a filtered mixture, in some embodiments, the one or more species can be filtered via a separation grid 200 that separates the plasma chamber 120 from the processing chamber. The separation grid 200 can be used to perform ion filtering from a mixture generated by plasma in the plasma chamber 120 to generate a filtered mixture.

The filtered mixture can be exposed to the workpiece 114 in the processing chamber. Exposure of the workpiece 114 to the filtered mixture can form an oxide layer on the silicon or silicon nitride layers on the workpiece at a rate that is faster than forming an oxide layer on the cobalt layer(s) of the workpiece. In some embodiments, exposure of the workpiece 114 to the filtered mixture may form an oxide layer on silicon or silicon nitride layers while removing at least a portion of the oxide layer that may be present on a metal layer, such as cobalt. In some embodiments, the rate of formation of the oxide layer on at least one metal layer on the workpiece is zero, meaning that no additional oxide layer is formed on the metal layer during exposure to the filtered mixture. In certain embodiments, rate of formation of the oxide layer on the silicon layer is at least five (5) times greater than the rate of formation of an oxide layer on the at least one metal layer.

In some embodiments, the workpiece is at a process temperature when exposed to the filtered mixture. For example, in some embodiments, the process temperature may be equal to or less than about 160° C. In some embodiments, the process temperature may be from about 90° C. to about 160° C. Without being bound by any particular theory, maintaining or utilizing the disclosed process temperatures herein may lead to increased oxidation selectivity for silicon or silicon nitride as compared to other metal layers on the workpiece, such as cobalt. For example, utilizing higher process temperatures (i.e. those above 160° C.) may lead to an increase of oxidation on the metal layers, which is not desirable.

In certain embodiments, the workpiece is at a process pressure when exposed to the filtered mixture. In some embodiments, the process pressure is from about 100 mT to about 5000 mT.

In certain embodiments, the workpiece may be exposed to the filtered mixture for a certain process time. In some embodiments, the process time may be from about 30 sec to about 1800 sec.

At (1206) the method can include removing the workpiece from the processing chamber. For instance, the workpiece 114 can be removed from workpiece support 112 in the processing chamber 110. The plasma processing apparatus can then be conditioned for future processing of additional workpieces.

Example process parameters for the methods disclosed herein will now be set forth.

Example 3

Figure 21:
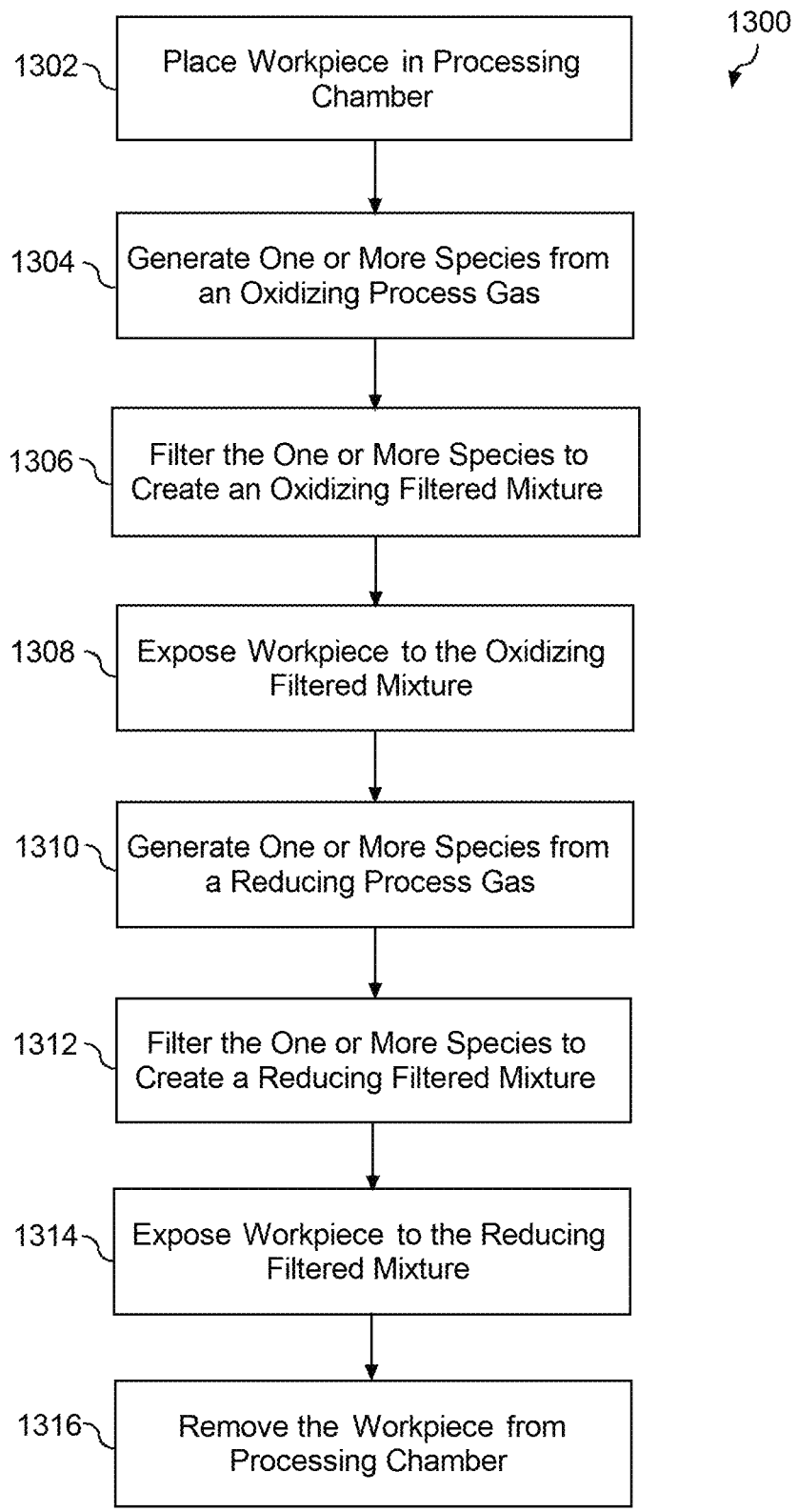
FIG. 21 depicts a flow diagram of an example method according to example embodiments of the present disclosure.

Process Gas: $O_2$, $CH_4$
Dilution Gas: $H_2$
Process Pressure: 100 mT to 5000 mT
Inductively Coupled Plasma Source Power: 1000 W to 5000 W
Workpiece Temperature: 25 C to 200 C
Process Period (time): 30 sec to 1800 sec
Gas Flow Rates for Process Gas:
$O_2$: 10 sccm to 2000 sccm
$CH_4$: 10 sccm to 2000 sccm
$H_2$: 2000 sccm to 20000 sccm FIG. 21 depicts a flow diagram of one example method (1300) according to example aspects of the present disclosure. The method (1300) will be discussed with reference to the plasma processing apparatus 100 of FIG. 1 by way of example. The method (1300) can be implemented in any suitable plasma processing apparatus. FIG. 21 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

At (1302) the method can include placing a workpiece in a processing chamber of a plasma processing apparatus 100. The processing chamber 110 can be separated from a plasma chamber 120 (e.g., separated by a separation grid assembly). For instance, the method can include placing a workpiece 114 onto workpiece support 112 in the processing chamber 110 of FIG. 1. The workpiece may include a layer of silicon or silicon nitride and a metal layer. In certain embodiments, the workpiece includes a metal layer that comprises cobalt.

At (1304) the method includes generating one or more species from an oxidizing process gas. In some embodiments, the oxidizing process gas comprises an oxygen containing gas. In some embodiments, the oxygen containing gas includes oxygen ($O_2$). The oxygen containing gas may include oxygen ($O_2$), ozone ($O_3$), water ($H_2O$), carbon dioxide ($CO_2$), carbon monoxide (CO), nitrogen dioxide ($NO_2$), nitric oxide (NO), and combinations thereof. The oxidizing process gas may include a hydrogen containing gas. The hydrogen containing gas may include hydrogen ($H_2$), water ($H_2O$), ammonia ($NH_3$), and combinations thereof. In some embodiments, the oxidizing process gas includes hydrogen ($H_2$). The oxidizing process gas may be admitted to the plasma chamber via any suitable introduction mechanism. In some embodiments, the process gas may be admitted to the plasma chamber 120 via gas distribution channel 151 or other distribution system (e.g., showerhead).

In certain embodiments, the oxidation process gas may include an oxygen containing gas. In certain embodiments, the gas delivery system 150 may be configured to deliver oxidation process gas to the plasma chamber 120, for instance, via gas distribution channel 151 or other distribution system (e.g., showerhead). The gas delivery system can include a plurality of feed gas lines 159. The feed gas lines 159 can be controlled using valves and/or mass flow controllers to deliver a desired amount of gases into the plasma chamber as process gas. As shown in FIG. 1, the gas delivery system 150 can include feed gas line(s) for delivery of an oxygen-containing gas (e.g., $O_2$). The gas delivery system 150 can include feed gas line(s) for delivery of a dilution gas (e.g., N2, Ar, He, or other inert gas).

In some embodiments, one or more species can be generated from the oxidizing process gas via utilization of the induction coil 130. The induction coil 130 can be energized with RF power from the RF power generator 134, to generate a plasma from the process gas in the plasma chamber. The plasma generated in the plasma chamber can include one or more species, such as hydrogen radicals, oxygen radicals, and combinations thereof.

At (1306) the method can include filtering the one or more species to create an oxidizing filtered mixture. The one or more species can be filtered via a separation grid 200 that separates the plasma chamber 120 from the processing chamber. The separation grid 200 can be used to perform ion filtering from a mixture generated by plasma in the plasma chamber 120 to generate an oxidizing filtered mixture.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

At (1308) the method includes exposing the workpiece to the oxidizing filtered mixture in the processing chamber. Exposure of the workpiece 114 to the oxidizing filtered mixture can form an oxide layer on both the silicon layers and metal layers present on the workpiece. For example, in some embodiments, exposure of the workpiece 114 to the oxidizing filtered mixture can form an oxide layer on the silicon or silicon nitride layers on the workpiece at a rate that is faster than the rate of formation of an oxide layer on the metal layer (i.e. cobalt layer) of the workpiece. In some embodiments, exposing the workpiece 114 to the oxidizing filtered mixture forms an oxide layer on at least one silicon layer and forms an oxide layer on at least one metal layer. In certain embodiments, exposing the workpiece 114 to the oxidizing filtered mixture forms an oxide layer on at least one silicon layer at a first rate and forms an oxide layer on at least one metal layer at a second rate. In these embodiments, the first rate may be faster or greater than the second rate. In certain embodiments, the first rate may be at least five times greater than the second rate.

At (1310) the method includes generating one or more species from a reducing process gas. In some embodiments, the reducing process gas comprises a hydrogen containing gas. In some embodiments the hydrogen containing gas includes methane ($CH_4$), hydrogen ($H_2$), and mixtures thereof. In certain embodiments, the reducing process gas comprises an oxygen containing gas. In some embodiments, the oxygen containing gas includes oxygen (O2). The oxygen containing gas may include oxygen ($O_2$), ozone ($O_3$), water ($H_2O$), carbon dioxide ($CO_2$), carbon monoxide (CO), nitrogen dioxide ($NO_2$), nitric oxide (NO), and combinations thereof. In certain embodiments, the reducing process gas may include one or more diluent or carrier gases, such as helium, argon, and mixtures thereof. The reducing process gas may be admitted to the plasma chamber via any suitable introduction mechanism. In some embodiments, the reducing process gas may be admitted to the plasma chamber 120 via gas distribution channel 151 or other distribution system (e.g., showerhead).

In certain embodiments, the reducing process gas may include a hydrogen containing gas. In certain embodiments, the gas delivery system 150 may be configured to deliver reducing process gas to the plasma chamber 120, for instance, via gas distribution channel 151 or other distribution system (e.g., showerhead). The gas delivery system can include a plurality of feed gas lines 159. The feed gas lines 159 can be controlled using valves and/or mass flow controllers to deliver a desired amount of gases into the plasma chamber as process gas. As shown in FIG. 1, the gas delivery system 150 can include feed gas line(s) for delivery of a hydrogen containing gas (e.g., $H_2$ or $CH_4$). The gas delivery system 150 can include feed gas line(s) for delivery of a dilution gas (e.g., $N_2$, Ar, He, or other inert gas).

In some embodiments, one or more species can be generated from the reducing process gas via utilization of the induction coil 130. The induction coil 130 can be energized with RF power from the RF power generator 134, to generate a plasma from the reducing process gas in the plasma chamber. The plasma generated in the plasma chamber can include one or more species, such as hydrogen radicals, oxygen radicals, and combinations thereof.

At (1312) the method can include filtering the one or more species to create a reducing filtered mixture. The one or more species can be filtered via a separation grid 200 that separates the plasma chamber 120 from the processing chamber. The separation grid 200 can be used to perform ion filtering from a mixture generated by plasma in the plasma chamber 120 to generate a reducing filtered mixture.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

At (1314) the method includes exposing the workpiece to the reducing filtered mixture in the processing chamber. Exposure of the workpiece 114 to the reducing filtered mixture may remove at least a portion of the oxide layer from the silicon layer and the metal layer present on the workpiece. In certain embodiments, exposure of the workpiece to the reducing filtered mixture may remove at least a portion of an oxide layer from the metal layer at a rate that is faster than the rate of removal of at least a portion of the oxide layer from the silicon or silicon nitride layer. For example, in certain embodiments, exposure of the workpiece 114 to the reducing filtered mixture etches an oxide surface layer on the metal layer (such as cobalt) at a faster rate than the etch rate for an oxide surface layer on one or more silicon layers. Accordingly, exposure of the workpiece to the reducing filtered mixture can selectively etch oxide layers from metal layers on the workpiece as compared to silicon layers on the workpiece. In some embodiments, the reducing filtered mixture removes an oxide surface layer from the metal layer at a first etch rate and removes an oxide surface layer from the silicon layer at a second etch rate. In certain embodiments, the first etch rate is faster than the second etch rate. In some embodiments, the first etch rate is at least five times faster than the second etch rate. The workpiece 114 can be exposed to the reducing filtered mixture for a certain period of time to achieve the desired rate or amount of etch for the oxide layers.

In some embodiments, the workpiece is at a process temperature when exposed to the oxidizing or reducing filtered mixture. For example, the process temperature may be maintained to be at or below 160° C. In some embodiments, the process temperature may be from about 90° C. to about 160° C. Without being bound by any particular theory, maintaining or utilizing the disclosed process temperatures herein may lead to increased oxidation selectivity for silicon or silicon nitride as compared to other metal layers on the workpiece, such as cobalt. For example, utilizing higher process temperatures (i.e. those above 160° C.) may lead to an increase of oxidation on the metal layers, which is not desirable. In certain embodiments, the method (1300) includes an oxidizing process, wherein the process temperature for the oxidizing process is from about 90° C. to about 160° C. In certain embodiments, the method (1300) includes an oxidizing process, wherein the process temperature for the reducing process is from about 90° C. to about 160° C. In certain embodiments, the process temperature for the oxidizing process may be the same or different from the process temperature for the reducing process.

In certain embodiments, the workpiece is at a process pressure when exposed to the oxidizing or reducing filtered mixture. In some embodiments, the process pressure is from about 100 mT to 2000 mT.

In certain embodiments, the method (1300) can be conducted for a certain process time from 30 sec to 1800 sec. In certain embodiments, the workpiece may be exposed to the oxidizing filtered mixture for a certain process time of from about 30 sec to about 600 sec. In certain embodiments, the workpiece may be exposed to the reducing filtered mixture for a certain process time of from about 30 sec to about 3600 sec.

At (1316) the method can include removing the workpiece from the processing chamber. For instance, the workpiece 114 can be removed from workpiece support 112 in the processing chamber 110. The plasma processing apparatus can then be conditioned for future processing of additional workpieces.

Example process parameters for the oxidizing process will now be set forth.

Example 4

Process Gas: $O_2$
Process Pressure: 100 mT to 8000 mT
Inductively Coupled Plasma Source Power 500 W to 5000 W
Workpiece Temperature: 25 C to 400 C
Process Period (time): 30 see to 600 sec
Gas Flow Rates for Process Gas:
Gas 1: 100 sccm to 20000 sccm Example process parameters for the reducing process will now be set forth.

Example 5

Figure 22:
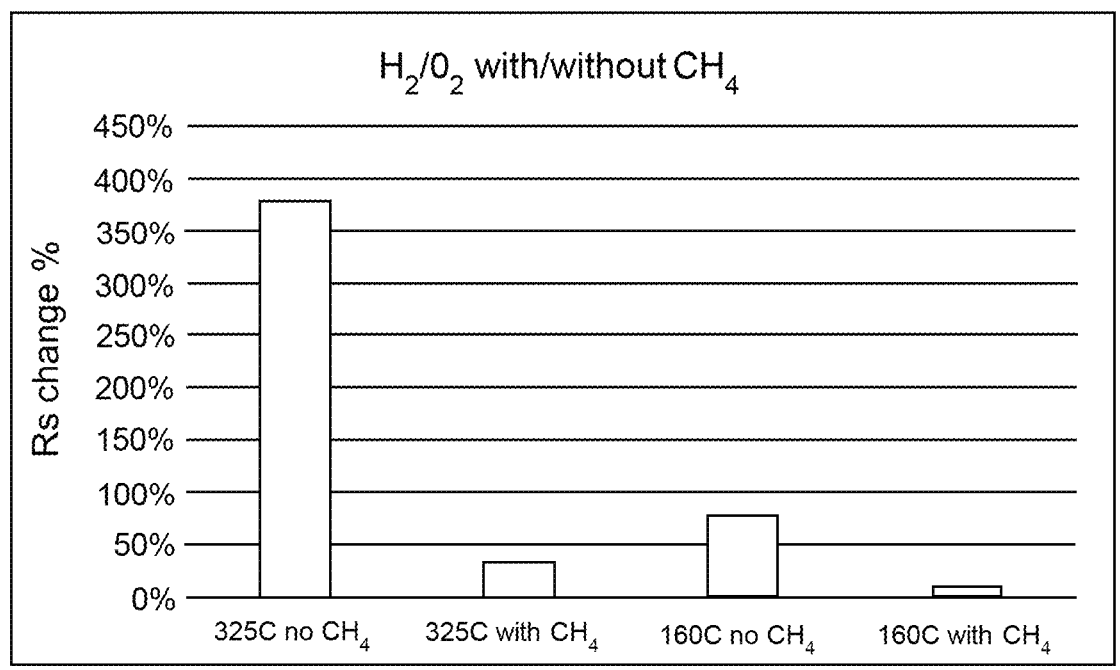
FIG. 22 depicts an effect of adding $CH_4$ to the process gas according to example embodiments of the present disclosure.

Process Gas: $H_2$
Dilution Gas: He or Ar
Process Pressure: 100 mT to 8000 mT
Inductively Coupled Plasma Source Power 300 W to 5000 W
Workpiece Temperature: 25 C to 400 C
Process Period (time): 30 sec to 3600 sec
Gas Flow Rates for Process Gas:
$H_2$: 100 sccm to 20000 sccm
He or Ar: 0 sccm to 20000 sccm FIG. 22 depicts the effect of adding methane ($CH_4$) to the process gas to slow or prevent oxidation of cobalt. The vertical axis provides Rs change % and the horizontal axis shows the type of cobalt tested with and without $CH_4$. As shown, the rate of oxidation for cobalt is much lower when methane ($CH_4$) has been added to the gas flow.

Figure 23:
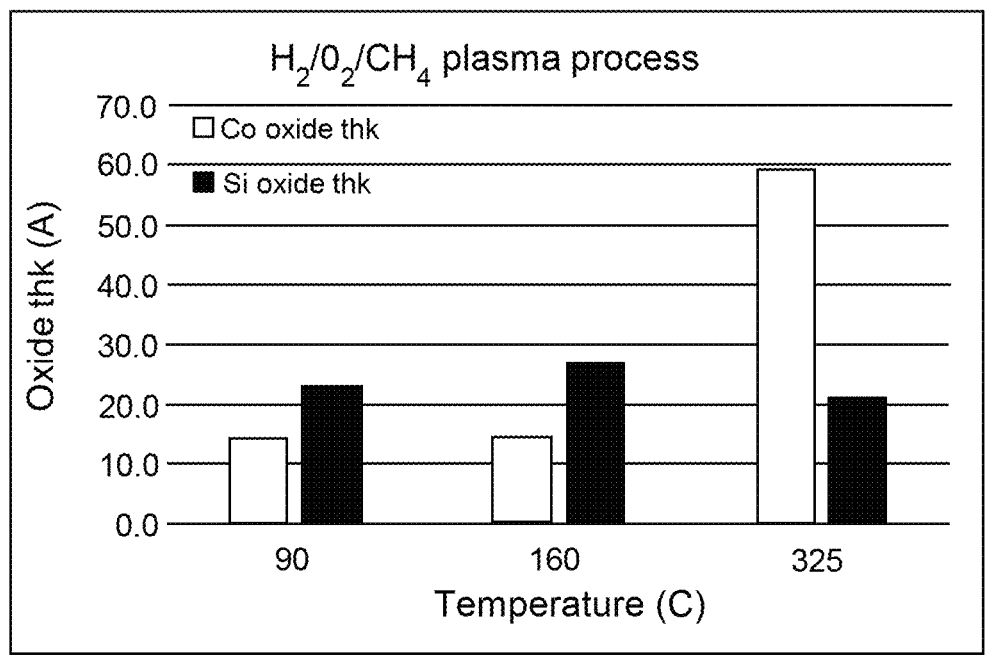
FIG. 23 depicts the effect of temperature on the oxidation of cobalt and silicon when exposed to a plasma process according to example embodiments of present disclosure.

FIG. 23 depicts the effect of temperature on the oxidation of cobalt and silicon when exposed to a plasma process containing methane ($CH_4$), oxygen ($O_2$), and hydrogen ($H_2$). The vertical axis provides oxide thickness in (Å) and the temperature is provided on the horizontal axis. As shown, at temperatures less than 160° C., the cobalt layer exhibited lower oxide thickness. The cobalt layer exposed to the plasma process at a temperature of 325° C. exhibited much higher oxidation as compared to the silicon layer exposed at 325° C., and the other two cobalt layers exposed to 90° C. and 160° C., respectively.

Figure 24:
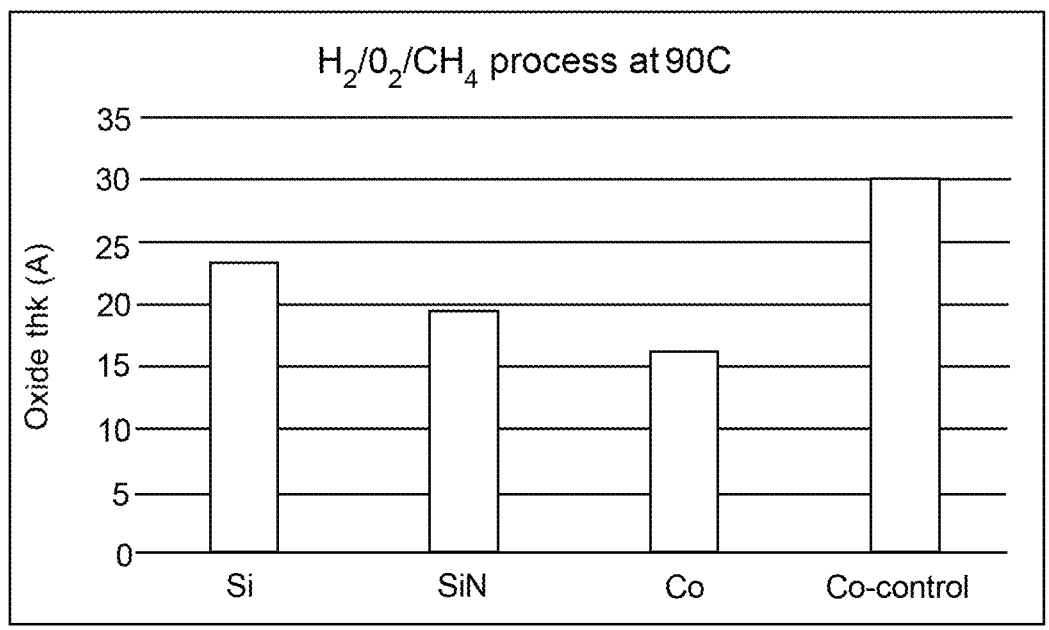
FIG. 24 depicts the comparison of oxide thickness on silicon, silicon nitride, and cobalt post exposure to a plasma process at a temperature of 90° C. according to example embodiments of the present disclosure.

FIG. 24 depicts the comparison of oxygen (or oxide) thickness on silicon, silicon nitride, and cobalt post exposure to a hydrogen ($H_2$), oxygen ($O_2$), and methane ($CH_4$) process at a temperature of 90° C. The vertical axis depicts oxide thickness in (Å), while the horizontal axis depicts the material type of layer (i.e. silicon, silicon nitride, cobalt, and a control). The Co-control corresponds to a cobalt control layer that was not exposed to any process. As shown, the oxide thickness is greater on the silicon and silicon nitride layers as compared to the cobalt layer. Further, the oxide thickness on the cobalt layer exposed to the plasma process is less than that of the cobalt control layer that was not exposed to the plasma process, thus, indicating that the plasma process can remove oxide layer (including native oxide layer) from the cobalt layer.

Plasma processing systems have been employed widely to process substrates to form integrated circuits or other electronic product, in particular radicals generated by a plasma system may be useful for metal treatment processes for the benefits of enhancing grain growth, contamination removal, metal reflow, surface passivation, etc. Plasma processing systems can generate a remote plasma in a plasma chamber that is then exposed to a workpiece in a separate downstream processing chamber. Often, such plasma generation devices are not capable of selective metal anneal due to the fact that insufficient temperature is generated by the plasma in the processing chamber. Further, attempts to heat the plasma with a downstream hot gas have also not yielded selective metal annealing. Other attempts to, such as differentiated heat coupling, are not selective for annealing metal films or layers on the workpiece as opposed to other materials. Accordingly, a need remains for methods for selectively annealing metal layers on a workpiece using plasma.

Example aspects of the present disclosure are directed to methods and systems for conducting an annealing treatment process on a workpiece for selective annealing of the metal layers thereon. Specifically, the method can be implemented on a processing apparatus having a plasma chamber and a processing chamber. The method includes placing the workpiece on a workpiece support in the processing chamber and exposing the workpiece to radicals in the processing chamber to heat one or more metal layers on a workpiece to a temperature of 800° C. or more.

Example aspects of the present disclosure can provide a number of technical effects and benefits. For instance, the methods provided herein can selectively anneal metal layers on a workpiece, which can improve overall device performance. The methods provided herein also allow for the annealing of metal layers on a workpiece in a plasma processing apparatus, which prevents the need for utilizing other devices, such as thermal devices. For example, the ability to anneal metal layers using a plasma processing apparatus can allow for multiple treatments to be performed on the workpiece in the processing chamber without having to remove the workpiece from the processing chamber. Such a method reduces fabrication time and waste.

Aspects of the present disclosure are discussed with reference to an inductively coupled plasma source for purposes of illustration and discussion. Those of ordinary skill in the art, using the disclosures provided herein, will understand that any plasma source (e.g., inductively coupled plasma source, capacitively coupled plasma source, etc.) can be used without deviating from the scope of the present disclosure. For example, the methods provided herein can be implemented via the apparatus 100 of FIG. 1 or the apparatus 500 of FIG. 2 or apparatus 600 of FIG. 3 by way of example.

Figure 25:
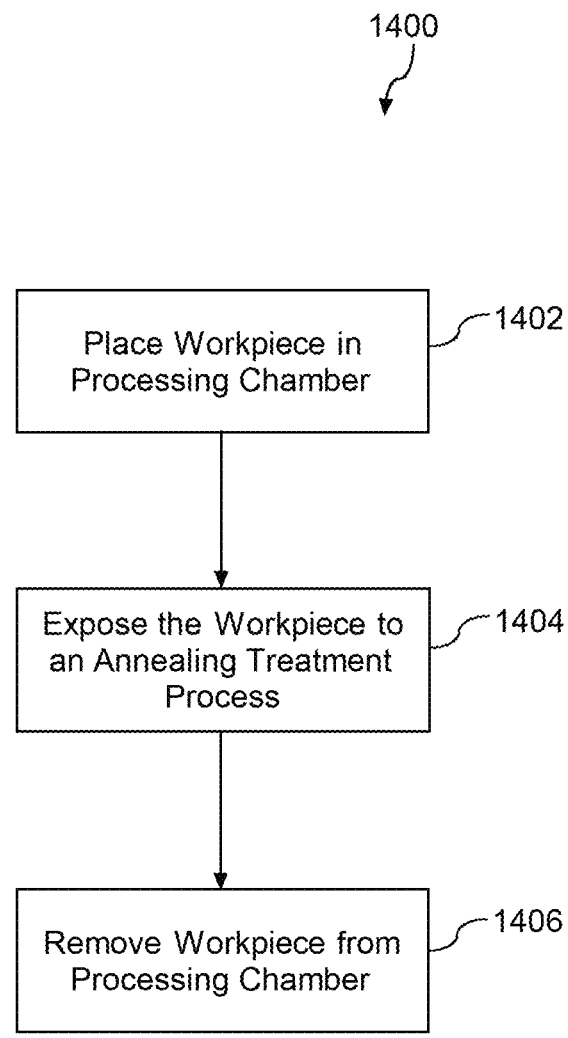
FIG. 25 depicts a flow diagram of an example method according to example embodiments of the present disclosure.

FIG. 25 depicts a flow diagram of one example method (1400) according to example aspects of the present disclosure. The method (1400) will be discussed with reference to the plasma processing apparatus 100 of FIG. 1 by way of example. The method (1400) can be implemented in any suitable plasma processing apparatus. FIG. 25 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

At (1402), the method can include placing a workpiece in a processing chamber of a plasma processing apparatus 100. The processing chamber 110 can be separated from a plasma chamber 120 (e.g., separated by a separation grid assembly). For instance, the method can include placing a workpiece 114 onto workpiece support 112 in the processing chamber 110 of FIG. 1. The workpiece may include a metal layer, a silicon layer, or both. In certain embodiments, the workpiece includes a metal layer that comprises copper, tungsten, cobalt, ruthenium, or combinations thereof.

At (1404), the method can include exposing the workpiece in the processing chamber to an annealing treatment process. The annealing treatment process can include exposing the workpiece to one or more radicals in the processing chamber to heat the metal layer on the workpiece to a temperature of 800° C. or more. Exposure of the workpiece to one or more radicals heats the metal layer sufficiently, such that annealing takes place. The annealing treatment process can include generating one or more species from a process gas in the plasma chamber; filtering the one or more species to create a filtered mixture containing one or more radicals, and exposing the workpiece to the radicals to heat the metal layer on the workpiece.

The process gas used for the annealing treatment process may include a hydrogen-containing gas ($H_2$), an oxygen-containing gas ($O_2$), or combinations thereof. For example, in certain embodiments, the gas delivery system 150 may be configured to deliver process gas to the plasma chamber 120, for instance, via gas distribution channel 151 or other distribution system (e.g., showerhead). The gas delivery system can include a plurality of feed gas lines 159. The feed gas lines 159 can be controlled using valves and/or mass flow controllers to deliver a desired amount of gases into the plasma chamber as process gas. As shown in FIG. 1, the gas delivery system 150 can include feed gas line(s) for delivery of a hydrogen-containing gas (e.g., $H_2$). The gas delivery system 150 can include feed gas line(s) for delivery of an oxygen-containing gas (e.g., $O_2$). The gas delivery system 150 can include feed gas line(s) for delivery of a dilution gas (e.g., $N_2$, Ar, He, or other inert gas).

In some embodiments, the process gas may contain from about 10% by volume to about 95% by volume of a hydrogen-containing gas ($H_2$). In embodiments, the process gas may contain from about 85% to about 99% by volume of a hydrogen-containing gas ($H_2$). While not being bound by any particular theory, in certain embodiments it is believed that the inclusion of a certain amount of hydrogen in the process gas, can selectively increase the temperature of the metal layer on the workpiece.

In certain embodiments, the annealing treatment process includes generating one or more species from a process gas in the plasma chamber. To generate the one or more species, the induction coil 130 can be energized with RF power from the RF power generator 134, to generate a plasma from the process gas in the plasma chamber. The plasma generated can include one or more species including hydrogen radicals, oxygen radicals, and combinations thereof.

The annealing treatment process can include filtering the one or more species to create a filtered mixture. To create a filtered mixture, in some embodiments, the one or more species can be filtered via a separation grid 200 that separates the plasma chamber 120 from the processing chamber. The separation grid 200 can be used to perform ion filtering from a mixture generated by plasma in the plasma chamber 120 to generate a filtered mixture. The filtered mixture can include hydrogen radicals, oxygen radicals, and combinations thereof.

The filtered mixture can be exposed to the workpiece 114 in the processing chamber. Exposure of the workpiece 114 to the filtered mixture can heat the metal layer to an annealing temperature of 400° C. or greater to selectively anneal the metal layer.

In some embodiments, the workpiece is at a process pressure when exposed to the filtered mixture. For example, in some embodiments, the process pressure may be from about 400 mT to about 1000 mT. Without being bound by any particular theory, maintaining or utilizing the disclosed process pressures herein may lead to increased selectivity for heating the metal layer with respect to other material layers, such as dielectric material layers, on the workpiece. For example, utilization of a process pressure greater than 1100 mT can negatively affect the annealing temperature of the metal layer, which is not desirable.

In certain embodiments, exposing the workpiece to the radicals can generate an annealing temperature of the metal layer of the workpiece of at least 400° C., such as at least 500° C., such as at least 600° C., such as at least 700° C., such as at least 800° C., such as at least 9000° C., such as at least, 1,00° C. Advantageously, the provided methods allow for metal layers on the workpiece to reach very high temperatures, sufficient for annealing to take place, without substantially raising the temperature of other material layers on the workpiece.

In certain embodiments, the workpiece may be exposed to the filtered mixture for a certain process time. In some embodiments, the process time may be from about 30 sec to about 1800 sec., such as from about 30 sec. to about 1200 sec.

At (1406) the method can include removing the workpiece from the processing chamber. For instance, the workpiece 114 can be removed from workpiece support 112 in the processing chamber 110. The plasma processing apparatus can then be conditioned for future processing of additional workpieces.

Figure 26:
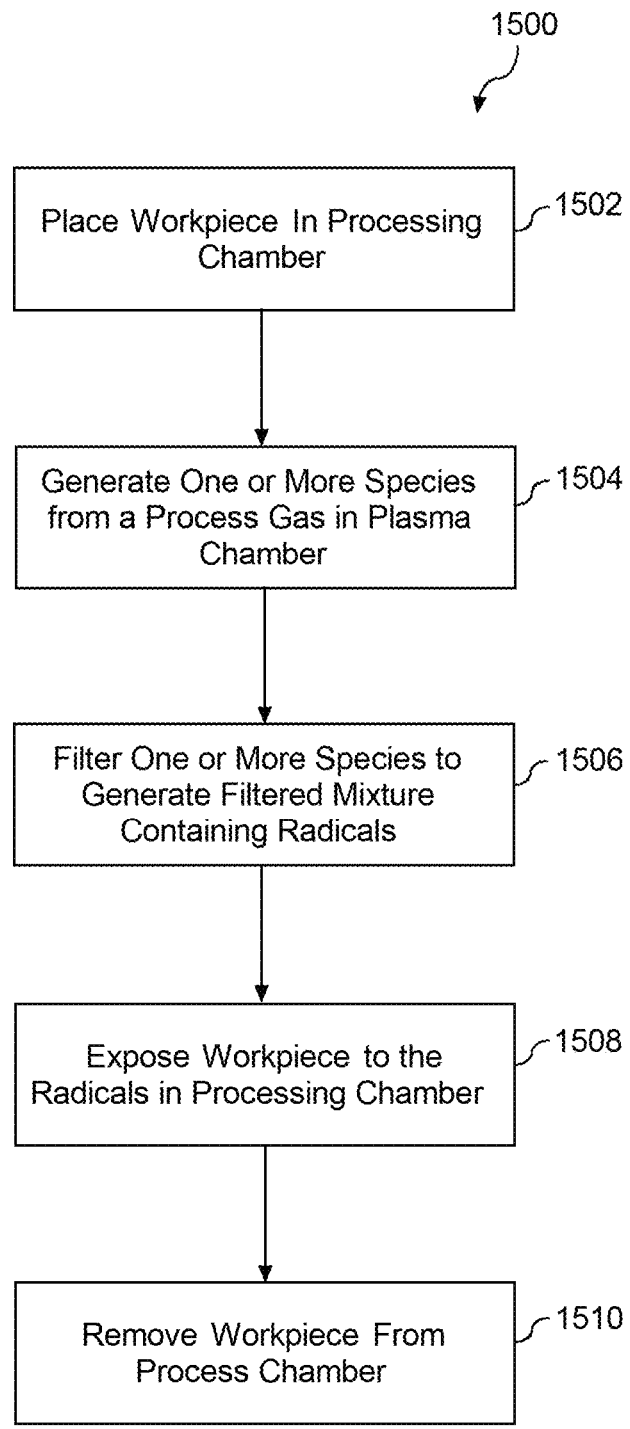
FIG. 26 depicts a flow diagram of an example method according to example embodiments of the present disclosure.

FIG. 26 depicts a flow diagram of one example method (1500) according to example aspects of the present disclosure. The method (1500) will be discussed with reference to the plasma processing apparatus 100 of FIG. 1 by way of example. The method (1500) can be implemented in any suitable plasma processing apparatus. FIG. 26 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

At (1502) the method can include placing a workpiece in a processing chamber of a plasma processing apparatus 100. The processing chamber 110 can be separated from a plasma chamber 120 (e.g., separated by a separation grid assembly). For instance, the method can include placing a workpiece 114 onto workpiece support 112 in the processing chamber 110 of FIG. 1. The workpiece may include a metal layer, a silicon layer, or both. In certain embodiments, the workpiece includes a metal layer that comprises copper, tungsten, cobalt, ruthenium, or combinations thereof.

At (1504) the method includes generating one or more species from a process gas in the plasma chamber. In some embodiments, the process gas comprises a hydrogen-containing gas ($H_2$), an oxygen-containing gas ($O_2$), or combinations thereof. For example, in certain embodiments, the gas delivery system 150 may be configured to deliver process gas to the plasma chamber 120, for instance, via gas distribution channel 151 or other distribution system (e.g., showerhead). The gas delivery system can include a plurality of feed gas lines 159. The feed gas lines 159 can be controlled using valves and/or mass flow controllers to deliver a desired amount of gases into the plasma chamber as process gas. As shown in FIG. 1, the gas delivery system 150 can include feed gas line(s) for delivery of a hydrogen-containing gas (e.g., $H_2$). The gas delivery system 150 can include feed gas line(s) for delivery of an oxygen-containing gas (e.g., $O_2$). The gas delivery system 150 can include feed gas line(s) for delivery of a dilution gas (e.g., $N_2$, Ar, He, or other inert gas).

In some embodiments, the process gas may contain from about 10% by volume to about 95% by volume of a hydrogen-containing gas ($H_2$). In embodiments, the process gas may contain from about 85% to about 99% by volume of a hydrogen-containing gas ($H_2$). While not being bound by any particular theory, in certain embodiments it is believed that the inclusion of a certain amount of hydrogen in the process gas, can selectively increase the temperature of the metal layer on the workpiece.

In some embodiments, one or more species can be generated from the process gas via utilization of the induction coil 130. The induction coil 130 can be energized with RF power from the RF power generator 134, to generate a plasma from the process gas in the plasma chamber. The plasma generated in the plasma chamber can include one or more species.

At (1506) the method can include filtering the one or more species to create a filtered mixture, containing radicals. In embodiments, the filtered mixture can include hydrogen radicals, oxygen radicals, or combinations thereof. The one or more species can be filtered via a separation grid 200 that separates the plasma chamber 120 from the processing chamber. The separation grid 200 can be used to perform ion filtering from a mixture generated by plasma in the plasma chamber 120 to generate an oxidizing filtered mixture.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

At (1508) the method includes exposing the workpiece to the filtered mixture containing hydrogen radicals and, optionally oxygen radicals, in the processing chamber. Exposure of the workpiece 114 to the filtered mixture can selectively heat the metal layer of the workpiece to an annealing temperature of 400° C. or greater. For example, in some embodiments, exposure of the workpiece 114 to the filtered mixture can selectively heat the metal layer to a desired annealing temperature.

In certain embodiments, exposing the workpiece to the filtered mixture containing hydrogen radicals modifies a surface morphology of the metal layer. For example, in certain embodiments the metal layer comprises tungsten disposed on a silicon substrate. Exposing the workpiece to the filtered mixture in the processing chamber forms a layer of tungsten disilicide on the metal layer.

In some embodiments, the workpiece is at a process pressure when exposed to the filtered mixture. For example, in some embodiments, the process pressure may be from about 400 mT to about 1000 mT. Without being bound by any particular theory, maintaining or utilizing the disclosed process pressures herein may lead to increased selectivity for heating the metal layer with respect to other material layers, such as dielectric material layers, on the workpiece. For example, utilization of a process pressure greater than 1100 mT can negatively affect the annealing temperature of the metal layer, which is not desirable.

In certain embodiments, exposing the workpiece to the radicals can generate an annealing temperature of the workpiece of at least 400° C., such as at least 500° C., such as at least 600° C., such as at least 700° C., such as at least 800° C., such as at least 900° C., such as at least, 1,000° C. Advantageously, the provided methods allow for metal layers on the workpiece to reach very high temperatures, sufficient for annealing to take place, without substantially raising the temperature of other material layers on the workpiece.

In certain embodiments, the workpiece may be exposed to the filtered mixture for a certain process time. In some embodiments, the process time may be from about 30 sec to about 1800 sec, such as from about 30 sec to about 1200 sec.

At (1510) the method can include removing the workpiece from the processing chamber. For instance, the workpiece 114 can be removed from workpiece support 112 in the processing chamber 110. The plasma processing apparatus can then be conditioned for future processing of additional workpieces.

Example process parameters for the annealing treatment process will now be set forth.

Example 6

Process Gas: $H_2$ and $O_2$
Dilution Gas: He or Ar
Process Pressure: 10 mT to 2000 mT
Inductively Coupled Plasma Source Power: 1000 W to 5000 W
Workpiece Temperature: 40° C. to 400° C.
Process Period (time): 30 sec to 1200 sec
Gas Flow Rates for Process Gas:
$O_2$: 0 sccm to 2000 sccm
$H_2$: 200 sccm to 20,000 sccm
Gas 3: 0 sccm to 20,000 sccm Further aspects of the invention are provided by the subject matter of the following clauses:

A method for conducting a thermal treatment process on a workpiece in a processing apparatus, the processing apparatus comprising a plasma chamber and a processing chamber, wherein the plasma chamber and the processing chamber are separated by a plurality of separation grids, the separation grids operable to filter ions generated in the plasma chamber, and the processing chamber having a workpiece support operable to support a workpiece. The method comprising: placing the workpiece on the workpiece support in the processing chamber; heating a layer on the workpiece at a temperature of about 500° C. or less; exposing the workpiece to radicals in the processing chamber, and the radicals being generated in the plasma chamber.

The method of any preceding clause, wherein the radicals comprise hydrogen radicals generated in the plasma chamber.

The method of any preceding clause, wherein the hydrogen radicals are generated by inducing a plasma in a process gas mixture using an inductively coupled plasma source, and the process gas mixture comprising from about 10% to about 100% by volume of a hydrogen containing gas.

The method of any preceding clause, wherein the process gas mixture comprising helium, nitrogen, argon or oxygen.

The method of any preceding clause, further wherein the workpiece comprising silicon or silicon germanium and hydrogen diffuses through the layer on the workpiece to the silicon and silicon germanium in the workpiece.

The method of any preceding clause, wherein the radicals comprise deuterium radicals generated in the plasma chamber.

The method of any preceding clause, wherein the deuterium radicals are generated by inducing a plasma in a process gas mixture using an inductively coupled plasma source, and the process gas mixture comprising from about 10% to about 100% by volume of a deuterium containing gas.

The method of any preceding clause, further wherein the workpiece comprising silicon or silicon germanium and deuterium diffuses through the layer on the workpiece to the silicon and silicon germanium in the workpiece.

The method of any preceding clause, further wherein the thermal treatment process cleans surface of the layer on the workpiece.

The method of any preceding clause, further wherein the layer on the workpiece is a metal layer, and comprises cobalt, copper, tungsten, tantalum, or ruthenium.

The method of any preceding clause, wherein the thermal treatment process reduces a resistance capacity of the metal layer.

The method of any preceding clause, wherein the thermal treatment process removes one or more impurities from the metal layer.

The method of any preceding clause, wherein the thermal treatment process modifies grain of the metal layer.

The method of any preceding clause, wherein the metal layer is deposited on a patterned structure on the workpiece, and the thermal treatment process modifies morphology of the metal layer.

The method of any preceding clause, wherein the thermal treatment process reduces at least a portion of oxygen concentration on surface of the metal layer.

The method of any preceding clause, wherein the thermal treatment process reduces at least a portion of nitrogen concentration on surface of the metal layer.

The method of any preceding clause, wherein the thermal treatment process reduces at least a portion of fluorine concentration on surface of the metal layer.

The method of any preceding clause, wherein the radicals comprise oxygen radicals generated in the plasma chamber.

The method of any preceding clause, wherein the oxygen radicals are generated by inducing a plasma in a process gas mixture using an inductively coupled plasma source, and the process gas mixture comprising from about 10% to about 100% by volume of an oxygen containing gas.

A method for conducting a thermal treatment process on a workpiece in a processing apparatus, the processing apparatus comprising a plasma chamber and a processing chamber, wherein the plasma chamber and the processing chamber are separated by a plurality of separation grids, the separation grids operable to filter ions generated in the plasma chamber, and the processing chamber having a workpiece support operable to support a workpiece, the method comprising: placing the workpiece on the workpiece support in the processing chamber; heating a metal layer on the workpiece at a temperature of about 500° C. or less, wherein the metal layer comprises cobalt, copper, tungsten, tantalum, or ruthenium; exposing the workpiece to hydrogen radicals in the processing chamber, and the hydrogen radicals being generated in the plasma chamber, wherein the hydrogen radicals are generated by inducing a plasma in a process gas mixture using an inductively coupled plasma source, and the process gas mixture comprising from about 10% to about 100% by volume of a hydrogen containing gas.

The method of any preceding clause, further wherein the thermal treatment process cleans the surface of the layer on the workpiece.

The method of any preceding clause, wherein the process gas mixture comprising from about 20% to 80% by volume of helium.

The method of any preceding clause, wherein the process gas mixture comprising from about 1% to 10% by volume of oxygen.

The method of any preceding clause, wherein the thermal treatment process reduces a resistance capacity of the metal layer.

The method of any preceding clause, wherein the thermal treatment process removes one or more impurities from the metal layer.

The method of any preceding clause, wherein the thermal treatment process modifies grain of the metal layer.

The method of any preceding clause, wherein the metal layer is deposited on a patterned structure on the workpiece, and the thermal treatment process modifies morphology of the metal layer.

The method of any preceding clause, wherein the thermal treatment process reduces at least a portion of oxygen concentration on surface of the metal layer.

The method of any preceding clause, wherein the thermal treatment process reduces at least a portion of nitrogen concentration on surface of the metal layer.

A method for conducting a thermal treatment process on a workpiece in a plasma processing apparatus, the plasma processing apparatus comprising a plasma chamber and a processing chamber, the plasma chamber and processing chamber being separated by at least one separation grid, the separation grid operable to filter ions generated in the plasma chamber, the processing chamber having a workpiece support operable to support a workpiece, the method comprising: placing the workpiece on the workpiece support in the processing chamber; conducting a thermal treatment process on the workpiece to thermally treat a layer on the workpiece, the thermal treatment process being implemented at a workpiece temperature of about 500° C. or less; wherein the thermal treatment process comprises exposing the workpiece to one or more radicals in the processing chamber, the one or more radicals being generated in the plasma chamber.

The method of any preceding clause, wherein the workpiece temperature is about 350° C. or less.

The method of any preceding clause, wherein the one or more radicals are generated in the plasma chamber using a remote plasma source.

The method of any preceding clause, wherein the thermal treatment process is operable to treat a metal layer on the workpiece, wherein the metal layer comprises cobalt, copper, germanium, silicon, or ruthenium.

The method of any preceding clause, wherein the one or more radicals comprise hydrogen radicals generated in the plasma chamber.

The method of any preceding clause, wherein the hydrogen radicals are generated by inducing a plasma in a process gas using an inductively coupled plasma source, the process gas comprising from about 10% to about 100% by volume of a hydrogen containing gas.

The method of any preceding clause, wherein the workpiece comprises at least one layer of silicon or silicon germanium and the hydrogen radicals diffuse through the at least one layer of silicon or silicon germanium on the workpiece.

The method of any preceding clause, wherein the one or more radicals comprise deuterium radicals.

The method of any preceding clause, wherein the deuterium radicals are generated by inducing a plasma in a process gas using an inductively coupled plasma source, the process gas comprising from about 10% to about 100% by volume of a deuterium containing gas.

The method of any preceding clause, wherein the workpiece comprises at least one layer of silicon or silicon germanium and the deuterium radicals diffuse through the at least one layer of silicon or silicon germanium on the workpiece.

The method of any preceding clause, further wherein the workpiece is at a process pressure during the thermal treatment process, the process pressure being from about 100 mT to about 20 T.

The method of any preceding clause, wherein the thermal treatment process reduces a resistance capacity of at least one metal layer on the workpiece.

The method of any preceding clause, wherein the thermal treatment process removes one or more impurities from at least one metal layer on the workpiece.

The method of any preceding clause, wherein the thermal treatment process modifies reflow of at least one metal layer on the workpiece.

The method of any preceding clause, wherein the thermal treatment process modifies grain structure on at least one metal layer on the workpiece.

The method of any preceding clause, wherein the thermal treatment process modifies a transistor property of at least one metal layer on the workpiece.

The method of any preceding clause, wherein the thermal treatment process cleans a surface of at least one metal layer on the workpiece.

The method of any preceding clause, wherein the workpiece comprises at least one metal layer having a surface thereon, wherein the thermal treatment process reduces at least a portion of an oxygen concentration on the surface of the at least one metal layer.

The method of any preceding clause, wherein the workpiece comprises at least one metal layer having a surface thereon, wherein the thermal treatment process reduces at least a portion of a nitrogen concentration on the surface of the at least one metal layer.

The method of any preceding clause, wherein the workpiece comprises at least one metal layer, wherein the metal layer is deposited on a patterned structure on the workpiece, wherein the thermal treatment process modifies a morphology of the at least one metal layer.

The method of any preceding clause, wherein the workpiece comprises at least one metal layer having a surface thereon, wherein the thermal treatment process reduces at least a portion of a fluorine concentration on the surface of the at least one metal layer.

The method of any preceding clause, wherein the one or more radicals comprise oxygen radicals.

The method of any preceding clause, wherein the oxygen radicals are generated by inducing a plasma in a process gas using an inductively coupled plasma source, the process gas comprising from about 10% to about 100% by volume of an oxygen containing gas.

The method of any preceding clause, wherein the workpiece is at a process pressure during the thermal treatment process, the process pressure being less than about 1 T.

A method for conducting a thermal treatment process on a workpiece in a plasma processing apparatus, the plasma processing apparatus comprising a plasma chamber and a processing chamber, the plasma chamber and processing chamber separated by a plurality of separation grids, the separation grids operable to filter ions generated in the plasma chamber, the processing chamber having a workpiece support operable to support a workpiece, the method comprising: placing the workpiece on the workpiece support in the processing chamber, the workpiece comprising at least one metal layer, wherein the at least one metal layer comprises cobalt, copper, germanium, silicon, or ruthenium; generating one or more species from an oxidizing process gas in the plasma chamber, wherein the oxidizing process gas comprises an oxygen containing gas; filtering the one or more species to create an oxidizing filtered mixture, wherein the oxidizing filtered mixture comprises oxygen radicals; exposing the workpiece to the oxygen radicals; and conducting a thermal treatment process on the workpiece to thermally treat a layer on the workpiece, the thermal treatment process being implemented at a workpiece temperature of about 500° C. or less, wherein the thermal treatment process comprises exposing the workpiece to hydrogen radicals in the processing chamber, the hydrogen radicals being generated from a process gas in the plasma chamber using a remote plasma source, wherein the process gas comprises from about 10% to about 100% by volume of a hydrogen containing gas.

The method of any preceding clause, wherein the thermal treatment process cleans at least one surface of the workpiece.

The method of any preceding clause, wherein the process gas further comprises from about 20% to about 80% by volume of helium.

The method of any preceding clause, wherein the oxidizing process gas further comprises from about 1% to about 10% by volume of oxygen.

The method of any preceding clause, wherein the thermal treatment process reduces a resistance capacity of the least one metal layer on the workpiece.

The method of any preceding clause, wherein the thermal treatment process removes one or more impurities from the least one metal layer on the workpiece.

The method of any preceding clause, wherein the thermal treatment process modifies grain structure on the least one metal layer on the workpiece.

The method of any preceding clause, wherein the metal layer is deposited on a patterned structure on the workpiece, further wherein the thermal treatment process modifies a morphology on the at least one metal layer.

The method of any preceding clause, wherein the thermal treatment process reduces at least a portion of an oxygen concentration on at least one surface of the at least one metal layer.

The method of any preceding clause, wherein the thermal treatment process reduces at least a portion of a nitrogen concentration on at least one surface of the at least one metal layer.

A method for processing a semiconductor workpiece in a plasma processing apparatus, the plasma processing apparatus comprising a plasma chamber having an interior operable to receive a process gas and a processing chamber having a workpiece support operable to support a workpiece, the method comprising: placing the workpiece on the workpiece support in the processing chamber; generating one or more species by inducing a plasma in a process gas in the plasma chamber, wherein the process gas comprises a hydrogen containing gas and an oxygen containing gas; exposing the workpiece to the species to treat at least one layer on the workpiece, wherein the species comprise one or more oxygen radicals, hydrogen radicals, and hydroxyl radicals.

The method of any preceding clause, wherein the hydrogen containing gas comprises $H_2$, $D_2$, $NH_3$, or $CH_4$.

The method of any preceding clause, wherein the oxygen containing gas comprises $O_2$, $H_2O$, $NO_2$, $O_3$, $CO_2$, CO, or NO.

The method of any preceding clause, wherein the at least one layer comprises a metal layer, the metal layer comprising copper, germanium, cobalt, ruthenium, tantalum, titanium, tungsten, aluminum-doped titanium carbide, or aluminum-doped titanium.

The method of any preceding clause, wherein the at least one layer is a dielectric layer.

The method of any preceding clause, wherein the at least one layer is a semiconductor layer.

The method of any preceding clause, wherein the process gas comprises from about 5% to about 99.9% of total gas flow rate of hydrogen containing gas.

The method of any preceding clause, wherein the process gas comprises from about 0.1% to about 95% of total gas flow rate of oxygen containing gas.

The method of any preceding clause, wherein the process gas further comprises a diluent gas.

The method of any preceding clause, wherein the plasma chamber and the processing chamber are separated by a separation grid.

The method of any preceding clause, wherein the method comprises filtering one or more species to create a filtered mixture via the separation grid.

The method of any preceding clause, wherein the workpiece is at a process pressure when exposed to the species, wherein the process pressure is from about 50 mT to about 5000 mT.

The method of any preceding clause, wherein exposing the workpiece to the species to treat the workpiece reduces a resistance capacity of at least one metal layer.

The method of any preceding clause, wherein exposing the workpiece to the species to treat the workpiece cleans a surface of at least one metal layer.

The method of any preceding clause, wherein exposing the workpiece to the species to treat the workpiece cleans a surface of at least one metal layer by removing at least a portion of oxygen that is present on the at least one metal layer.

The method of any preceding clause, wherein exposing the workpiece to the species to treat the workpiece cleans a surface of at least one metal layer by removing at least a portion of nitrogen that is present on the at least one metal layer.

The method of any preceding clause, wherein exposing the workpiece to the species to treat the workpiece promotes reflow of at least one metal layer.

The method of any preceding clause, wherein exposing the workpiece to the species to treat the workpiece promotes grain growth on at least one metal layer.

The method of any preceding clause, wherein exposing the workpiece to the species to treat the workpiece smooths a surface of a layer on the workpiece.

The method of any preceding clause, wherein the workpiece further comprises a photoresist layer or hardmask layer, wherein exposing the workpiece to the species to treat the workpiece removes at least a portion of the photoresist layer or hardmask layer.

The method of any preceding clause, wherein exposing the workpiece to the species to treat the workpiece treats at least one metal layer according to any of the preceding clauses.

The method of any preceding clause, wherein the workpiece comprise at least one silicon layer and at least one silicon germanium layer, wherein exposing the workpiece to the species to treat the workpiece oxidizes at least a portion of the silicon layer at a first rate and oxidizes at least a portion of the silicon germanium layer at a second rate, wherein the first rate is different from than the second rate.

The method of any preceding clause, wherein the one or more species are generated in the plasma chamber by an inductively coupled plasma source, capacitively coupled plasma source, or remote plasma source.

The method of any preceding clause, wherein exposing the workpiece to the species to treat the workpiece cleans a surface of at least one metal nitride layer by removing oxygen that is present on at least one metal nitride layer.

The method of any preceding clause, wherein exposing the workpiece to the species to treat the workpiece at least partially removes an etch residue layer on the workpiece.

The method of any preceding clause, wherein the workpiece comprises at least one silicon or silicon nitride layer and at least one metal layer, wherein exposing the workpiece to the species to treat the workpiece oxidizes at least a portion of the silicon or silicon nitride layer at a first rate and oxidizes at least a portion of the metal layer at a second rate, wherein the first rate is different than the second rate.

The method of any preceding clause, wherein exposing the workpiece to the species to treat the workpiece comprises removing one or more impurities from a layer on the workpiece.

The method of any preceding clause, wherein exposing the workpiece to the species to treat the workpiece comprises promoting intermixing of at least one metal layer with a layer underneath the metal layer.

A method for processing a semiconductor workpiece in a plasma processing apparatus, the plasma processing apparatus comprising a plasma chamber having an interior operable to receive a process gas and a processing chamber having a workpiece support operable to support a workpiece, wherein the workpiece comprises at least one metal layer, the method comprising: placing the workpiece on the workpiece support in the processing chamber; generating one or more species from a process gas in the plasma chamber, wherein the process gas comprises a hydrogen containing as and an oxygen containing gas; filtering the one or more species using a separation grid to create a filtered mixture, wherein the filtered mixture comprising one or more oxygen radicals, hydrogen radicals, and hydroxyl radicals; and exposing the workpiece to the filtered mixture to treat the at least one metal layer.

A method for processing a workpiece in a plasma processing apparatus, the plasma processing apparatus comprising a plasma chamber having an interior operable to receive a process gas and a processing chamber having a workpiece support operable to support a workpiece, wherein the workpiece comprises at least one layer of silicon and at least one metal layer, the method comprising placing the workpiece on the workpiece support in the processing chamber; generating one or more species from a process gas in the plasma chamber, the process gas comprising a hydrogen gas, an oxygen gas, and a hydrocarbon gas; filtering the one or more species to create a filtered mixture; exposing the workpiece to the filtered mixture to form an oxide layer on the at least one layer of silicon at a rate that is greater than a rate of formation of an oxide layer on the at least one metal layer.

The method of any preceding clause, wherein the at least one metal layer comprises cobalt.

The method of any preceding clause, wherein the hydrocarbon gas comprises CH4.

The method of any preceding clause, wherein the plasma chamber and the processing chamber are separated by a separation grid.

The method of any preceding clause, wherein the filtering the one or more species to create a filtered mixture comprises filtering the one or more species via a separation grid separating the plasma chamber from the processing chamber.

The method of any preceding clause, wherein the workpiece is at a process temperature when exposed to the filtered mixture, wherein the process temperature is equal to or less than about 160° C.

The method of any preceding clause, further wherein the workpiece is at a process pressure when exposed to the filtered mixture, wherein the process pressure is from about 100 mT to about 5000 mT.

The method of any preceding clause, the workpiece is exposed to the filtered mixture for a process time, wherein the process time is from about 30 sec to about 1800 sec.

The method of any preceding clause, wherein exposing the workpiece to the filtered mixture removes at least a portion of a native oxide layer on the at least one metal layer.

A method for processing a workpiece in a plasma processing apparatus, the plasma processing apparatus comprising a plasma chamber having an interior operable to receive a process gas and a processing chamber having a workpiece support operable to support a workpiece, wherein the workpiece comprises at least one layer of silicon and at least one metal layer, the method comprising: placing the workpiece on the workpiece support in the processing chamber; generating one or more species from an oxidizing process gas in the plasma chamber; filtering the one or more species to create an oxidizing filtered mixture; exposing the workpiece to the oxidizing filtered mixture to form an oxide layer on the at least one layer of silicon and an oxide layer on the at least one metal layer; generating one or more species from a reducing process gas in the plasma chamber; filtering the one or more species to create a reducing filtered mixture; exposing the workpiece to the reducing filtered mixture to remove a least a portion of the oxide layer on the at least one metal layer.

The method of any preceding clause, wherein the at least one metal layer comprises cobalt.

The method of any preceding clause, wherein the oxidizing process gas comprises an oxygen containing gas.

The method of any preceding clause, wherein the oxygen containing gas comprises oxygen ($O_2$), ozone ($O_3$), water ($H_2O$), carbon dioxide ($CO_2$), carbon monoxide (CO), nitrogen dioxide ($NO_2$), nitric oxide (NO), and combinations thereof.

The method of any preceding clause, wherein the reducing process gas comprises a hydrogen containing gas.

The method of any preceding clause, wherein the hydrogen containing gas comprise hydrogen ($H_2$), water ($H_2O$), ammonia ($NH_3$), and mixtures thereof.

The method of any preceding clause, wherein the plasma chamber and the processing chamber are separated via a separation grid.

The method of any preceding clause, wherein filtering the one or more species to create an oxidizing filtered mixture comprises filtering the one or more species via the separation grid.

The method of any preceding clause, wherein filtering the one or more species to create a reducing filtered mixture comprises filtering the one or more species via the separation grid.

The method of any preceding clause, wherein the workpiece is at a process temperature when exposed to the oxidizing filtered mixture, wherein the process temperature is equal to or less than about 160° C.; wherein the workpiece is at a process temperature when exposed to the reducing filtered mixture, wherein the process temperature is equal to or less than about 160° C.

The method of any preceding clause, wherein the workpiece is exposed to the oxidizing filtered mixture for a process time of from about 30 seconds to about 600 seconds; wherein the workpiece is exposed to the reducing filtered mixture for a process time of from about 30 seconds to about 3600 seconds.

A method for processing a workpiece having a metal layer thereon in a processing apparatus, the processing apparatus comprising a plasma chamber and a processing chamber, the processing chamber having a workpiece support operable to support a workpiece, the method comprising: placing the workpiece on the workpiece support in the processing chamber; and conducting an annealing treatment process on the workpiece including exposing the workpiece to radicals in the processing chamber to heat the metal layer on the workpiece to an annealing temperature of 400° C. or more, the radicals generated at least in pan using a plasma induced in a process gas by a plasma source.

The method of any preceding clause, wherein the radicals comprise hydrogen radicals generated in the plasma chamber.

The method of any preceding clause, wherein the radicals comprise oxygen radicals generated in the plasma chamber.

The method of any preceding clause, wherein the annealing temperature is 600° C. or more.

The method of any preceding clause, wherein the metal layer comprises copper, tungsten, cobalt, ruthenium, or combinations thereof.

The method of any preceding clause, wherein the workpiece comprises a silicon substrate having the metal layer disposed thereon.

The method of any preceding clause, wherein the metal layer comprises tungsten, further wherein exposing the workpiece to radicals in the processing chamber forms a layer of tungsten disilicide on the metal layer.

The method of any preceding clause, wherein the plasma chamber and the processing chamber are separated by one or more separation grids, each of the separation grids operable to filter ions generated in the plasma chamber.

The method of any preceding clause, wherein exposing the workpiece to radicals in the processing chamber comprises: generating one or more species from a process gas using a plasma in the plasma chamber, wherein the process gas comprises a hydrogen-containing gas and an oxygen-containing gas; filtering the one or more species to create a filtered mixture, wherein the filtered mixture comprises hydrogen radicals and oxygen radicals; and exposing the workpiece to the hydrogen radicals and oxygen radicals to heat the metal layer on the workpiece.

The method of any preceding clause, wherein the radicals are generated by inducing a plasma in a process gas using an inductively coupled plasma source, and the process gas mixture comprises from about 10% to about 95% by volume of a hydrogen-containing gas.

The method of any preceding clause, wherein the process gas further comprises helium, nitrogen, argon, or oxygen.

The method of any preceding clause, wherein the annealing treatment process is conducted at a process pressure of from about 400 mT to about 1000 mT.

The method of any preceding clause, wherein the plasma source is an inductively coupled power source.

The method of any preceding clause, wherein exposing the workpiece to radicals in the processing chamber modifies a surface morphology of the metal layer.

A method for conducting an annealing treatment process on a workpiece in a processing apparatus, the processing apparatus comprising a plasma chamber and a processing chamber, wherein the plasma chamber and the processing chamber are separated by a plurality of separation grids, the separation grids operable to filter ions generated in the plasma chamber, and the processing chamber having a workpiece support operable to support a workpiece, the method comprising: placing the workpiece on the workpiece support in the processing chamber; generating one or more species from the process gas in the plasma chamber using an inductively coupled plasma source, wherein the process gas comprises a hydrogen-containing gas; filtering the one or more species to create a filtered mixture, wherein the filtered mixture comprises hydrogen radicals; and exposing the workpiece to the filtered mixture to heat the metal layer on the workpiece to an annealing temperature of 400° C. or more.

The method of any preceding clause, wherein the process gas further comprises an oxygen-containing gas.

The method of any preceding clause, wherein the filtered mixture comprises oxygen radicals.

The method of any preceding clause, wherein the metal layer comprises copper, tungsten, cobalt, ruthenium, or combinations thereof.

The method of any preceding clause, wherein the metal layer comprises tungsten, further wherein exposing the workpiece to the filtered mixture in the processing chamber forms a layer of tungsten disilicide on the metal layer.

The method of any preceding clause, wherein the annealing temperature is 600° C. or more.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method for conducting a thermal treatment process on a workpiece in a processing apparatus, the processing apparatus comprising a plasma chamber and a processing chamber, wherein the plasma chamber and the processing chamber are separated by a plurality of separation grids, the separation grids operable to filter ions generated in the plasma chamber, and the processing chamber having a workpiece support operable to support a workpiece, the method comprising:
   placing the workpiece on the workpiece support in the processing chamber;
   heating a metal layer on the workpiece at a temperature of about 500° C. or less;
   flowing a process gas mixture into the plasma chamber, wherein a hydrogen containing gas is flowed at a flow rate of at least 100 sccm and an oxygen containing gas is flowed at a rate of 0.5 slm to 15 slm;
   inducing a plasma in the process gas mixture, the plasma containing hydrogen radicals; and
   exposing the workpiece to hydrogen radicals in the processing chamber, wherein the thermal treatment process reduces a resistance capacity of the metal layer such that the metal layer has a Rs reduction of at least 5% after exposure to the hydrogen radicals.

2. The method of claim 1, wherein the process gas mixture comprises from about 10% to about 100% by volume of the hydrogen containing gas.

3. The method of claim 1, wherein the process gas mixture comprises helium, nitrogen, or argon.

4. The method of claim 1, wherein the workpiece comprises silicon or silicon germanium, and hydrogen diffuses through the layer on the workpiece to the silicon and silicon germanium in the workpiece.

5. The method of claim 1, wherein the thermal treatment process cleans surface of the layer on the workpiece.

6. The method of claim 1, wherein the metal layer comprises cobalt, copper, tungsten, tantalum, or ruthenium.

7. The method of claim 6, wherein the thermal treatment process removes one or more impurities from the metal layer.

8. The method of claim 6, wherein the thermal treatment process modifies grain of the metal layer.

9. The method of claim 6, wherein the metal layer is deposited on a patterned structure on the workpiece, and the thermal treatment process modifies morphology of the metal layer.

10. The method of claim 6, wherein the thermal treatment process reduces at least a portion of oxygen concentration on surface of the metal layer.

11. The method of claim 6, wherein the thermal treatment process reduces at least a portion of nitrogen concentration on surface of the metal layer.

12. The method of claim 6, wherein the thermal treatment process reduces at least a portion of fluorine concentration on surface of the metal layer.

13. The method of claim 1, wherein the process gas mixture comprises about 95 vol % hydrogen and about 5% oxygen.

14. The method of claim 1, wherein exposing the workpiece to hydrogen radicals in the processing chamber comprising exposing the workpiece to the hydrogen radicals for a process time of at least 85 second.

15. The method of claim 1, wherein the plurality of separation grids comprise a first grid plated spaced apart from a second grid plate, wherein the method comprises flowing the hydrogen radicals through the first grid plate and the second grid plate.

16. A method for conducting a thermal treatment process on a workpiece in a processing apparatus, the processing apparatus comprising a plasma chamber and a processing chamber, wherein the plasma chamber and the processing chamber are separated by a plurality of separation grids, the separation grids operable to filter ions generated in the plasma chamber, and the processing chamber having a workpiece support operable to support a workpiece, the method comprising:

placing the workpiece on the workpiece support in the processing chamber;

heating a metal layer on the workpiece at a temperature of about 500° C. or less, wherein the metal layer comprises cobalt, copper, tungsten, tantalum, or ruthenium;

flowing a process gas mixture into the plasma chamber, wherein a hydrogen containing gas is flowed at a flow rate of at least 100 sccm and an oxygen containing gas is flowed at a rate of 0.5 slm to 15 slm;

inducing a plasma in the process gas mixture, the plasma containing hydrogen radicals;

exposing the workpiece to hydrogen radicals in the processing chamber, wherein the process gas mixture comprising from about 10% to about 100% by volume of the hydrogen containing gas, wherein the thermal treatment or process reduces a resistance capacity of the metal layer such that the metal layer has a Rs reduction of at least 5% after exposure to the hydrogen radicals.

* * * * *